United States Patent
Lee et al.

(10) Patent No.: US 11,322,501 B2
(45) Date of Patent: May 3, 2022

(54) SEMICONDUCTOR DEVICE AND METHOD FOR FABRICATING THE SAME

(71) Applicant: SK hynix Inc., Gyeonggi-do (KR)

(72) Inventors: Jeong-Yeop Lee, Gyeonggi-do (KR);
Dong-Su Park, Gyeonggi-do (KR);
Jong-Bum Park, Seoul (KR); Sang-Do Lee, Gyeonggi-do (KR); Jae-Min Lee, Seoul (KR); Kee-Jeung Lee, Seoul (KR); Jun-Soo Jang, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 126 days.

(21) Appl. No.: 16/918,047

(22) Filed: Jul. 1, 2020

(65) Prior Publication Data
US 2020/0335505 A1    Oct. 22, 2020

Related U.S. Application Data

(60) Continuation of application No. 16/596,165, filed on Oct. 8, 2019, now Pat. No. 10,734,389, which is a
(Continued)

(30) Foreign Application Priority Data

Apr. 17, 2017    (KR) .................. 10-2017-0049286

(51) Int. Cl.
*H01L 27/108*    (2006.01)
*H01L 49/02*    (2006.01)

(52) U.S. Cl.
CPC .. *H01L 27/10855* (2013.01); *H01L 27/10814* (2013.01); *H01L 27/10852* (2013.01);
(Continued)

(58) Field of Classification Search
CPC ......... H01L 27/10814; H01L 27/10855; H01L 27/10852; H01L 27/10876; H01L 27/10894
See application file for complete search history.

(56) References Cited

U.S. PATENT DOCUMENTS 8,778,805 B2 *   7/2014   Fujii .................. H01L 23/5226
                                                    438/700
2008/0009119 A1   1/2008   Eto

FOREIGN PATENT DOCUMENTS

KR   10-1999-0057387   7/1999
KR   10-2002-0058573   7/2002
(Continued)

OTHER PUBLICATIONS

Office Action issued by the Korean Intellectual Property Office dated Apr. 10, 2021.
(Continued)

*Primary Examiner* — Walter H Swanson
(74) *Attorney, Agent, or Firm* — IP & T Group LLP

(57) ABSTRACT

A method for fabricating a semiconductor device includes: forming a mold stack pattern including a plurality of openings in an upper portion of a substrate and including a mold layer and a supporter layer which are stacked; forming a bottom electrode layer filling the plurality of openings and covering the supporter layer; forming a filler portion disposed inside the plurality of openings, a barrier portion extended upwardly from the filler portion, and an electrode cutting portion exposing a surface of the supporter layer by selectively etching the bottom electrode layer; forming a supporter by using the barrier portion as an etch barrier and etching the supporter layer exposed by the electrode cutting portion; selectively removing the barrier portion to form a hybrid pillar-type bottom electrode dis-
(Continued)

posed inside the plurality of the openings; and removing the mold layer.

17 Claims, 39 Drawing Sheets

Related U.S. Application Data division of application No. 16/234,181, filed on Dec. 27, 2018, now Pat. No. 10,483,265, which is a continuation of application No. 15/865,710, filed on Jan. 9, 2018, now Pat. No. 10,580,777.

(52) U.S. Cl.
CPC .. *H01L 27/10876* (2013.01); *H01L 27/10894* (2013.01); *H01L 28/75* (2013.01); *H01L 28/91* (2013.01); *H01L 28/92* (2013.01)

(56) References Cited

FOREIGN PATENT DOCUMENTS

| KR | 10-0842911 | 7/2008 |
|----|------------|--------|
| KR | 10-2010-0081018 | 7/2010 |
| KR | 10-1014855 | 2/2011 |
| KR | 10-2013-0047402 | 5/2013 |

OTHER PUBLICATIONS

Office Action issued by the the USPTO for U.S. Appl. No. 16/745,056 dated Apr. 9, 2021.

\* cited by examiner

SEMICONDUCTOR DEVICE AND METHOD FOR FABRICATING THE SAME

CROSS-REFERENCE TO RELATED APPLICATIONS

This application is a continuation of U.S. patent application Ser. No. 16/596,165, filed on Oct. 8, 2019, which is division of U.S. patent application Ser. No. 16/234,181 filed on Dec. 27, 2018 and issued as U.S. Pat. No. 10,483,265 on Nov. 19, 2019, which is a continuation of U.S. patent application Ser. No. 15/865,710 filed on Jan. 9, 2018, and issued as U.S. Pat. No. 10,580,777 on Mar. 3, 2020, which claims benefits of priority of Korean Patent Application No. 10-2017-0049286 filed on Apr. 17, 2017. The disclosure of each of the foregoing applications is incorporated herein by reference in its entirety.

BACKGROUND

1. Field

Exemplary embodiments of the present invention relate to a semiconductor device and a method for fabricating the same, and more particularly, to a semiconductor device including a capacitor and a method for fabricating the semiconductor device.

2. Description of the Related Art

A memory device, such as a Dynamic Random Access Memory (DRAM) device, may include a capacitor. A capacitor may include a bottom electrode, a dielectric layer, and a top electrode. The bottom electrode may have a high aspect ratio in order to increase the capacitance of the capacitor.

However, the bottom electrode with a high aspect ratio may be subject to get damaged during the subsequent process.

SUMMARY

Embodiments of the present invention are directed to a semiconductor device including a capacitor of improved reliability, and a method for fabricating the semiconductor device.

In accordance with an embodiment of the present invention, a method for fabricating a semiconductor device includes: forming a mold stack pattern that includes a plurality of openings in an upper portion of a substrate, and includes a mold layer and a supporter layer which are stacked; forming a bottom electrode layer that fills the plurality of the openings and covers the supporter layer; forming a filler portion disposed inside the plurality of the openings, a barrier portion extended upwardly from the filler portion, and an electrode cutting portion exposing a surface of the supporter layer by selectively etching the bottom electrode layer; forming a supporter by using the barrier portion as an etch barrier and etching the supporter layer exposed by the electrode cutting portion; selectively removing the barrier portion to form a hybrid pillar-type bottom electrode disposed inside the plurality of the openings; and removing the mold layer.

A bottom surface of the electrode cutting portion may be disposed at a depth, with which the electrode cutting portion does not overlap with the filler portion.

The forming of the bottom electrode layer may include: conformally forming a first bottom electrode layer over the plurality of the openings and the supporter layer in such a manner that a gap is defined inside each of the plurality of the openings; and forming a second bottom electrode layer that fills the gap over the first bottom electrode layer.

The second bottom electrode layer may include a material having an etch selectivity with respect to the supporter layer.

The second bottom electrode layer may include polysilicon.

The first bottom electrode layer may include a metal or a metal nitride.

The selective removing of the barrier portion to form the hybrid pillar-type bottom electrode may include: performing an etch-back process by making the first bottom electrode layer and the second bottom electrode layer have different selectivities.

The forming of the bottom electrode layer may include: conformally forming a first bottom electrode layer over the plurality of the openings and the supporter layer in such a manner that a gap is defined inside each of the plurality of the openings; removing the first bottom electrode layer from an upper surface of the supporter layer to form a cylindrical first bottom electrode which is disposed inside each of the plurality of the openings; and forming a second bottom electrode layer that fills the gap over the cylindrical first bottom electrode.

The forming of the filler portion disposed inside the plurality of the openings, the barrier portion extended upwardly from the filler portion, and the electrode cutting portion exposing the surface of the supporter layer by selectively etching the bottom electrode layer may include: forming a supporter mask layer over the bottom electrode layer; and etching the bottom electrode layer by using the supporter mask layer as an etch barrier, wherein a bottom surface of the electrode cutting portion is disposed at a depth, with which the electrode cutting portion does not overlap with the filler portion.

The method may further include: forming a dielectric layer over the hybrid pillar-type bottom electrode and the supporter, after the removing of the mold layer; and forming a top electrode over the dielectric layer.

The method may further include: forming a pillar-type bottom electrode and a cylindrical bottom electrode over the pillar-type bottom electrode by recessing inside of the hybrid pillar-type bottom electrode, after the removing of the mold layer.

In accordance with another embodiment of the present invention, a method for fabricating a semiconductor device includes: forming a mold stack layer by sequentially stacking an etch stop layer, a first mold layer, a first supporter layer, a second mold layer, and a second supporter layer over a substrate; forming a plurality of openings by etching the mold stack layer; forming a bottom electrode layer that fills the plurality of the openings and covers the second supporter layer; forming a filler portion disposed inside the plurality of the openings, a barrier portion extended upwardly from the filler portion, and an electrode cutting portion exposing a surface of the supporter layer by selectively etching the bottom electrode layer; forming a second supporter and a second supporter opening by using the barrier portion as an etch barrier and etching the second supporter layer exposed by the electrode cutting portion; removing the second mold layer through the second supporter opening; forming a first supporter and a first supporter opening by using the barrier portion as an etch barrier and etching the first supporter layer exposed after the second mold layer is removed; selectively removing the barrier portion to form a hybrid pillar-type bottom electrode disposed inside the plurality of the openings; and removing the first mold layer.

A bottom surface of the electrode cutting portion may be disposed at a depth, with which the electrode cutting portion does not overlap with the filler portion.

The forming of the bottom electrode layer may include: conformally forming a first bottom electrode layer over the plurality of the openings and the second supporter layer in such a manner that a gap is defined inside each of the plurality of the openings; and forming a second bottom electrode layer that fills the gap over the first bottom electrode layer.

The second bottom electrode layer may include a material having an etch selectivity with respect to the first supporter layer and the second supporter layer.

The second bottom electrode layer may include polysilicon.

The first bottom electrode layer may include a metal or a metal nitride.

The selective removing of the barrier portion to form the hybrid pillar-type bottom electrode may include: performing an etch-back process by making the first bottom electrode layer and the second bottom electrode layer have different selectivities.

The forming of the bottom electrode layer may include: conformally forming a first bottom electrode layer over the plurality of the openings and the second supporter layer in such a manner that a gap is defined inside each of the plurality of the openings; removing the first bottom electrode layer from an upper surface of the second supporter layer to form a cylindrical first bottom electrode which is disposed inside each of the plurality of the openings; and forming a second bottom electrode layer that fills the gap over the cylindrical first bottom electrode.

The forming of the filler portion disposed inside the plurality of the openings, the barrier portion extended upwardly from the filler portion, and the electrode cutting portion exposing the surface of the supporter layer by selectively etching the bottom electrode layer may include: forming a supporter mask layer over the bottom electrode layer; and etching the bottom electrode layer by using the supporter mask layer as an etch barrier, wherein a bottom surface of the electrode cutting portion is disposed at a depth, with which the electrode cutting portion does not overlap with the filler portion.

The method may further include: forming a dielectric layer over the hybrid pillar-type bottom electrode and the first and second supporters, after the removing of the first mold layer; and forming a top electrode over the dielectric layer.

The method may further include: forming a pillar-type bottom electrode and a cylindrical bottom electrode over the pillar-type bottom electrode by recessing inside of the hybrid pillar-type bottom electrode, after the removing of the first mold layer.

In accordance with yet another embodiment of the present invention, a method for fabricating a semiconductor device includes: forming a mold stack pattern that includes a plurality of openings in an upper portion of a substrate, and includes a mold layer and a supporter layer which are stacked; forming a hybrid pillar-type bottom electrode fills the plurality of openings; forming a hard mask layer covers the hybrid pillar-type bottom electrode and the mold stack pattern; forming a mask pattern over the hard mask layer; forming a hard mask pattern overlapping with the hybrid pillar-type bottom electrode by selectively etching the hard mask layer and a cutting portion exposing a surface of the supporter layer; forming a supporter by using the hard mask pattern as an etch barrier and etching the supporter layer exposed by the cutting portion; and removing the hard mask pattern and the mold layer.

The hard mask layer may include amorphous carbon.

The forming of the hybrid pillar-type bottom electrode may include: conformally forming a first bottom electrode layer over the plurality of the openings and the supporter layer in such a manner that a gap is defined inside each of the plurality of the openings; forming a second bottom electrode layer that fills the gap over the first bottom electrode layer; and selectively removing the first bottom electrode layer and the second bottom electrode layer from an upper surface of the supporter layer to form the hybrid pillar-type bottom electrode.

The first bottom electrode layer may include a metal or a metal nitride.

The second bottom electrode layer may include polysilicon.

The method may further include: forming a dielectric layer over the hybrid pillar-type bottom electrode and the supporter, after the removing of the hard mask pattern and the mold layer; and forming a top electrode over the dielectric layer.

The method may further include: forming a pillar-type bottom electrode and a cylindrical bottom electrode over the pillar-type bottom electrode by recessing inside of the hybrid pillar-type bottom electrode, after the removing of the hard mask pattern and the mold layer.

In accordance with still another embodiment of the present invention, a semiconductor device includes: a hybrid pillar-type bottom electrode that includes a cylindrical first bottom electrode and a pillar-type second bottom electrode filling a cylindrical inside of the first bottom electrode; a supporter suitable for supporting an outer wall of the hybrid pillar-type bottom electrode; a dielectric layer formed over the hybrid pillar-type bottom electrode and the supporter; and a top electrode disposed over the dielectric layer, wherein the cylindrical first bottom electrode includes: a cylinder body; and a cylinder head disposed over the cylinder body and has a sloped side wall to have a wider upper surface than the cylinder body.

The pillar-type second bottom electrode may include: a pillar body fills the cylinder body of the first bottom electrode; and a pillar head fills the cylinder head of the first bottom electrode and has a sloped side wall to have a wider upper surface than the pillar body.

The pillar-type second bottom electrode may include a pillar body that fills the cylinder body of the first bottom electrode, and an upper surface of the pillar body may be lower than the cylinder head of the first bottom electrode.

The first bottom electrode may include a metal or a metal nitride.

The second bottom electrode layer may include polysilicon.

A top surface of the first bottom electrode and an upper surface of the supporter may be at the same level.

An upper surface of the supporter may be disposed at a lower level than an upper surface of the first bottom electrode.

An upper surface of the supporter may be disposed at a higher level than an upper surface of the first bottom electrode.

The supporter may have a multi-level structure including a plurality of supporters that support an outer wall of the hybrid pillar-type bottom electrode.

The upper surface of the most significant supporter of the multi-level supporter may be disposed at a lower level than the upper surface of the first bottom electrode.

The upper surface of the most significant supporter of the multi-level supporter may be disposed at a higher level than the upper surface of the first bottom electrode.

DETAILED DESCRIPTION

Figure 1A:
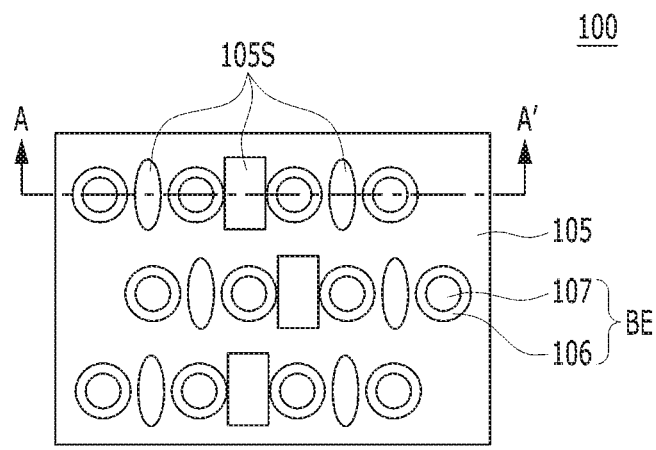
FIG. 1A is a plan view of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, the embodiments of the present invention are described in detail. To simplify the description, a Dynamic Random Access Memory (DRAM) device is taken as an example, but the concept and spirit of the present invention are not limited to the DRAM only, but they may be applied to other memory devices or semiconductor devices.

In the following embodiments of the present invention, a hybrid pillar-type bottom electrode may include an outer cylinder and an inner pillar. The outer cylinder may include a gap inside, and the gap may include an upper gap, an intermediate gap, and a lower gap. The upper gap may be referred to as a gap head, and the intermediate gap and the lower gap may be referred to as a gap body. The outer cylinder may include a cylinder body and a cylinder head. The inner pillar may include a pillar body and a pillar head. The cylinder head and the pillar body may be defined by the gap head, whereas the cylinder body and the pillar body may be defined by the gap body.

Figure 1B:
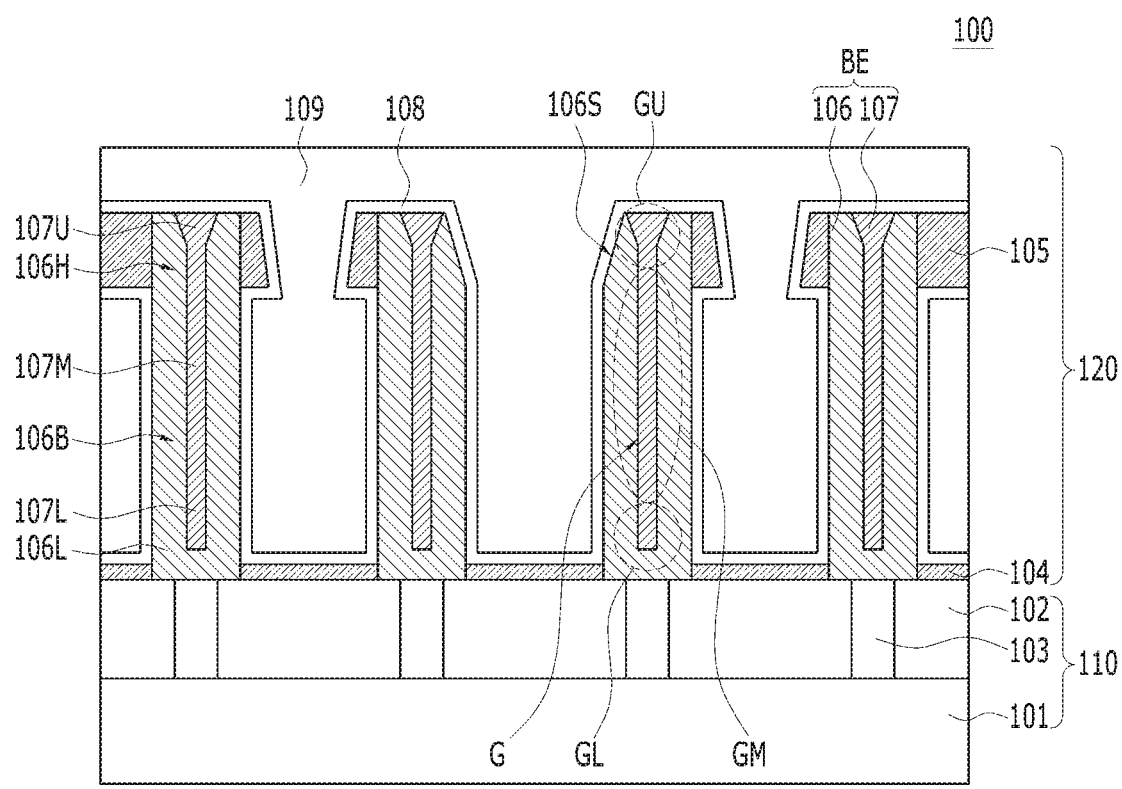
FIG. 1B is a cross-sectional view of the semiconductor device taken along a line A-A' in FIG. 1A.

FIG. 1A is a plan view of a semiconductor device 100 in accordance with an embodiment of the present invention. FIG. 1B is a cross-sectional view of the semiconductor device 100 taken along a line A-A' in FIG. 1A.

Referring to FIGS. 1A and 1B, the semiconductor device 100 may include a lower structure 110 and a capacitor structure 120.

The lower structure 110 may include a substrate 101, an inter-layer dielectric layer 102, and a contact plug 103. The contact plug 103 may be coupled to the substrate 101 by penetrating through the inter-layer dielectric layer 102.

The capacitor structure 120 may include an etch stop layer 104, a bottom electrode BE, a supporter 105, a dielectric layer 108, and a top electrode 109.

A plurality of bottom electrodes BE may be disposed over corresponding contact plugs 103, and each of the bottom electrodes BE may be electrically connected to its corresponding contact plug 103. The bottom electrode BE may have a high aspect ratio. Herein, the aspect ratio may refer to a ratio of height to width. The bottom electrode BE may have an aspect ratio greater than approximately 1:1, preferably, greater than 3:1, and more preferably greater than 5:1. In an embodiment, the bottom electrode BE may have an aspect ratio of approximately 10:1 or higher. Preferably, the height of the bottom electrode BE may range from approximately 5000 Å to approximately 15000 Å.

The bottom electrode BE may include a first bottom electrode 106 and a second bottom electrode 107. The first bottom electrode 106 may have a cylindrical shape defining a gap G. The second bottom electrode 107 may fill the gap G in the inside of the first bottom electrode 106 so that the bottom and the side wall of the second bottom electrode 107 are surrounded by the first bottom electrode 106. The second bottom electrode 107 may have a pillar shape. Hence, the bottom electrode BE has a hybrid structure combining the first bottom electrode 106 and the second bottom electrode 107. The hybrid bottom electrode BE may be referred hereinafter as 'a hybrid pillar-type bottom electrode BE'.

The first bottom electrode 106 may have a cylindrical shape including a bottom, a side wall, and the gap G. The bottom and the side wall of the first bottom electrode 106 may have the same thickness. The first bottom electrode 106 may be made of a metal material. For example, the first bottom electrode 106 may include a metal or a metal nitride. Non-limiting examples of suitable metals include cobalt (Co), titanium (Ti), nickel (Ni), tungsten (W), molybdenum (Mo), platinum (Pt), ruthenium (Ru), and iridium (Ir). Non-limiting examples of suitable metal nitrides may include a titanium nitride (TiN), a titanium silicon nitride (TiSiN), a titanium aluminum nitride (TiAlN), a tantalum nitride (TaN), a tantalum silicon nitride (TaSiN), a tantalum aluminum nitride (TaAlN), and a tungsten nitride (WN), For example, the first bottom electrode 106 may be formed of a titanium nitride. The first bottom electrode 106 may include a metal nitride, such as, for example, a titanium nitride (ALD-TiN) formed through an Atomic Layer Deposition (ALD) process. An outer wall of a portion of an upper portion of the first bottom electrode 106 may have a sloped side wall 106S. The gap G may be defined as an upper gap GU, an intermediate gap GM, and a lower gap GL. The upper gap GU may have a sloped side wall, and due to the presence of the sloped side wall, the width of the upper gap GU may be wider than the widths of the intermediate gap GM and the lower gap GL. The intermediate gap GM and the lower gap GL may have a vertical side wall and may have the same width. The second bottom electrode 107 may be readily gap-filled due to the upper gap GU. The upper gap GU may be referred to as a gap head, whereas the intermediate gap GM and the lower gap GL may be referred to as a gap body.

The first bottom electrode 106 may have a cylindrical shape and may be divided into a cylinder body 106B and a cylinder head 106H. The cylinder head 106H may be extended upward in the vertical direction, from the cylinder body 106B. The intermediate gap GM and the lower gap GL may be defined in the cylinder body 106B. The upper gap GU may be defined in the cylinder head 106H. The inner wall of the cylinder head 106H may have a width that increases as it goes farther from the cylinder body 106B.

The second bottom electrode 107 may fill the gap G in the inside of the first bottom electrode 106. The height of the second bottom electrode 107 may be the same as the height of the first bottom electrode 106. The second bottom electrode 107 may be made of a conductive material. The second bottom electrode 107 and the first bottom electrode 106 may be made of different conductive materials. The second bottom electrode 107 may include a material having a good gap-fill characteristics. The second bottom electrode 107 may be made of a material having an etch selectivity to the first bottom electrode 106. The second bottom electrode 107 may be a silicon-containing layer. The second bottom electrode 107 may include polysilicon. The second bottom electrode 107 may include polysilicon doped with an impurity. The second bottom electrode 107 may be defined as a lower second bottom electrode 107L, an intermediate second bottom electrode 107M, and an upper second bottom electrode 107U according to their height, i.e., their vertical position with respect to the inter-layer dielectric layer 102. The upper second bottom electrode 107U may have a greater line width than the intermediate second bottom electrode 107M and the lower second bottom electrode 107L. The upper second bottom electrode 107U may fill the gap G. The lower second bottom electrode 107L may fill the lower gap GL. The intermediate second bottom electrode 107M may fill the intermediate gap GM. Since the second bottom electrode 107 has a pillar shape, the lower second bottom electrode 107L and the intermediate second bottom electrode 107M may be called a pillar body, and the upper second bottom electrode 107U may be called a pillar head.

The supporter 105 may be formed to support the bottom electrode BE in a horizontal direction and protect the bottom electrode BE from collapsing. The supporter 105 may be coupled to the outer wall of the bottom electrode BE. The supporter 105 may be formed of an insulating material, such as a silicon nitride. The supporter 105 may support an upper portion of the bottom electrode BE. The supporter 105 may contact the outer wall of the first bottom electrode 106 and, in particular, the supporter 105 may contact the outer wall of the cylinder head 106H of the first bottom electrode 106. As illustrated in FIG. 1A, the supporter 105 may include a plurality of supporter openings 105S. The supporter openings 105S may not overlap with the bottom electrode BE. In other words, the supporter openings 105S may be disposed between neighboring bottom electrodes BE. The number and shape of the supporter openings 105S may vary according to design.

The dielectric layer 108 may be formed conformally directly over the etch stop layer 104 and the bottom electrode BE. The dielectric layer 108 may be made of a high-K material whose dielectric constant is higher than the dielectric constant of a silicon oxide. Suitable high-K materials may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$), or a strontium titanium oxide ($SrTiO_3$). According to another embodiment of the present invention, the dielectric layer 108 may be a composite layer including two or more layers of the listed high-K materials. In a preferred embodiment of the present invention, the dielectric layer 108 may be formed of a zirconium oxide-based material having fine leakage current characteristics while sufficiently reducing an equivalent oxide layer thickness (EOT). For example, in a preferred embodiment, the dielectric layer 108 may include a ZAZ ($ZrO_2/Al_2O_3/ZrO_2$). According to another preferred embodiment of the present invention, the dielectric layer 108 may include a HAH (HfO$_2$/Al$_2$O$_3$/HfO$_2$). According to yet another preferred embodiment of the present invention, the dielectric layer 108 may be one of the following multi-layer structures TiO$_2$/ZrO$_2$/Al$_2$O$_3$/ZrO$_2$, TiO$_2$/HfO$_2$/Al$_2$O$_3$/HfO$_2$, Ta$_2$O$_5$/ZrO$_2$/Al$_2$O$_3$/ZrO$_2$ or Ta$_2$O$_5$/HfO$_2$/Al$_2$O$_3$/HfO$_2$.

The top electrode 109 may be formed over the dielectric layer 108. The top electrode 109 may be made of a metal-based material. For example, the top electrode 109 may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide (RuO$_2$), iridium (Ir), an iridium oxide (IrO$_2$), platinum (Pt), or a combination thereof. In an embodiment of the present invention, the top electrode 109 may include a titanium nitride (ALD-TiN) formed through an Atomic Layer Deposition (ALD) process.

According to another embodiment of the present invention, the top electrode 109 may have a multi-layer structure. For example, the top electrode 109 may have a mufti-layer structure formed by sequentially stacking a first metal-containing layer, a silicon germanium layer, and a second metal-containing layer. The first metal-containing layer and the second metal-containing layer may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide (RuO$_2$), iridium (Ir), an iridium oxide (IrO$_2$), platinum (Pt), or a combination thereof. For example, the first metal-containing layer may be made of a titanium nitride, and the second metal-containing layer may be made of WN/W where a tungsten nitride and tungsten are stacked. The silicon germanium layer may be doped with boron.

In accordance with an embodiment of the present invention, as described above, the capacitor structure includes a bottom electrode BE having a hybrid pillar shape which results in enhanced structural stability for the capacitor. Also, the use of the supporter layer 105 further adds to the stability of the hybrid pillar structure of the bottom electrode BE which in turn adds to the stability of the capacitor structure.

Figure 1C:
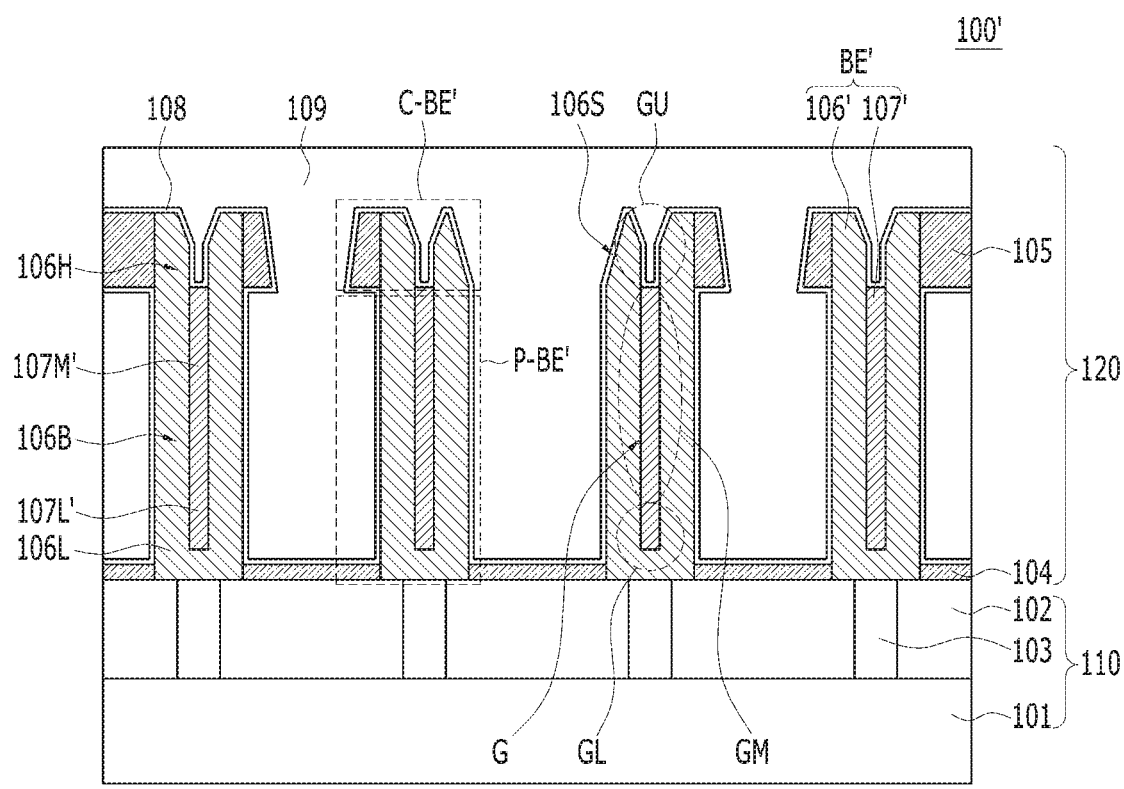
FIG. 1C is a cross-sectional view of a semiconductor device in accordance with a variation of an embodiment of the present invention.

FIG. 1C is a cross-sectional view of a semiconductor device 100' in accordance with a variation example of an embodiment of the present invention. In the semiconductor device 100', the other constituent elements, except a bottom electrode BE', may be the same as the constituent elements of the semiconductor device 100 in accordance with an embodiment.

Referring to FIG. 1C, the semiconductor device 100' may include a lower structure 110 and a capacitor structure 120.

The lower structure 110 may include a substrate 101, an inter-layer dielectric layer 102, and a contact plug 103. The contact plug 103 may be coupled to the substrate 101 by penetrating through the inter-layer dielectric layer 102.

The capacitor structure 120 may include an etch stop layer 104, a bottom electrode BE', a supporter 105, a dielectric layer 108, and a top electrode 109. The supporter 105 may be formed to support the bottom electrode BE' in a horizontal direction and protect the bottom electrode BE' from collapsing. The supporter 105 may be coupled to the outer wall of the bottom electrode BE'. The supporter 105 may contact the outer wall of a first bottom electrode 106. Preferably, the supporter 105 may contact the outer wall of the cylinder head 106H of the first bottom electrode 106.

Each of the bottom electrodes BE' may be disposed over a corresponding contact plug 103, and may be electrically connected to the contact plug 103. The bottom electrode BE' may have a high aspect ratio. Preferably, the bottom electrode BE may have an aspect ratio, greater than 3:1, and more preferably greater than 5:1. In an embodiment, the bottom electrode BE may have an aspect ratio of approximately 10:1 or higher.

The bottom electrode BE may include a first bottom electrode 106' and a second bottom electrode 107'. The first bottom electrode 106' may have a cylindrical shape defining a gap G. The second bottom electrode 107' may fill the gap G in the inside of the first bottom electrode 106'. The bottom electrode BE' may have a hybrid structure as the first bottom electrode 106' and the second bottom electrode 107' are combined.

The first bottom electrode 106' may have a cylindrical shape including a bottom, a side wall, and the gap G. The bottom and the side wall of the first bottom electrode 106' may have the same thickness. The first bottom electrode 106' may be made of a metal material. The first bottom electrode 106' may be formed of the same material as the first bottom electrode 106 of FIG. 1B.

An outer wall of a portion of an upper portion of the first bottom electrode 106' may have a sloped side wall 106S. The gap G may be defined as an upper gap GU, an intermediate gap GM, and a lower gap GL according to the height. The upper gap GU may have a sloped side wall, and due to the presence of the sloped side wall, the width of the upper gap GU may be wider than the widths of the intermediate gap GM and the lower gap GL. The intermediate gap GM and the lower gap GL may have a vertical side wall. The second bottom electrode 107' may be readily gap-filled due to the upper gap GU. The first bottom electrode 106' of a cylindrical shape may be divided into a cylinder body 106B and a cylinder head 106H. The cylinder head 106H may be extended upward, which is the vertical direction, from the cylinder body 106B. The intermediate gap GM and the lower gap GL may be defined in the cylinder body 106B. The upper gap GU may be defined in the cylinder head 106H. The inner wall of the cylinder head 106H may have a width that increases as it goes farther from the cylinder body 106B.

The second bottom electrode 107' may fill the gap G in the inside of the first bottom electrode 106'. The second bottom electrode 107' may be made of a conductive material. The second bottom electrode 107' and the first bottom electrode 106' may be of different conductive materials. The second bottom electrode 107' may include a material having a good gap-fill characteristics. The second bottom electrode 107' may include a material having an etch selectivity to the first bottom electrode 106'. The second bottom electrode 107' may be a silicon-containing layer. The second bottom electrode 107' may include polysilicon. The second bottom electrode 107' may include polysilicon doped with an impurity.

The second bottom electrode 107' may include a lower second bottom electrode 107L' and an intermediate second bottom electrode 107M'. In other words, differently from the second bottom electrode 107 of FIG. 1B, the second bottom electrode 107' may include only the intermediate second bottom electrode 107M' and the lower second bottom electrode 107L'. Therefore, the second bottom electrode 107' may not fill the upper gap GU. The second bottom electrode 107 may fill the lower gap GL and the intermediate gap GM. The second bottom electrode 107' has a pillar shape and may be formed with the pillar body alone without the pillar head.

The pillar body may be formed of the lower second bottom electrode 107L' and the intermediate second bottom electrode 107M'.

Since the second bottom electrode 107' does not ill the upper gap GU, the height of the second bottom electrode 107' may be lower than the height of the second bottom electrode 107. The second bottom electrode 107' may fill a portion of the gap G. The second bottom electrode 107' may have a top surface recessed to be at a lower level (also referred to as a height) than the top surface of the first bottom electrode 106'. Due to the recessed top surface of the second bottom electrode 107', the cylinder head 106H of the first bottom electrode 106' may have a protruded shape. The inner side wall of the cylinder head 106H of the first bottom electrode 106' may be exposed. In short, the inner wall of the cylinder head 106H of the first bottom electrode 106' may not contact the second bottom electrode 107'. Since the cylinder head 106H of the first bottom electrode 106' is exposed, the surface area of the bottom electrode BE' may be increased. The second bottom electrode 107' may fill the inside of the cylinder body 106B of the first bottom electrode 106'. The top surface of the second bottom electrode 107' which is recessed relative to the top surface of the first bottom electrode 106' may be at the same level as the bottom of the supporter 105. According to another embodiment of the present invention, the top surface of the second bottom electrode 107' which is recessed relative to the top surface of the first bottom electrode 106' may be lower than the bottom of the supporter 105.

The cylinder body 106B of the first bottom electrode 106' and the second bottom electrode 107' may become a pillar-type bottom electrode P-BE'. The cylinder head 106H of the first bottom electrode 106' may become a cylindrical bottom electrode C-BE. The cylindrical bottom electrode C-BE' may be disposed over the pillar-type bottom electrode P-BE'.

As described above, the bottom electrode BE' may have a hybrid pillar structure where the pillar-type bottom electrode P-BE' and the cylindrical bottom electrode C-BE' are combined. The height of the pillar-type bottom electrode P-BE' may be greater than the height of the cylindrical bottom electrode C-BE'. In this way, the structural stability of the capacitor structure may be enhanced relative to existing structures. The cylindrical bottom electrode C-BE' may be supported by the supporter 105 which may directly contact the cylindrical bottom electrode C-BE'. The pillar-type bottom electrode P-BE' may not contact directly the supporter 105.

As shown in FIG. 1C, since the bottom electrode BE' includes the pillar-type bottom electrode P-BE', the structural stability of a capacitor may be secured. Also, since the bottom electrode BE' includes the cylindrical bottom electrode C-BE', the capacitance of the capacitor may be increased.

FIGS. 2A to 2I are cross-sectional views illustrating a first example of a method for fabricating the semiconductor device 100 in accordance with an embodiment of the present invention shown in FIG. 1B.

Figure 2A:
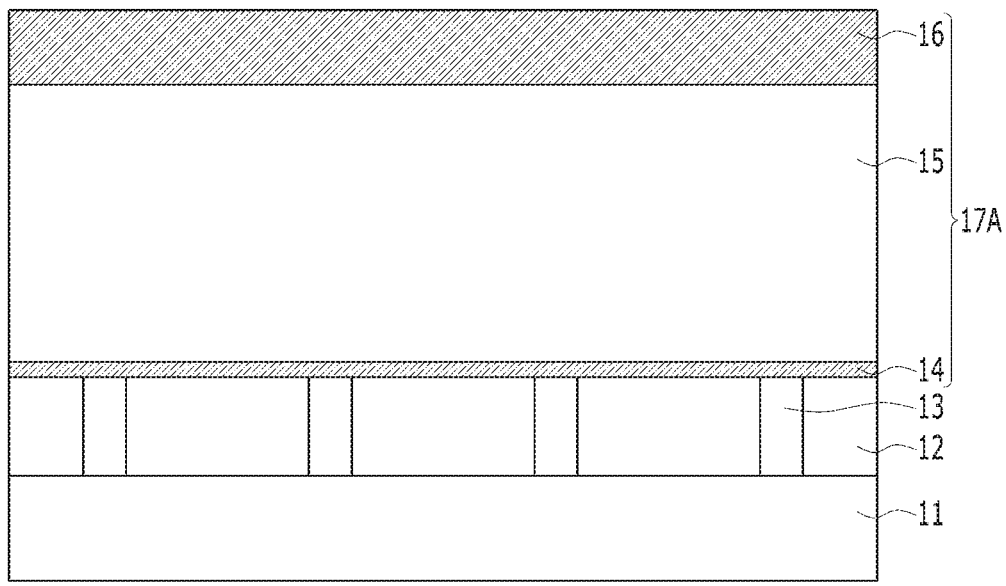
FIGS. 2A to 2I are cross-sectional views illustrating a first example of a method for fabricating the semiconductor device in accordance with an embodiment of the present invention.

Referring to FIG. 2A, an inter-layer dielectric layer 12 may be formed over a substrate 11. A plurality of contact plugs 13 each penetrating through the inter-layer dielectric layer 12 may be formed. The plurality of contact plugs 13 may be spaced apart at a regular interval along the horizontal direction and may each be coupled to the substrate 11 by penetrating through the inter-layer dielectric layer 12. Although not illustrated, a cell transistor, a bit line contact plug, and a bit line may be further formed before the contact plug 13 is formed. These constituent elements may be described later with reference to FIGS. 11A to 11C.

The substrate 11 may be formed of any suitable material for semiconductor processing. The substrate 11 may be a semiconductor substrate. The substrate 11 may include a silicon-containing material. The substrate 11 may include silicon, monocrystalline silicon, polysilicon, amorphous silicon, silicon germanium, monocrystalline silicon germanium, polycrystalline silicon germanium, carbon-doped silicon, or a combination thereof or a multi-layer of two or more of them. The substrate 11 may also be made of another semiconductor material such as germanium. The substrate 11 maybe made of a III/V-group semiconductor substrate, that is, a compound semiconductor substrate, e.g., gallium arsenide (GaAs). The substrate 11 may include a Silicon On Insulator (SOI) substrate.

The inter-layer dielectric layer 12 may include a silicon oxide, a silicon nitride, or a combination thereof. The inter-layer dielectric layer 12 may include BSG (Borosilicate Glass), PSG (PhosphoSilicate Glass), BPSG (BoroPhosphoSilicate Glass), TEOS (Tetra ethyl ortho silicate), USG (Undoped Silicate Glass), or SOG (Spin On Glass).

Each contact plug 13 may be formed by etching the inter-layer dielectric layer 12 to form a contact hole (no reference numeral given), and then filling the contact hole with a conductive material. Each contact plug 13 may be made of any suitable material including a polysilicon, a metal, a metal nitride, a metal silicide, or combinations thereof. For example, the contact plug 13 may be formed by sequentially stacking polysilicon, a metal silicide, and a metal.

An etch stop layer 14 may be formed over the contact plug 13 and the inter-layer dielectric layer 12. A mold layer 15 may be formed over the etch stop layer 14. The mold layer 15 may include a dielectric material. The mold layer 15 may include BSG (Borosilicate Glass), PSG (PhosphoSilicate Glass), BPSG (BoroPhosphoSilicate Glass), or TEOS (Tetra ethyl ortho silicate). The mold layer 15 may be a single layer or may have a multi-layer structure of at least two or more layers. For example, the mold layer 15 may have a stacked structure of BPSG (BoroPhosphoSilicate Glass) and TEOS (Tetra ethyl ortho silicate). The mold layer 15 may have a thickness ranging from approximately 1000 Å to approximately 25000 Å.

The etch stop layer 14 may be formed of a material having an etch selectivity with respect to the mold layer 15. For example, the etch stop layer 14 may include a silicon nitride. The etch stop layer 14 may be used as an etch stop point where an etch process for etching the mold layer 15 stops. The etch stop layer 14 may be formed through a method, such as Chemical Vapor Deposition (CVD), Physical Vapor Deposition (PVD), and Atomic Layer Deposition (ALD). The etch stop layer 14 may use plasma in order to increase the effect of deposition. Hence, the etch stop layer 14 may be formed through a method, such as Plasma Enhanced Chemical Vapor Deposition (PECVD) and Plasma Enhanced Atomic Layer Deposition (PEALD).

A supporter layer 16 may be formed over the mold layer 15. The supporter layer 16 may be formed of a material having an etch selectivity with respect to the mold layer 15. For example, the supporter layer 16 may include a silicon nitride, a silicon carbonitride (SiCN), or a combination thereof.

As described above, the etch stop layer 14, the mold layer 15, and the supporter layer 16 may be referred to as a mold stack layer 17A. The thickness of the mold stack layer 17A may affect the height of the bottom electrode which in turn affects the capacitance of the capacitor. For example, when the thickness of the mold stack layer 17A is increased, the capacitance of the capacitor is also raised.

Figure 2B:
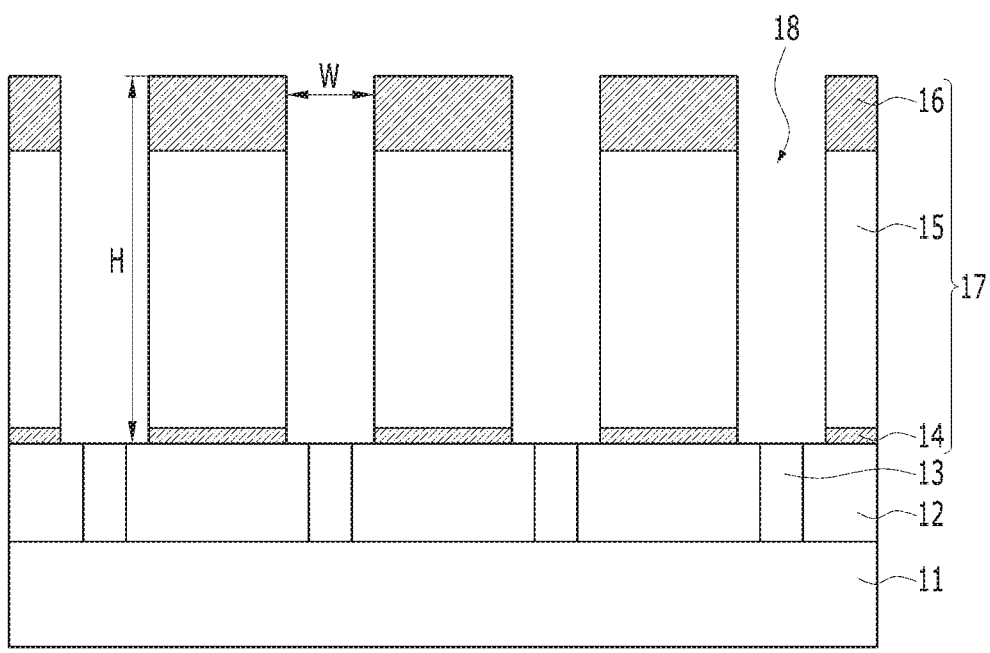

Referring to FIG. 2B, a plurality of openings 18 may be formed by using a mask layer (not shown) and etching the mold stack layer 17A. In order to form the openings 18, the supporter layer 16 and the mold layer 15 may be sequentially etched by using the mask layer as an etch barrier. The etch process for forming the openings 18 may stop at the etch stop layer 14. To form the opening 18, a dry etch process, a wet etch process, or a combination thereof may be used. Each opening 18 may be referred to as a hole where a bottom electrode (or a storage node) is to be formed. Each opening 18 may have a high aspect ratio. The opening 18 may have an aspect ratio of at least approximately 1:1 or higher, preferably of at least 3:1 or more preferably of at least 5:1. For example, in an embodiment, the opening 18 may have a high aspect ratio of approximately 10:1 or higher. Herein, the aspect ratio refers to a ratio of the height (H) to the width (W) of each opening 18. The mask layer may include a photoresist pattern or a hard mask pattern.

Subsequently, the top surface of the contact plug 13 below the opening 18 may be exposed by etching the etch stop layer 14.

Through the series of the etch process, which is described above, a mold stack pattern 17 including a plurality of openings 18 may be formed. The mold stack pattern 17 may be a stacked structure of the etch stop layer 14, the mold layer 15, and the supporter layer 16.

Figure 2C:
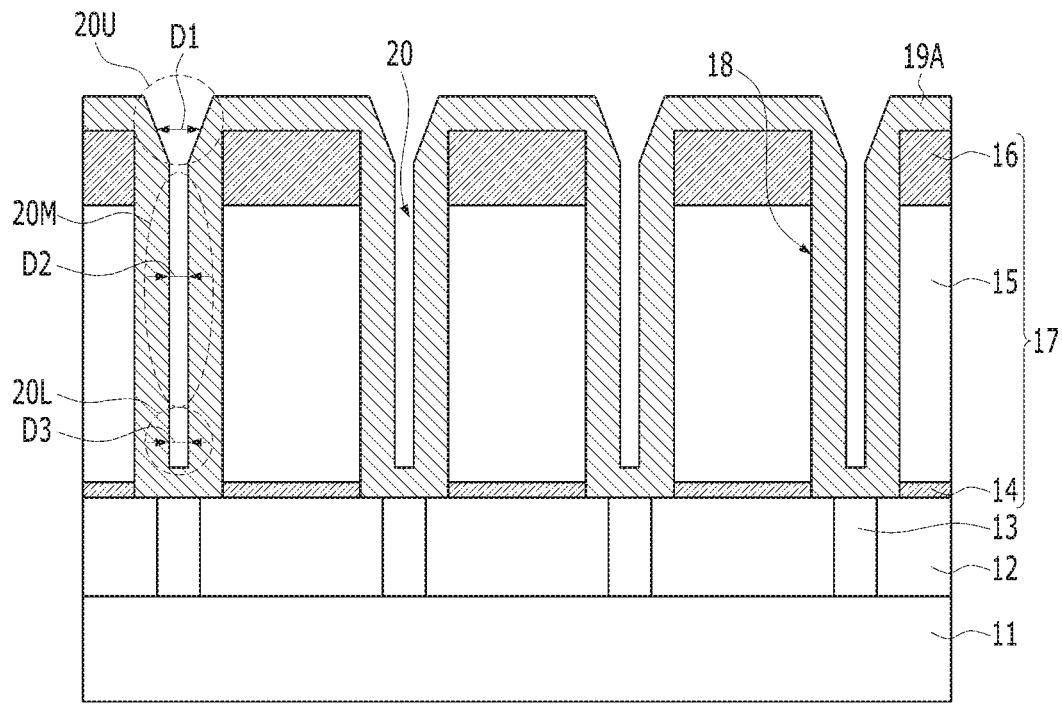

Referring to FIG. 2C, a first bottom electrode layer 19A may be formed over the stack structure 17 and in the inside of the openings 18. The first bottom electrode layer 19A may be formed conformally along the profile of the openings 18. As a result, a portion of each opening that is not filled with the first bottom electrode layer 19A may be defined as a gap 20. The gap 20 may have a higher aspect ratio than the opening 18. The gap 20 may be defined as a lower gap 20L, an intermediate gap 20M, and an upper gap 20U.

To form the first bottom electrode layer 19A in the opening 18, a film forming technology with a good step coverage may be used. For example, CVD or ALD may be used, and plasma may be used as well to increase the effect of deposition. The first bottom electrode layer 19A may include a metal, a metal nitride, or a combination thereof. The first bottom electrode layer 19A may formed from at least one material selected from the group including titanium (Ti), a titanium nitride (TiN), tantalum (Ta), a tantalum nitride (TaN), a titanium aluminum nitride (TiAlN), tungsten (W) or a tungsten nitride (WN), ruthenium (Ru), a ruthenium oxide (RuO$_2$), iridium (Ir), an iridium oxide (IrO$_2$), platinum (Pt) and combinations thereof. In an embodiment of the present invention, the first bottom electrode layer 19A may include a titanium nitride (TiN). The first bottom electrode layer 19A may include a titanium nitride (ALD-TiN) formed through an ALD process.

Subsequently, a partial etch process may be performed onto the first bottom electrode layer 19A. As a result, a portion of the first bottom electrode layer 19A neighboring a top portion of the opening 18 may be partially etched. Through the partial etch process, the upper gap 20U may have a sloped side wall, while the intermediate gap 20M and the lower gap 20L may have vertical side walls. The width of the upper gap 20U may be wider than the widths of the intermediate gap 20M and the lower gap 20L (D1>D2=D3). The width of the intermediate gap 20M and the width of the lower gap 20L may be the same (D2=D3). The widths of the intermediate gap 20M and the lower gap 20L may range from approximately 100 Å to approximately 400 Å.

As described above, a second bottom electrode layer 21A, which is described below, may be more easily gap-filled because of the greater width D1 of the upper gap 20U. According to another embodiment of the present invention, the partial etch process may be omitted.

Figure 2D:
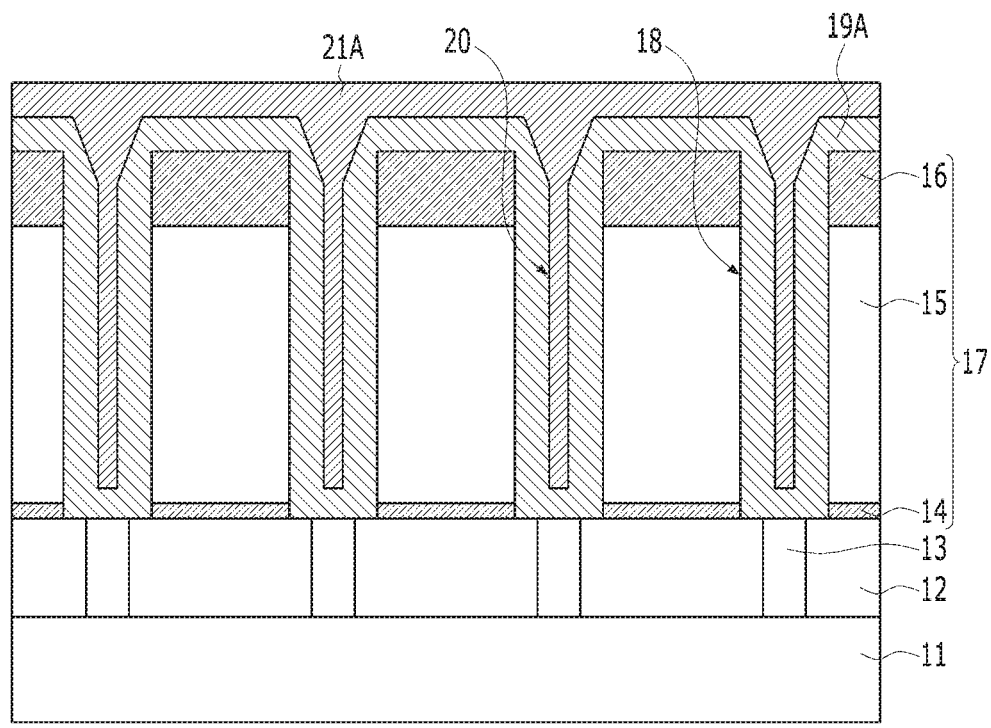

Referring to FIG. 2D, a second bottom electrode layer 21A may be formed. The second bottom electrode layer 21A may be formed over the first bottom electrode layer 19A and may fill the gaps 20. The second bottom electrode layer 21A may be a conductive layer and may have an etch selectivity with respect to the supporter layer 16. The second bottom electrode layer 21A and the first bottom electrode layer 19A may be formed of different materials. The second bottom electrode layer 21A may be formed of a silicon-containing material. The silicon-containing material may include polysilicon or amorphous silicon. The second bottom electrode layer 21A may be doped with an impurity such as boron (B) and phosphorus (P) to attain conductivity. The silicon containing material used for making the second bottom electrode layer 21A may preferably have a good step coverage property for filling the inside of each gap 20 without any voids. Making the upper gap (see 20U of FIG. 2C) with a wider width than the intermediate and lower gaps 20M and 20L facilitates gap-filling with the second bottom electrode layer 21A.

Figure 2E:
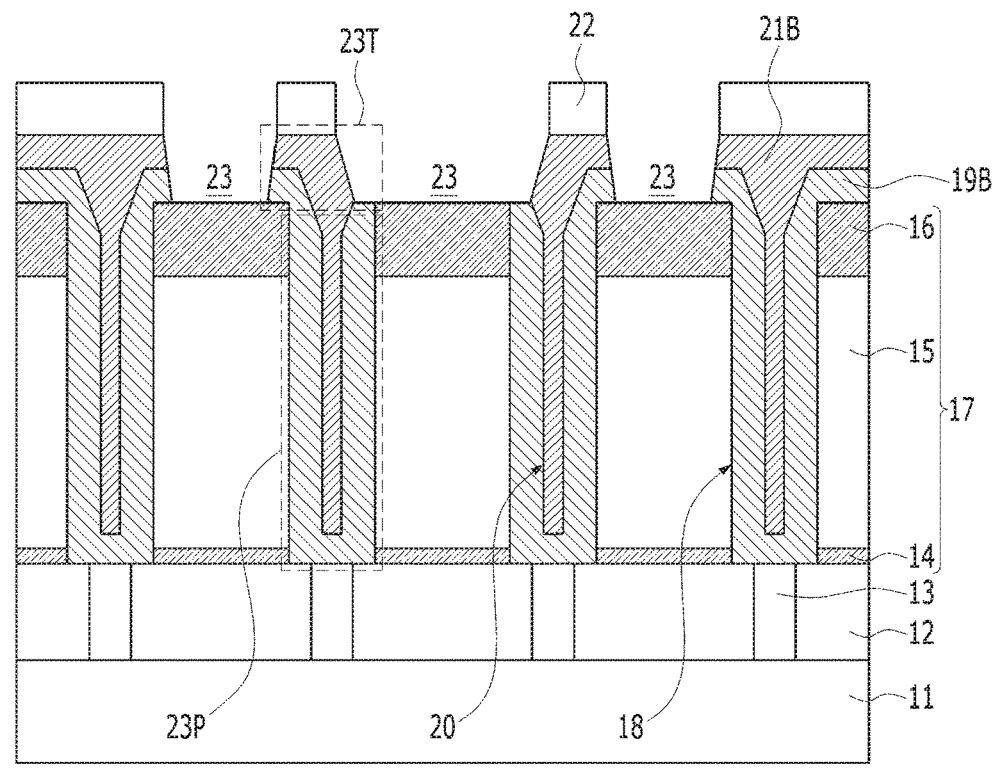

Referring to FIG. 2E, a supporter mask layer 22 may be formed over the second bottom electrode layer 21A. The supporter mask layer 22 may include any suitable photoresist. The supporter mask layer 22 may also include amorphous carbon as well.

The second bottom electrode layer 21A and the first bottom electrode layer 19A may be etched by using the supporter mask layer 22. As a result, an electrode cutting portion 23 may be formed to expose a portion of the surface of the supporter layer 16 that is between the openings 18. A side wall of the electrode cutting portion 23 may have a sloped profile. The first bottom electrode layer 19B and the second bottom electrode layer 21B may remain as shown in FIG. 2E inside the openings 18 and in an area above and adjacent the openings. A portion of the surface of the supporter layer 16 may be exposed through the electrode cutting portion 23. The electrode cutting portion 23 may have the same array and shape as the supporter opening 105S of FIG. 1A.

The first bottom electrode layer 19B and the second bottom electrode layer 21B after the electrode cutting portion 23 is formed may be defined as a filler portion 23P which fills the inside of each opening 18, and a barrier portion 23T extended upwardly from the filler portion 23P above each opening 18. The filler portion 23P may become a pillar-type bottom electrode after the subsequent process is performed. The barrier portion 23T may be used as an etch barrier while the supporter layer 16 is etched during the subsequent process. The bottom surface of the electrode cutting portion 23 may have a depth that does not overlap with the filler portion 23P. In short, the depth of the electrode cutting portion 23 may be controlled in such a manner that the filler portion 23P is not damaged by the electrode cutting portion 23.

Figure 2F:
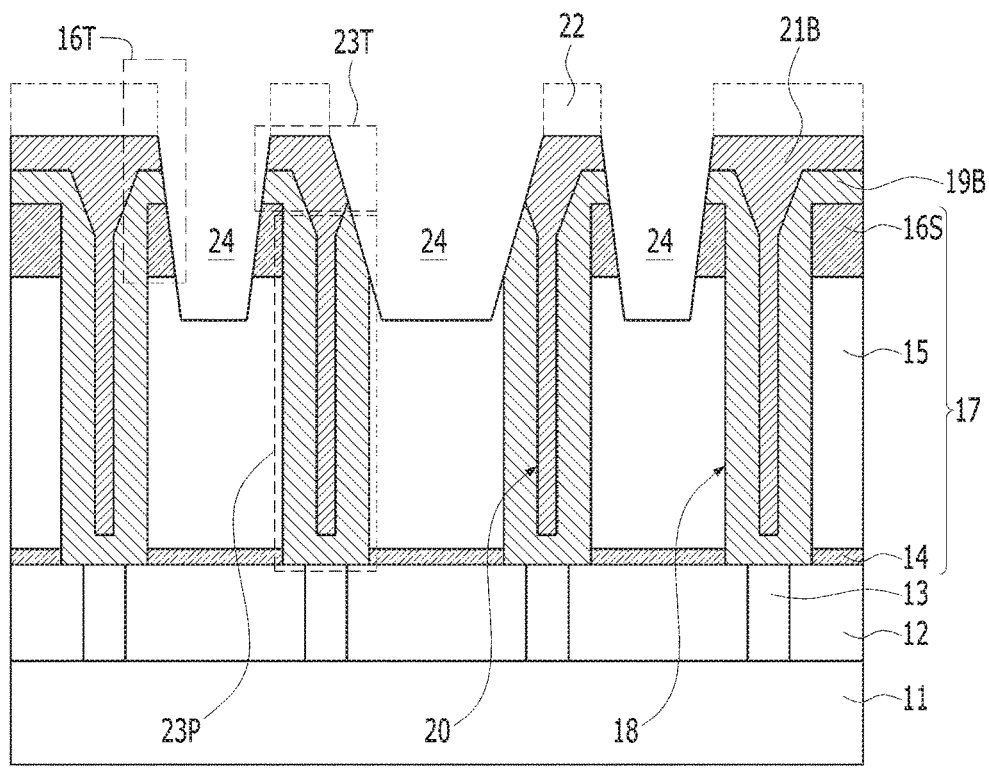

Referring to FIG. 2F, a supporter 16S may be formed. The supporter 16S may be formed by selectively etching the supporter layer 16 exposed through the electrode cutting portion 23. As a result of etching the supporter layer 16, a supporter opening 24 and the supporter 16S may be formed.

The supporter opening 24 may have the same array and shape as the supporter opening 105S of FIG. 1A.

The supporter 16S may contact the first bottom electrode layer 19B. A portion of the surface of the mold layer 15 may be exposed due to the supporter 16S. The surface of the mold layer 15 may be over-etched. In other words, the bottom surface of the supporter opening 24 may be extended into the inside of the mold layer 15 through the surface of the mold layer 15. The supporter 16S may surround a portion of an outer side wall of the first bottom electrode layer 19B. The supporter 16S, which is described above, can protect a bottom electrode having a high aspect ratio from collapsing during the subsequent process of removing the mold layer 15.

Also, while the etch process for forming the supporter 16S is being performed, the supporter mask layer 22 may be consumed. Although the supporter mask layer 22 is consumed, since the barrier portion 23T, i.e., the second bottom electrode layer 21B, functions as an etch barrier, it is possible to prevent the supporter 16S which is adjacent to the upper portion of the opening 18 from being damaged (see reference numeral '16T'). Also, with the barrier portion 23T, it is possible to prevent the filler portion 23P from being etched. As a comparative example, when the supporter layer 16 is etched without the barrier portion 23T, the supporter 16S cannot remain in the upper portion 16T of the opening 18, and also at least a part of the filler portion 23P may be lost.

Figure 2G:
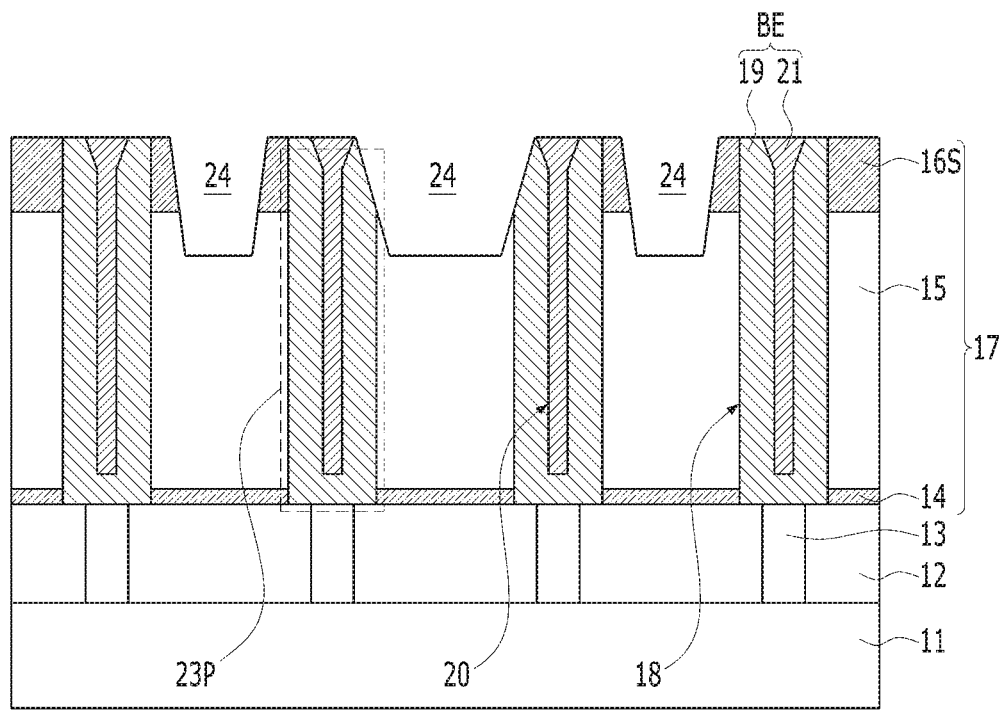

Referring to FIG. 2G, a bottom electrode BE may be formed. The bottom electrode BE may be disposed in the inside of each opening 18. The bottom electrode BE may include a first bottom electrode 19 and a second bottom electrode 21. The first bottom electrode 19 may be formed by selectively removing the first bottom electrode layer 19B. Also, the second bottom electrode 21 may be formed by selectively removing the second bottom electrode layer 21B. In an embodiment of the present invention, the first bottom electrode 19 may include a titanium nitride, and the second bottom electrode 21 may include polysilicon. The bottom electrode BE may have a pillar shape of a titanium nitride and polysilicon.

To form the bottom electrode BE, a selective removing process may be performed onto the first bottom electrode layer 19B and the second bottom electrode layer 21B. The selective removing process performed onto the first bottom electrode layer 19B and the second bottom electrode layer 21B may be able to remove the barrier portion 23T while allowing the filler portion 23P to remain. The remaining filler portion 23P may become the bottom electrode BE. The selective removing process may be a Chemical Mechanical Polishing (CMP) process or an etch-back process. For example, a CMP process may be performed onto the first bottom electrode layer 19B and the second bottom electrode layer 21B until the top surface of the supporter 16S is exposed. According to another embodiment of the present invention, an etch-back process may be performed onto the first bottom electrode layer 19B and the second bottom electrode layer 21B until the top surface of the supporter 16S is exposed. During the etch-back process, the selectivities of the first bottom electrode layer 19B and the second bottom electrode layer 21B may be different from each other. The first bottom electrode 19 may have a cylindrical shape with the gap 20 defined therein, and the second bottom electrode 21 may have a pillar shape filling the gap 20. The second bottom electrode 21 may be able to fill the inside of the gap 20. The upper surfaces of the first bottom electrode 19, the second bottom electrode 21, and the supporter layer 16 may be at the same level.

The bottom electrode BE may be electrically connected to the contact plug 13.

The bottom electrode BE may have a high aspect ratio. The bottom electrode BE may have the same aspect ratio as the opening 18. For example, in an embodiment, the bottom electrode BE may have a high aspect ratio of approximately 10:1 or higher.

Figure 2H:
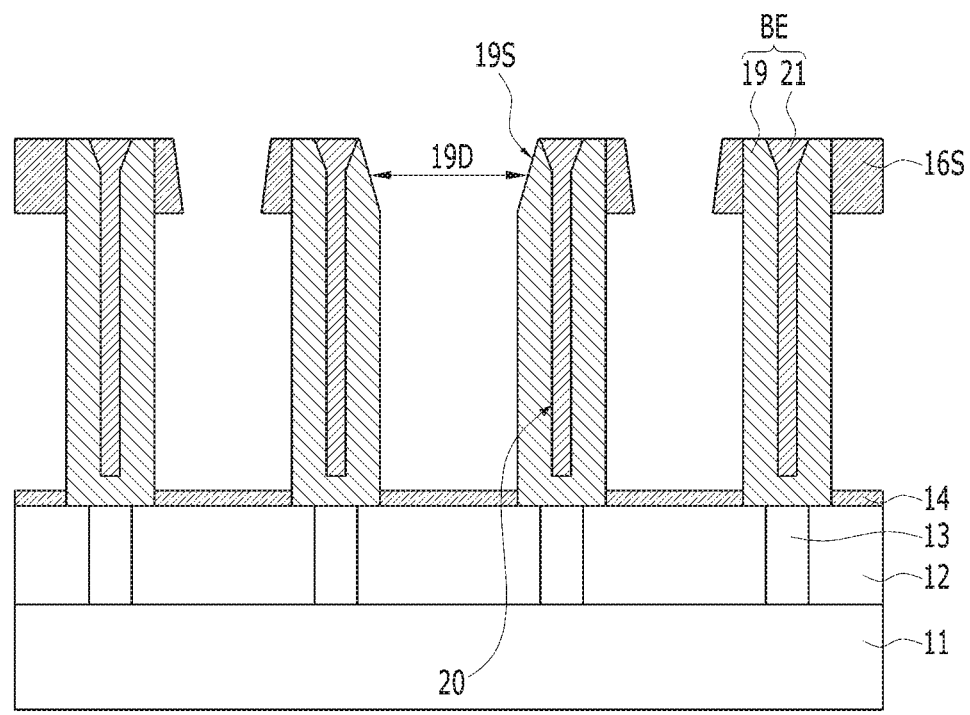

Referring to FIG. 2H, the mold layer 15 may then be removed without the bottom electrode BE collapsing due to the supporter 16S. For example, the mold layer 15 may be removed through a wet dip-out process. The wet chemical for removing the mold layer 15 may be supplied through the supporter opening 24. Non-limiting examples of the wet chemical may include one or more selected from the group including HF, $NH_4F/NH_4OH$, $H_2O_2$, HCl, $HNO_3$, and $H_2SO_4$.

For example, when the mold layer 15 is formed of a silicon oxide, the mold layer 15 may be removed through the wet dip-out process using a chemical including hydrofluoric acid. It is noted that the when the mold layer 15 is removed, the supporter 16S having an etch selectivity with respect to the mold layer 15 is not removed but remains in place to provide support to the bottom electrode BE. As a result, the neighboring bottom electrode BE is supported by the supporter 16S, and, hence, the bottom electrode BE is protected from collapsing. Also, the second bottom electrode 21 may protect the inside of the first bottom electrode 19 from being damaged. When the mold layer 15 is removed, the etch stop layer 14 protects the inter-layer dielectric layer 12 and the contact plug 13 from being damaged.

As the mold layer 15 is removed, all the outer wall of the bottom electrode BE may be exposed. In other words, all the outer wall of the first bottom electrode 19 may be exposed. The upper portion of the bottom electrode BE may be supported by the supporter 16S. The bottom of the bottom electrode BE may be surrounded and supported by the etch stop layer 14.

As a portion of the first bottom electrode 19 is etched by the chemical during the wet dip-out process, the distance 19D between two neighboring bottom electrodes BE may increase. For example, the upper portion of a portion of the first bottom electrode 19 that does not contact the supporter 16S may have a sloped side wall 19S. Due to the sloped side wall 19S, the distance 19D between the bottom electrodes BE may increase.

Figure 2I:
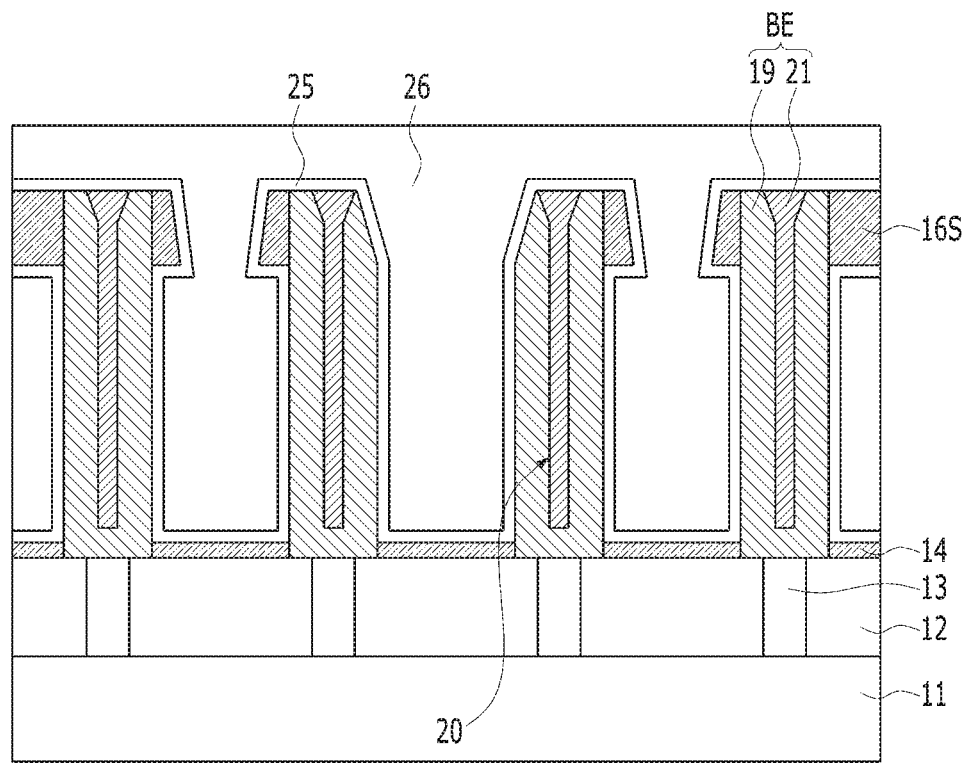

Referring to FIG. 2I, a dielectric layer 25 may then be formed. The dielectric layer 25 may then be formed over the bottom electrode BE, the supporter 16S and the etch stop layer 14. The dielectric layer 25 may include a high-k material whose dielectric constant is higher than that of a silicon oxide. The high-k material may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$), or a strontium titanium oxide ($SrTiO_3$). According to another embodiment of the present invention, the dielectric layer 25 may be a composite layer including two or more layers of the listed high-K materials.

In an embodiment of the present invention, the dielectric layer 25 may then be formed of a zirconium oxide-based material having fine leakage current characteristics while sufficiently reducing an equivalent oxide layer thickness (EOT). For example, the dielectric layer 25 may include a ZAZ ($ZrO_2/Al_2O_3/ZrO_2$). According to another embodiment of the present invention, the dielectric layer 25 may include a HAH ($HfO_2/Al_2O_3/HfO_2$).

According to yet another embodiment of the present invention, the dielectric layer 25 may include TZAZ ($TiO_2/ZrO_2/Al_2O_3/ZrO_2$), TZAZT ($TiO_2/ZrO_2/Al_2O_3/ZrO_2/TiO_2$), ZAZT ($ZrO_2/Al_2O_3/ZrO_2/TiO_2$), TZ ($TiO_2/ZrO_2$), or ZAZAT ($ZrO_2/Al_2O_3/ZrO_2/Al_2O_3/TiO_2$). In the dielectric layer stack such as TZAZ, TZAZT, ZAZT, TZ, and ZAZAT, $TiO_2$ may be replaced with $Ta_2O_5$.

The dielectric layer 25 may then be formed through a Chemical Vapor Deposition (CVD) process or an Atomic Layer Deposition (ALD) process having a good step coverage characteristics.

After the formation of the dielectric layer 25, a top electrode 26 may be formed over the dielectric layer 25. The top electrode 26 may fill the space between the neighboring bottom electrodes BE. The top electrode 26 may include a metal-based material. For example, the top electrode 26 may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), or a combination thereof. The top electrode 26 may be formed through a Low-Pressure Chemical Vapor Deposition (LPCVD) process, a Plasma Enhanced Chemical Vapor Deposition (PECVD) process, or an Atomic Layer Deposition (ALD) process. In an embodiment of the present invention, the top electrode 26 may include a titanium nitride (ALD-TiN) formed through the ALD process.

According to another embodiment of the present invention, the top electrode 26 may have a multi-layer structure. The top electrode 26 may be formed by sequentially stacking a first metal-containing layer, a silicon germanium layer, and a second metal-containing layer. The first metal-containing layer and the second metal-containing layer may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), or a combination thereof. For example, the first metal-containing layer may include a titanium nitride, and the second metal-containing layer may include WN/W where a tungsten nitride and tungsten are stacked. The silicon germanium layer may be doped with boron.

The top electrode 26 may be formed by depositing a top electrode layer (not shown) and patterning the top electrode layer.

Figure 2J:
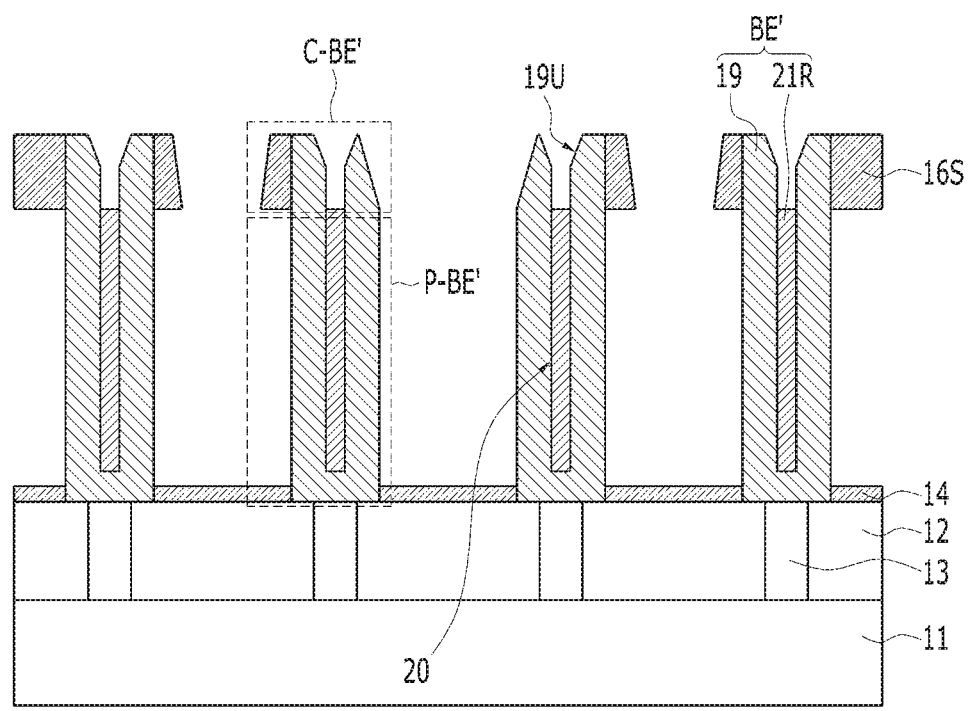
FIGS. 2J and 2K are cross-sectional views illustrating an example of the method for fabricating the semiconductor device shown in FIG. 1C.
Figure 2K:
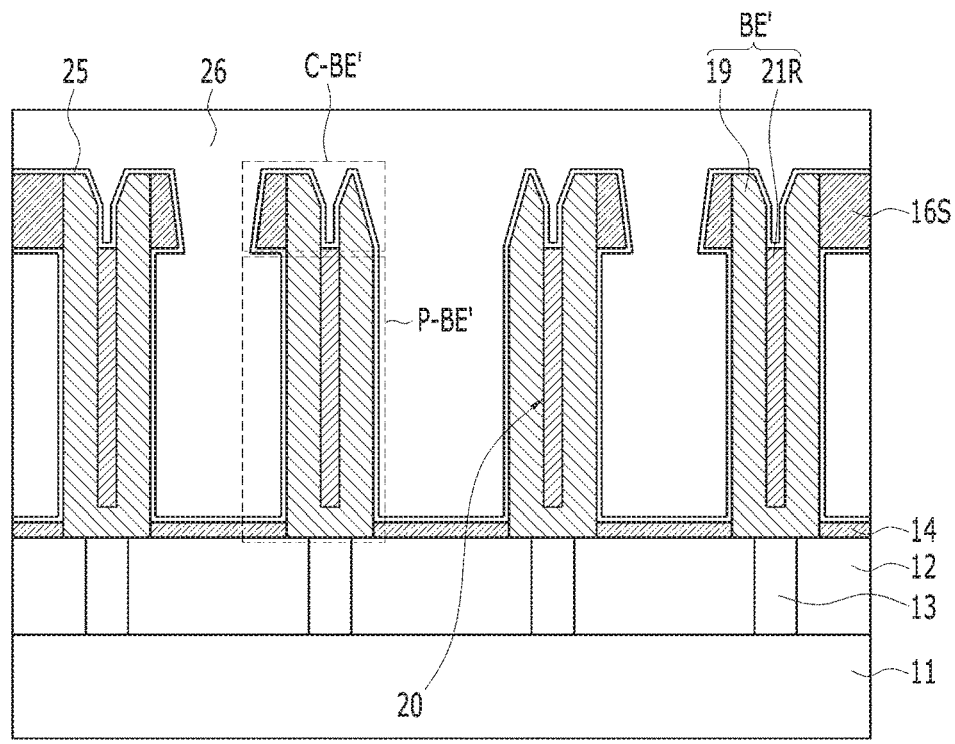

FIGS. 2J and 2K are cross-sectional views illustrating an example of the method for fabricating the semiconductor device 100' shown in FIG. 1C.

First, through the method described with reference to FIGS. 2A to 2H, the mold layer 15 may be removed after the bottom electrode BE and the supporter 16S are formed.

Subsequently, referring to FIG. 23, the second bottom electrode 21 may be selectively recessed. The second bottom electrode 21 may be selectively recessed through an etchback process or a wet etch process. The second bottom electrode 21 may be recessed through a blanket etch process without using a mask. The recess amount of the second bottom electrode 21 may be the same as the height of the supporter 16S. According to another embodiment of the present invention, the second bottom electrode 21 may be recessed deeper than the bottom surface of the supporter 16S. The recess of the second bottom electrode 21 may be controlled to a depth at which the first bottom electrode 19 may be protected from collapsing. The recess amount of the second bottom electrode 21 may be controlled in such a manner that the recessed portion of the second bottom electrode 21 may be readily gap-filled with the dielectric layer 25 and the top electrode 26 in the subsequent process.

The recessed second bottom electrode 21R may have a surface lower than the top surface of the first bottom electrode 19. The upper surface of the recessed second bottom electrode 21R and the bottom surface of the supporter 16S may be at the same level. In other words, the recessed second bottom electrode 21R may not overlap with the supporter 16S. Due to the recessed second bottom electrode 21R, the inner wall 19U of the upper portion of the first bottom electrode 19 is exposed.

The first bottom electrode 19 and the recessed second bottom electrode 21R may form a bottom electrode BE' of a hybrid structure. As the inner wall 19U of the upper portion of the first bottom electrode 19 is exposed, the surface area of the bottom electrode BE' is increased which may also increase the capacitance.

As described above, the recessed second bottom electrode 21R and the first bottom electrode 19 may form a pillar-type bottom electrode P-BE'. The upper portion of the first bottom electrode 19 may become a cylindrical bottom electrode C-BE'. The cylindrical bottom electrode C-BE' may be disposed over the pillar-type bottom electrode P-BE'. The upper portion of the first bottom electrode 19 may correspond to the cylinder head 106H shown in FIG. 1C.

Subsequently, referring to FIG. 2K, the dielectric layer 25 and the top electrode 26 may be formed sequentially. The dielectric layer 25 may then be formed over the recessed second bottom electrode 21R, the first bottom electrode 19, and the supporter 16S. A portion of the dielectric layer 25 may cover the etch stop layer 14. Another portion of the dielectric layer 25 may cover the upper portion of the first bottom electrode 19.

After the dielectric layer 25 is formed, the top electrode 26 may be formed over the dielectric layer 25. The top electrode 26 may fill the space between the neighboring bottom electrodes BE. A portion of the top electrode 26 may fill the upper portion of the recessed second bottom electrode 21R, Therefore, a portion of the top electrode 26 may be able to cover the upper portion of the first bottom electrode 19.

FIGS. 3A to 3E are cross-sectional views illustrating a second example of a method for fabricating the semiconductor device 100 in accordance with an embodiment of the present invention shown in FIG. 1B.

First, through the process described with reference to FIGS. 2A to 2C, the substrate structure including up to the first bottom electrode layer 19A may be formed over the substrate 11. The first bottom electrode layer 19A may be exposed to a partial etch process. As a result of the partial etch process, the width of the upper portion of the gap 20 may be expanded.

Figure 3A:
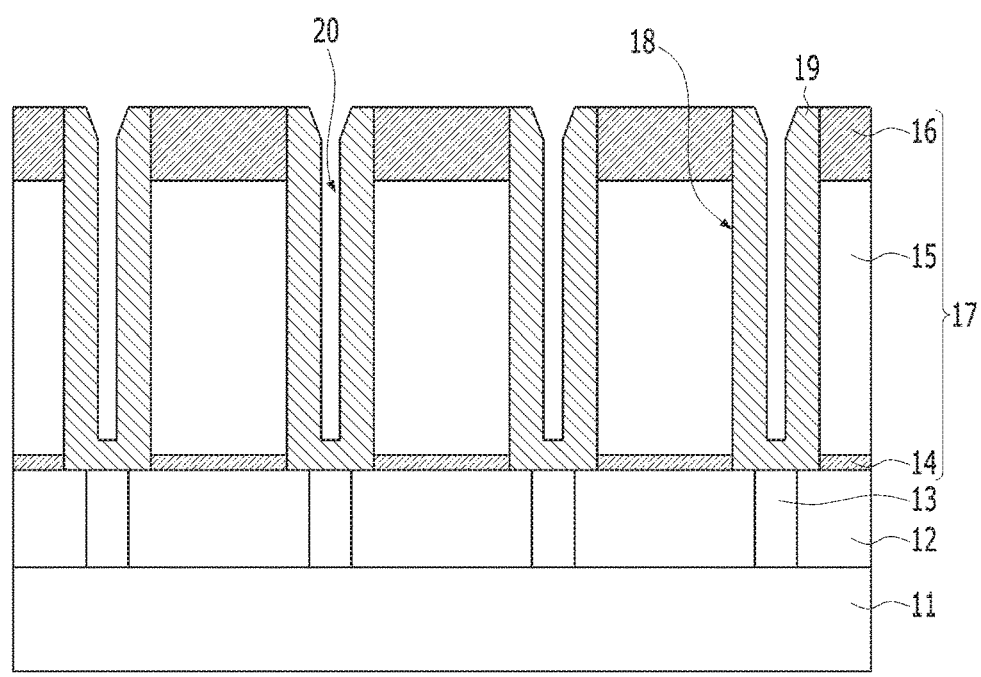
FIGS. 3A to 3E are cross-sectional views illustrating a second example of a method for fabricating the semiconductor device in accordance with an embodiment of the present invention.

Subsequently, referring to FIG. 3A, a first bottom electrode 19 may be formed. The first bottom electrode 19 may be disposed in the inside of each opening 18. The first bottom electrode 19 may be formed by selectively removing the first bottom electrode layer 19A, which is called a selective removing process. The first bottom electrode 19 may have a cylindrical shape. In order to form the first bottom electrode 19, the selective removing process may be performed onto the first bottom electrode layer 19A. The selective removing process may be a Chemical Mechanical Polishing (CMP) process or an etch-back process. For example, a CMP process may be performed onto the first bottom electrode layer 19A until the surface of a supporter layer 16 is exposed.

The first bottom electrode 19 may be electrically connected to the contact plug 13. A gap 20 may be defined in the inside of the first bottom electrode 19.

Figure 3B:
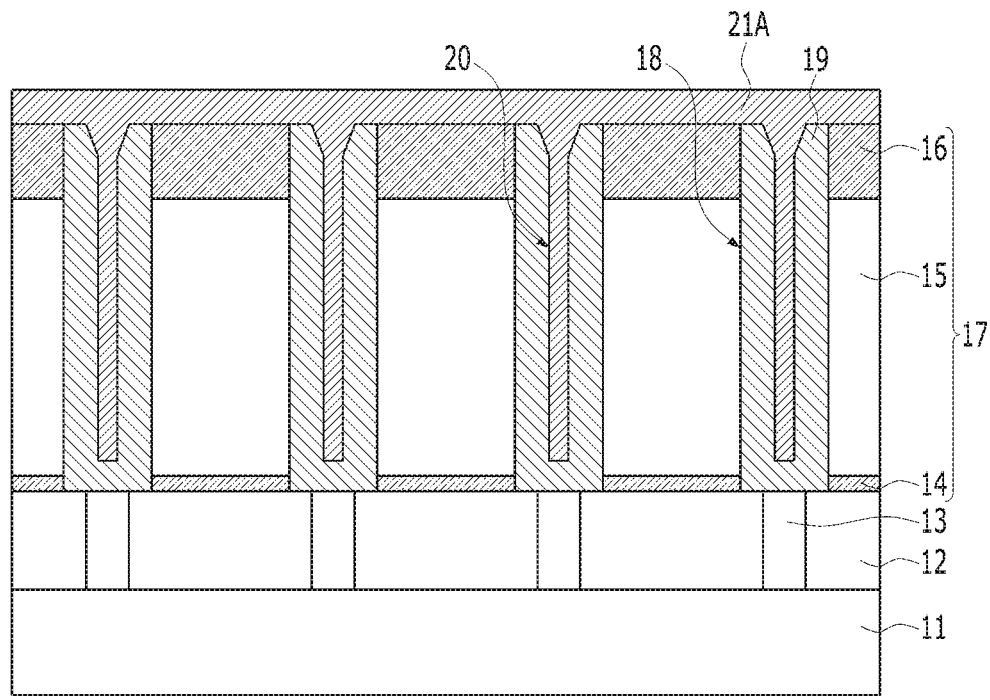

Referring to FIG. 3B, a second bottom electrode layer 21A may be formed. The second bottom electrode layer 21A may be formed over the first bottom electrode 19. The second bottom electrode layer 21A may fill each gap 20. The second bottom electrode layer 21A may include a conductive material. The second bottom electrode layer 21A may include a material having an etch selectivity with respect to the supporter layer 16. The second bottom electrode layer 21A and the first bottom electrode 19 may be formed of different materials. The second bottom electrode layer 21A may include a silicon-containing material. The second bottom electrode layer 21A may include polysilicon. Since polysilicon has a good step coverage, it can fill the inside of the gap 20 substantially without any voids.

Figure 3C:
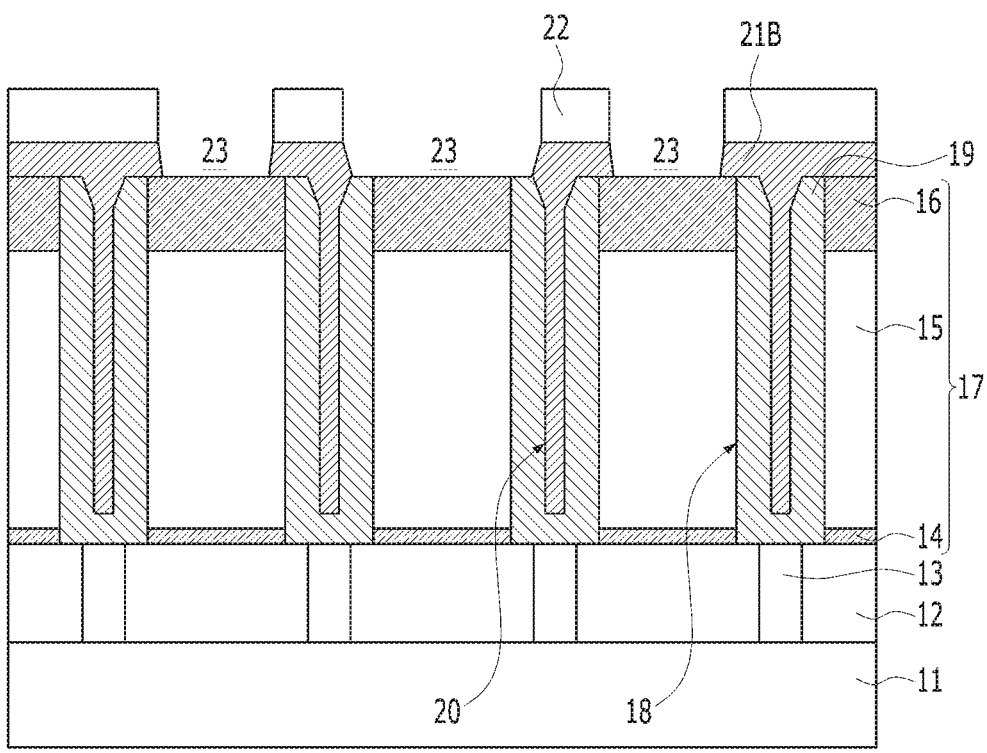

Referring to FIG. 3C, a supporter mask layer 22 may be formed. The supporter mask layer 22 may include a photoresist.

The second bottom electrode layer 21A may be etched by using the supporter mask layer 22. As a result, an electrode cutting portion 23 may be formed to expose a portion of the surface of the supporter layer 16. A side wall of the electrode cutting portion 23 may have a sloped profile. The second bottom electrode layer may remain as shown by reference numerals and '21B'.

Figure 3D:
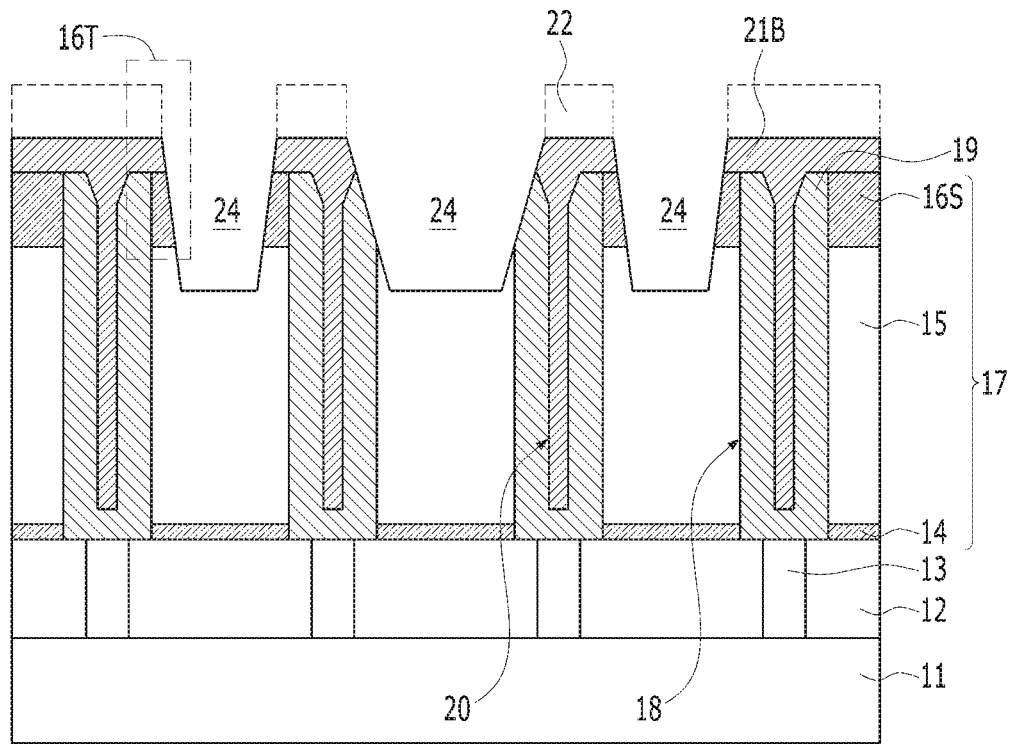

Referring to FIG. 3D, a supporter 16S may be formed. The supporter 16S may be formed by selectively etching the supporter layer 16 exposed through the electrode cutting portion 23. As a result of etching the supporter layer 16, a supporter opening 24 and the supporter 16S may be formed.

The supporter 16S may contact the first bottom electrode 19. A portion of the surface of the mold layer 15 may be exposed due to the supporter 16S. The surface of the mold layer 15 may be over-etched. In other words, the supporter opening 24 may be extended into the inside of the mold layer 15 through the surface of the mold layer 15. The supporter 16S may surround a portion of an outer side wall of the first bottom electrode 19. The supporter 16S, which is described above, can protect a bottom electrode having a high aspect ratio from collapsing during the subsequent process of removing the mold layer 15.

Also, while the etch process for forming the supporter 16S is being performed, the supporter mask layer 22 may be consumed. Although the supporter mask layer 22 is consumed, since the second bottom electrode layer 21B functions as an etch barrier, it is possible to prevent the supporter 16S from being damaged in the upper portion of the opening 18 (see reference numeral '16T').

Figure 3E:
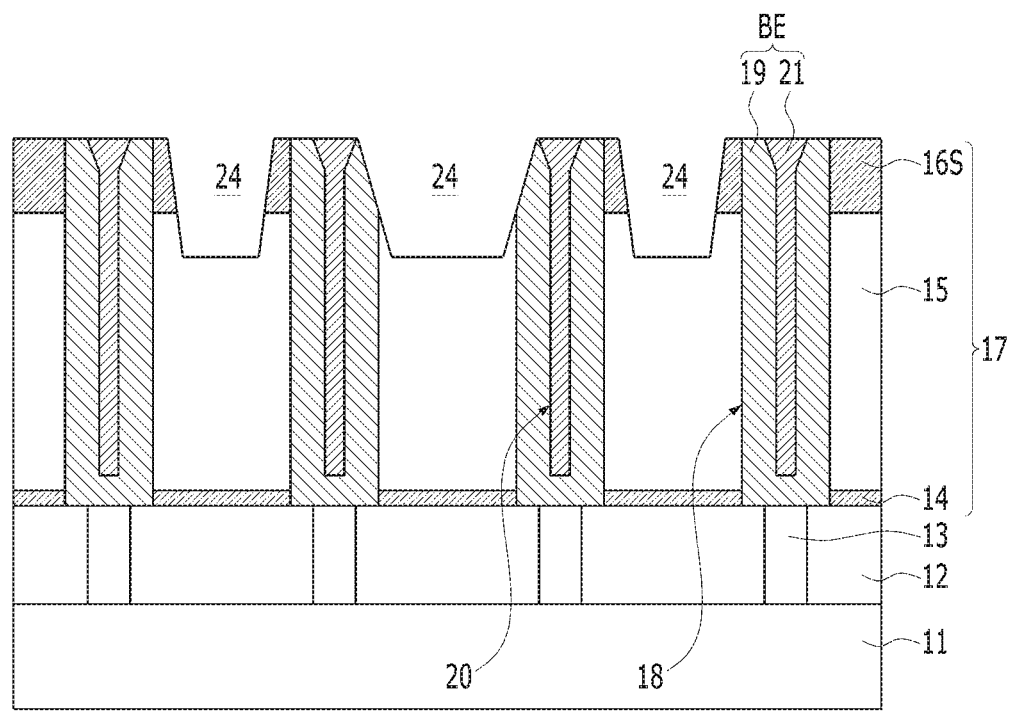

Referring to FIG. 3E, a second bottom electrode 21 may be formed. The second bottom electrode 21 may be disposed in the inside of each opening 18. The second bottom electrode 21 may be disposed in the inside of the gap 20 in the inside of the first bottom electrode 19. The second bottom electrode 21 may have a pillar shape. The second bottom electrode 21 may be formed by selectively removing the second bottom electrode layer 21B. To form the second bottom electrode 21, a selective removing process may be performed onto the second bottom electrode layer 21B. The selective removing process may be a Chemical Mechanical Polishing (CMP) process or an etch-back process. For example, a CMP process may be performed onto the second bottom electrode layer 21B until the surface of the supporter 16S is exposed.

As described above, a bottom electrode BE formed of the first bottom electrode 19 and the second bottom electrode 21 may be formed by forming the second bottom electrode 21. The bottom electrode BE may have a high aspect ratio. The bottom electrode BE may have the same aspect ratio as the opening 18. For example, in an embodiment, the bottom electrode BE may have a high aspect ratio of approximately 10:1 or higher. The first bottom electrode 19 may have a cylindrical shape with the gap 20 defined therein, and the second bottom electrode 21 may fill the inside of the gap 20. In this respect, the second bottom electrode 21 may have a pillar shape.

Subsequently, as illustrated in FIGS. 2H and 2I, the process of removing the mold layer 15 may be performed. Subsequently, a dielectric layer 25 and a top electrode 26 may be formed.

According to another embodiment of the present invention, the semiconductor device 100' shown in FIG. 1C may be also formed in the method described with reference to FIGS. 2J and 2K.

FIGS. 4A to 4D are cross-sectional views illustrating a third example of a method for fabricating the semiconductor device 100 in accordance with an embodiment of the present invention shown in FIG. 1B.

First, the substrate structure including the constituent structure up to the first bottom electrode layer 19A and the second bottom electrode layer 21A may be sequentially formed through the method described with reference to FIGS. 2A to 2D.

Figure 4A:
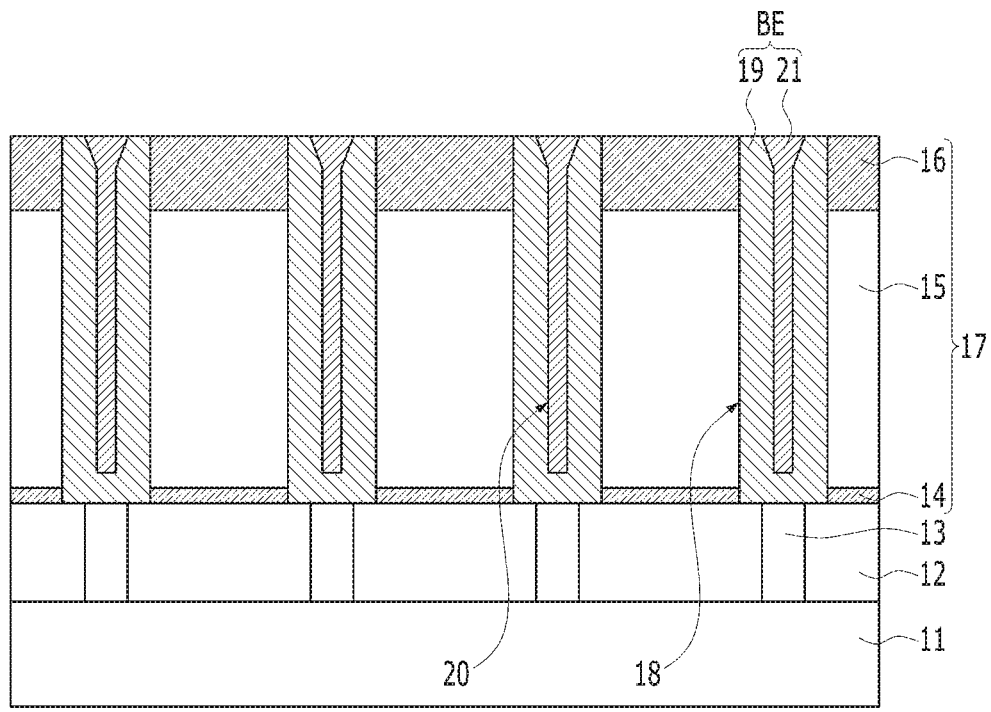
FIGS. 4A to 4D are cross-sectional views illustrating a third example of a method for fabricating the semiconductor device in accordance with an embodiment of the present invention.

Subsequently, referring to FIG. 4A, a plurality of bottom electrodes BE may be formed. Each of the bottom electrodes BE may be disposed in the inside of one of the openings 18, Each bottom electrode BE may include the first bottom electrode 19 and the second bottom electrode 21. The first bottom electrode 19 may be formed through a selective removing process of selectively removing the first bottom electrode layer 19A. The second bottom electrode 21 may be formed through a selective removing process of selectively removing the second bottom electrode layer 21A. In an embodiment of the present invention, the first bottom electrode 19 may include a titanium nitride, and the second bottom electrode 21 may include polysilicon. The bottom electrode BE may have a pillar shape including a titanium nitride and polysilicon.

To form the bottom electrode BE, a selective removing process may be performed onto the first bottom electrode layer 19A and the second bottom electrode layer 21A. The selective removing process may be a Chemical Mechanical Polishing (CMP) process or an etch-back process. For example, a CMP process may be performed onto the first bottom electrode layer 19A and the second bottom electrode layer 21A until the surface of the supporter layer 16 is exposed. According to another embodiment of the present invention, an etch-back process may be performed onto the first bottom electrode layer 19A and the second bottom electrode layer 21A until the surface of the supporter layer 16 is exposed. During the etch-back process, the selectivities of the first bottom electrode layer 19A and the second bottom electrode layer 21A may be different from each other. The first bottom electrode 19 may have a cylindrical shape with the gap 20 defined therein, and the second bottom electrode 21 may be able to fill the inside of the gap 20. In this respect, the bottom electrode BE may have a pillar shape. The upper surfaces of the first bottom electrode 19, the second bottom electrode 21, and the supporter layer 16 may be at the same level.

The bottom electrode BE may be electrically connected to the contact plug 13.

Figure 4B:
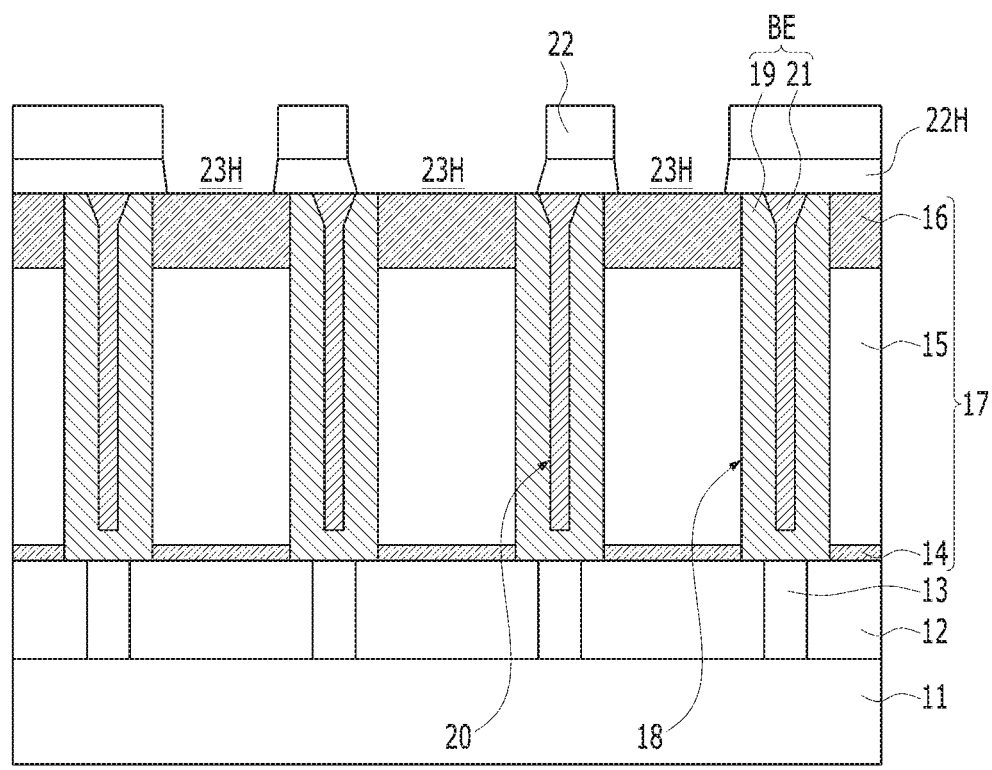

Referring to FIG. 4B, a hard mask layer 22H may be formed over the bottom electrode BE and the supporter layer 16. The hard mask layer 22H may include amorphous carbon.

A supporter mask layer 22 may be formed over the hard mask layer 22H. The supporter mask layer 22 may include a photoresist.

The hard mask layer 22H may be etched by using the supporter mask layer 22. As a result, a cutting portion 23H may be formed to expose a portion of the surface of the supporter layer 16. A side wall of the cutting portion 23H may have a sloped profile. After the cutting portion 23H is formed, the remaining hard mask layer 22H can protect the second bottom electrode 21.

Figure 4C:
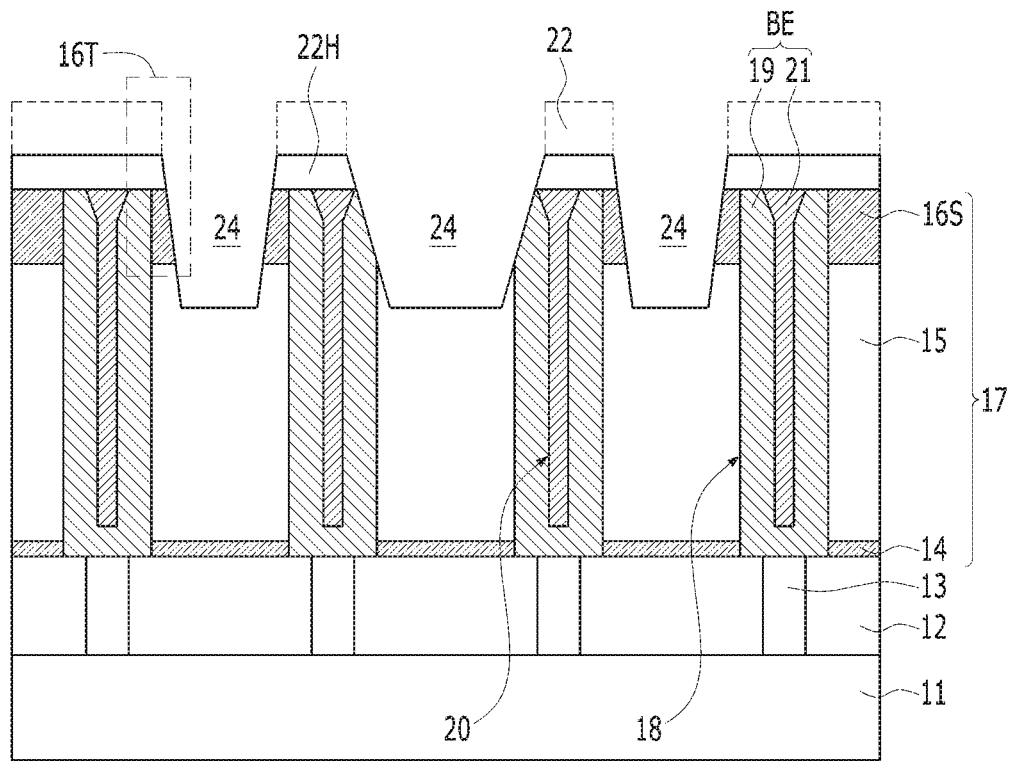

Referring to FIG. 4C, a supporter 16S may be formed. The supporter 16S may be formed by selectively etching the supporter layer 16 exposed through the cutting portion 23H. As a result of etching the supporter layer 16, a supporter opening 24 and the supporter 16S may be formed.

The supporter 16S may contact the first bottom electrode 19. A portion of the surface of the mold layer 15 may be exposed due to the supporter 16S. The surface of the mold layer 15 may be over-etched. In other words, the supporter opening 24 may be extended into the inside of the mold layer 15 through the surface of the mold layer 15. The supporter 16S may surround a portion of an outer side wall of the first bottom electrode 19. The supporter 16S, which is described above, can protect a bottom electrode having a high aspect ratio from collapsing during the subsequent process of removing the mold layer 15.

Also, while the etch process for forming the supporter 16S is being performed, the supporter mask layer 22 may be consumed. Although the supporter mask layer 22 is consumed, since the hard mask layer 22H functions as an etch barrier, it is possible to prevent the supporter 16S, the first bottom electrode 19, and the second bottom electrode 21 from being damaged (see reference numeral '16T').

Figure 4D:
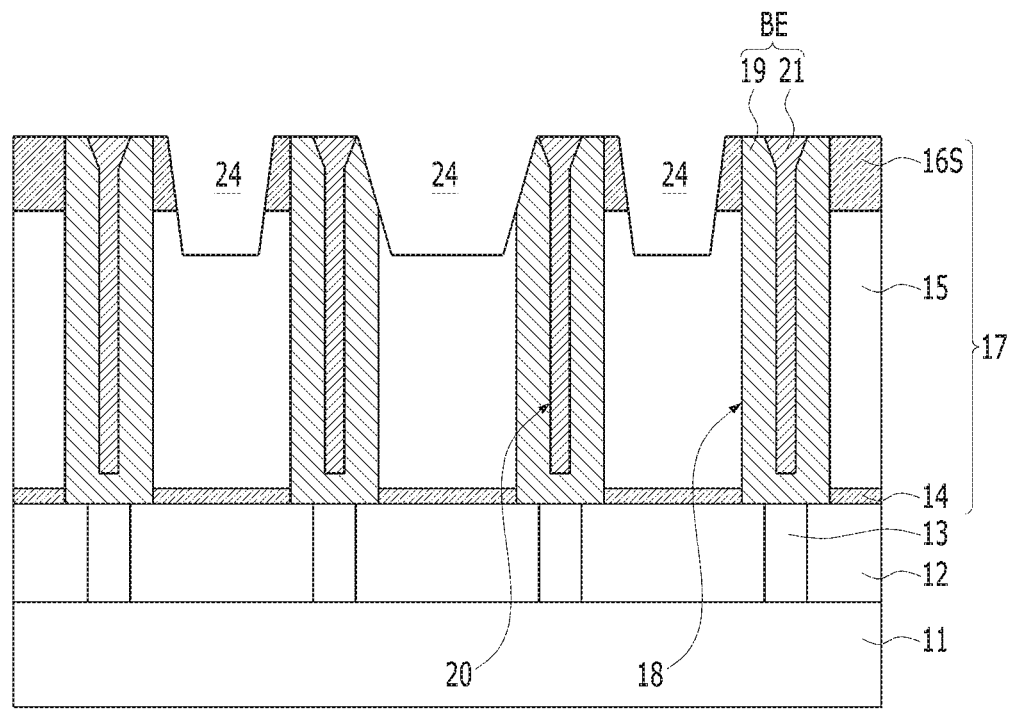

Referring to FIG. 4D, the hard mask layer 22H may be removed.

Subsequently, as illustrated in FIGS. 2H and 2I, the mold layer 15 may be removed. Subsequently, a dielectric layer 25 and a top electrode 26 may be formed.

According to another embodiment of the present invention, the semiconductor device 100' shown in FIG. 1C may be also formed in the method described with reference to FIGS. 4A to 4D and FIGS. 2J and 2K.

Figure 5A:
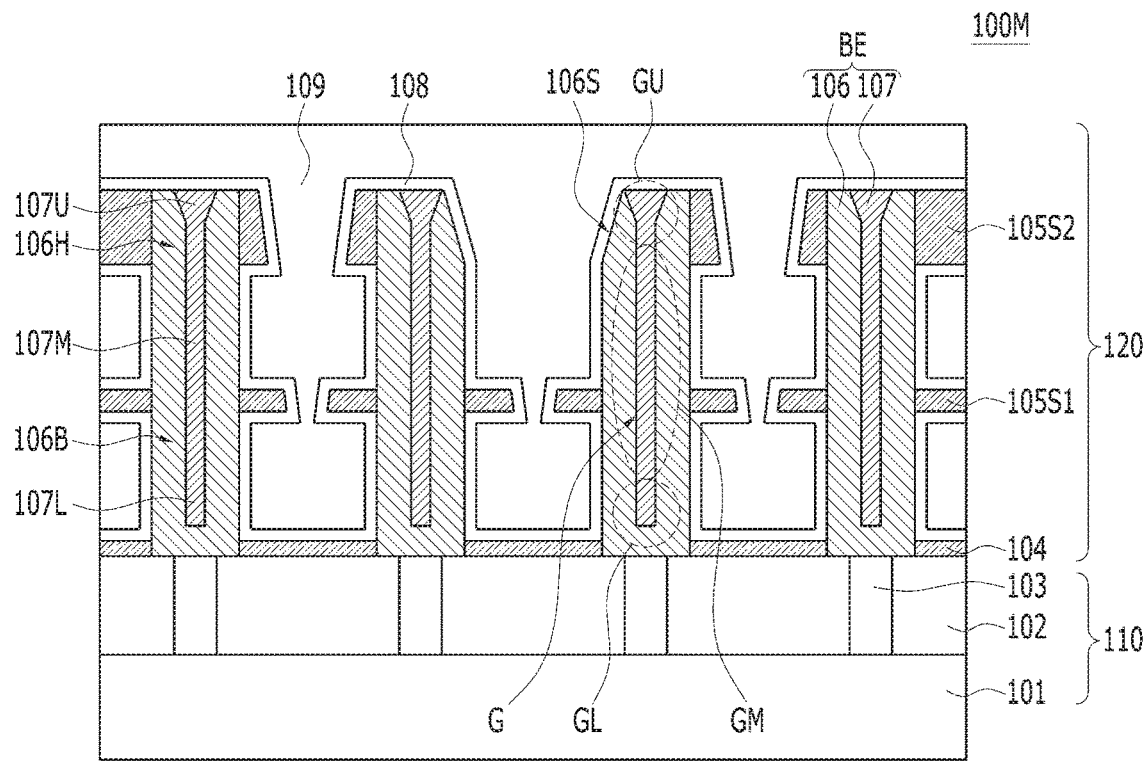
FIG. 5A is a cross-sectional view illustrating a semiconductor device in accordance with an embodiment of the present invention.

FIG. 5A is a cross-sectional view illustrating a semiconductor device 100M in accordance with an embodiment of the present invention. In the semiconductor device 100M, other constituent elements, except multi-level supporters 105S1 and 105S2, may be the same as the semiconductor device 100 shown in an embodiment of the present invention.

Referring to FIG. 5A, the semiconductor device 100M may include a lower structure 110 and a capacitor structure 120. The lower structure 110 may include a substrate 101, an inter-layer dielectric layer 102, and contact plugs 103. The contact plugs 103 may be coupled to the substrate 101 by penetrating through the inter-layer dielectric layer 102. The capacitor structure 120 may include an etch stop layer 104, a bottom electrode BE, a dielectric layer 108, and a top electrode 109.

The capacitor structure 120 may further include multi-level supporters 105S1 and 105S2. The multi-level supporters 105S1 and 105S2 may be formed to support bottom electrodes BE in a horizontal direction in order to prevent the bottom electrodes BE from collapsing. The multi-level supporters 105S1 and 105S2 may be coupled to an outer wall of the bottom electrode BE. The multi-level supporters 105S1 and 105S2 may be formed of an insulating material, such as a silicon nitride. The multi-level supporters 105S1 and 105S2 may include a first supporter 105S1 for supporting an intermediate portion of the bottom electrode BE and a second supporter 105S2 for supporting an upper portion of the bottom electrode BE. The first supporter 105S1 and the second supporter 105S2 may contact the outer wall of a first bottom electrode 106.

According to an embodiment of the present invention, since the bottom electrode BE has a pillar shape, the structural stability of a capacitor may be increased. Moreover, the bottom electrode BE may be protected from collapsing by the presence of the multi-level supporters 105S1 and 105S2.

Figure 5B:
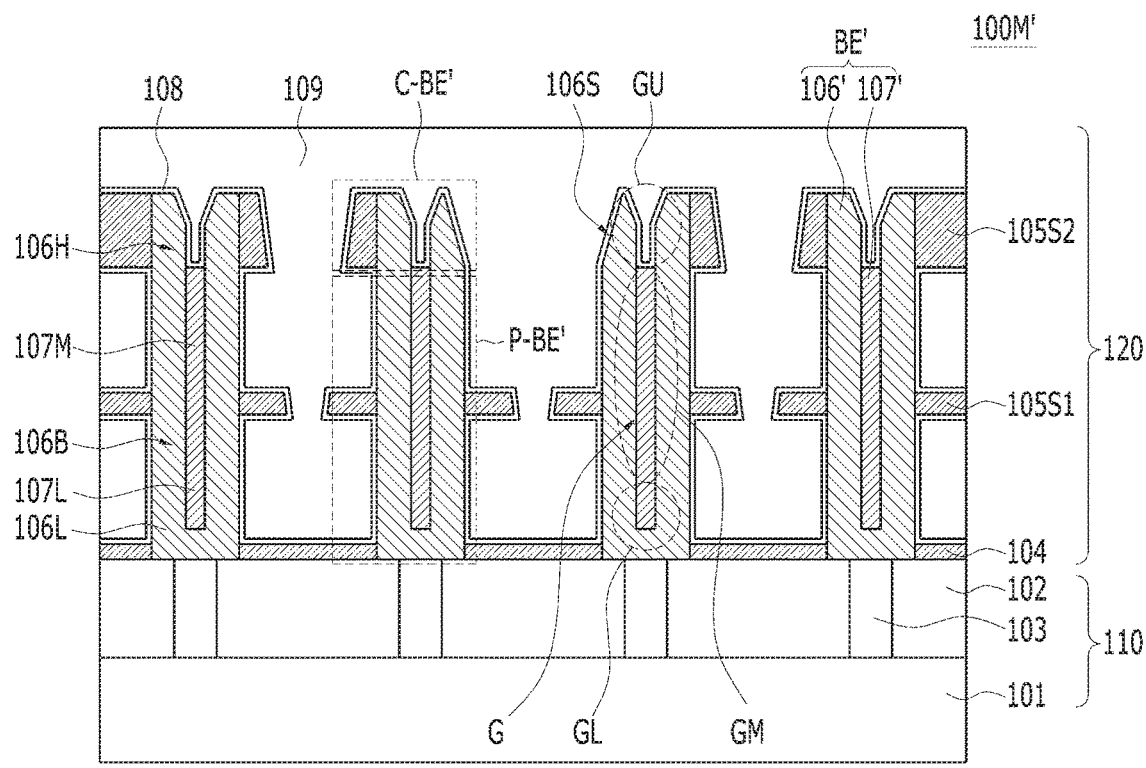
FIG. 5B is a cross-sectional view of a semiconductor device in accordance with a modified example of an embodiment of the present invention.

FIG. 5B is a cross-sectional view of a semiconductor device 100M' in accordance with a modified example of an embodiment of the present invention. In the semiconductor device 100M', the other constituent elements, except a bottom electrode BE', may be the same as the constituent elements of the semiconductor device 100M in accordance with an embodiment shown in FIG. 5A.

Referring to FIG. 5B, the capacitor structure 120 of the semiconductor device 100M' may include the etch stop layer 104, the bottom electrode BE', the dielectric layer 108, and the top electrode 109. The multi-level supporters 105S1 and 105S2 supporting the bottom electrode BE' in a horizontal direction may be formed to protect the bottom electrode BE' from collapsing.

The bottom electrode BE' may include a first bottom electrode 106' and a second bottom electrode 107'. The first bottom electrode 106' may have a cylindrical shape defining a gap G. The second bottom electrode 107' may fill the gap G in the inside of the first bottom electrode 106'. The bottom electrode BE' may have a hybrid structure as the first bottom electrode 106' and the second bottom electrode 107' are combined.

The first bottom electrode 106' may have a cylindrical shape including a bottom, a side wall, and the gap G. An outer wall of a portion of an upper portion of the first bottom electrode 106' may have a sloped side wall 106S. The upper gap GU may have a sloped side wall, and due to the presence of the sloped side wall, the width of the upper gap GU may be wider than the widths of the intermediate gap GM and the lower gap GL. The intermediate gap GM and the lower gap GL may have a vertical side wall. The second bottom electrode 107' may be readily gap-filled due to the upper gap GU.

The second bottom electrode 107' may fill the gap G in the inside of the first bottom electrode 106'. The second bottom electrode 107' may include a lower second bottom electrode 107L' and an intermediate second bottom electrode 107M'. In other words, differently from the second bottom electrode 107 shown in FIG. 5A, the second bottom electrode 107' may include only the intermediate second bottom electrode 107M and the lower second bottom electrode 107L. Therefore, the second bottom electrode 107' may not fill the gap 20. The lower second bottom electrode 107L may fill the lower gap GL. The intermediate second bottom electrode 107M may fill the intermediate gap GM.

Since the second bottom electrode 107' does not fill the upper gap GU, the height of the second bottom electrode 107' may be lower than the height of the first bottom electrode 106'. The second bottom electrode 107' may partially fill the gap G. The second bottom electrode 107' may have a recessed surface lower than the top surface of the first bottom electrode 106'. Due to the recessed surface of the second bottom electrode 107', the cylinder head 106H of the first bottom electrode 106' may have a protruded shape. The cylinder head 106H of the first bottom electrode 106' may have its inner side wall exposed. In short, the inner wall of the cylinder head 106H of the first bottom electrode 106' may not contact the second bottom electrode 107'. Since the cylinder head 106H of the first bottom electrode 106' is exposed, the surface area of the bottom electrode BE may be increased. The second bottom electrode 107' may fill the inside of the cylinder body 106B of the first bottom electrode 106'. The recessed surface of the second bottom electrode 107' may be at the same level as the bottom of the second supporter 105S2. According to another embodiment of the present invention, the recessed surface of the second bottom electrode 107' may be extended to be lower than the bottom of the second supporter 105S2.

The cylinder body 106B of the first bottom electrode 106' and the second bottom electrode 107' may become a pillar-type bottom electrode P-BE'. The cylinder head 106H of the first bottom electrode 106' may become a cylindrical bottom electrode C-BE'. The cylindrical bottom electrode C-BE' may be disposed over the pillar-type bottom electrode P-BE'.

As described above, the bottom electrode BE' may have a hybrid pillar structure where the pillar-type bottom electrode P-BE' and the cylindrical bottom electrode C-BE' are combined. The height of the pillar-type bottom electrode P-BE' may be greater than the height of the cylindrical bottom electrode C-BE'. The cylindrical bottom electrode C-BE' may be supported by the multi-level supporters 105S1 and 105S2.

FIGS. 6A to 6J are cross-sectional views illustrating a first example of a method for fabricating the semiconductor device in accordance with an embodiment of the present invention.

Figure 6A:
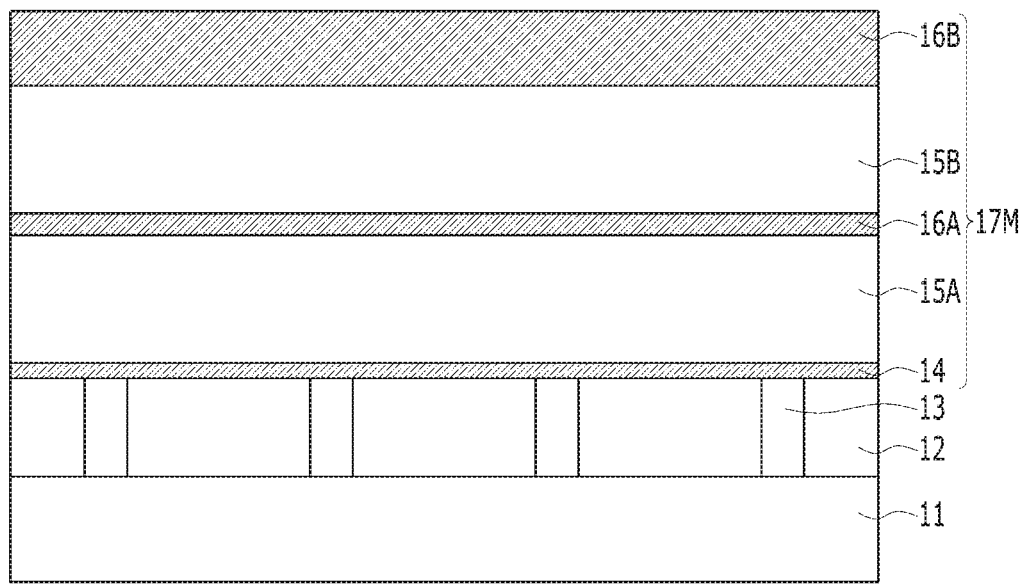
FIGS. 6A to 6J are cross-sectional views illustrating a first example of a method for fabricating the semiconductor device in accordance with an embodiment of the present invention.

Referring to FIG. 6A, an inter-layer dielectric layer 12 may be formed over a substrate 11. A plurality of contact plugs 13 penetrating through the inter-layer dielectric layer 12 may be formed. Each contact plug 13 may be coupled to the substrate 11 by penetrating through the inter-layer dielectric layer 12. Although not illustrated, a cell transistor, a bit line contact plug, and a bit line may be further formed before the contact plug 13 is formed. These constituent elements may be described later with reference to FIGS. 11A to 11C.

A mold stack layer 17M may be formed over the contact plug 13 and the inter-layer dielectric layer 12. The mold stack layer 17M may be formed by sequentially stacking an etch stop layer 14, a first mold layer 15A, a first supporter layer 16A, a second mold layer 15B, and a second supporter layer 16B. The first mold layer 15A and the second mold layer 15B may include a silicon oxide. The first mold layer 15A and the second mold layer 15B may be formed of different silicon oxides.

The etch stop layer 14 may be formed of a material having an etch selectivity with respect to the first mold layer 15A and the second mold layer 15B. For example, the etch stop layer 14 may include a silicon nitride. The etch stop layer 14 may be used as an etch end point when the first mold layer 15A and the second mold layer 15B are etched.

The first supporter layer 16A and the second supporter layer 16B may be formed of a material having an etch selectivity with respect to the first mold layer 15A and the second mold layer 15B. For example, the first supporter layer 16A and the second supporter layer 16B may include a silicon nitride, a silicon carbonitride (SiCN) or a combination thereof.

Figure 6B:
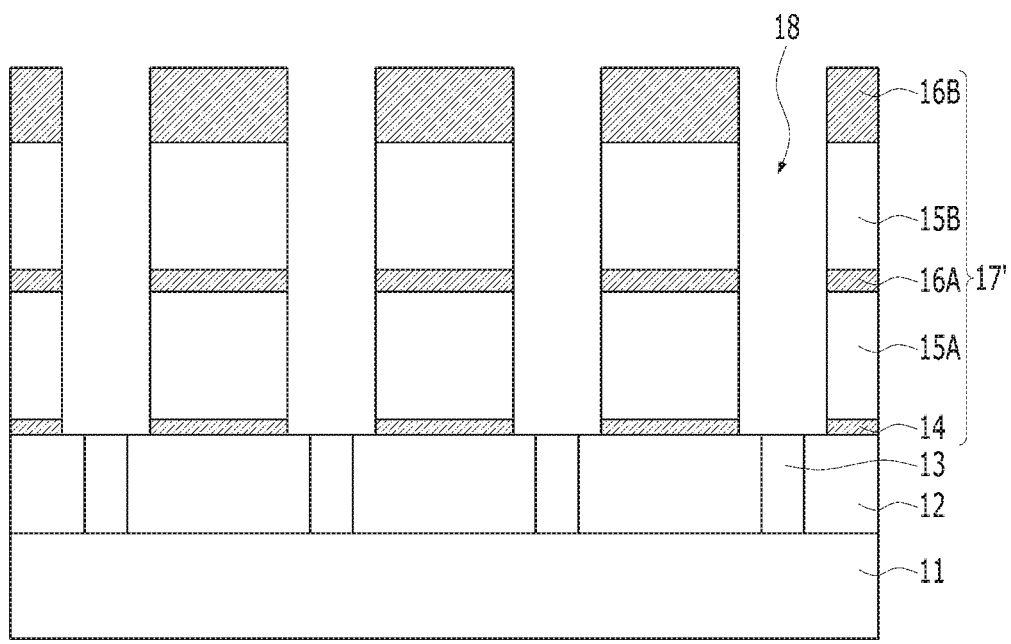

Referring to FIG. 6B, a plurality of openings 18 may be formed. The openings 18 may be formed by etching the mold stack layer 17M. In order to form the openings 18, the first and second supporter layers 16A and 16B and the first and second mold layers 15A and 15B may be etched to form the openings 18. The etch process for forming the openings 18 may stop at the etch stop layer 14. The opening 18s provide the space where bottom electrodes (or storage nodes) are to be formed. Each opening 18 may have a high aspect ratio. In an embodiment, each opening 18 may have an aspect ratio of approximately 10:1 or higher. Herein, the aspect ratio refers to a ratio of height (H) to width (W). Although not illustrated, a photoresist pattern or a hard mask pattern may be used to etch the first and second supporter layers 16A and 16B and the first and second mold layers 15A and 15B.

Subsequently, the surface of an upper portion of the contact plug 13 below the opening 18 may be exposed by etching the etch stop layer 14.

Through the series of the etch process, which is described above, a mold stack pattern 17' including the opening 18 may be formed. The mold stack pattern 17' may be a stacked structure of the etch stop layer 14, the first mold layer 15A, the first supporter layer 16A, the second mold layer 15B, and the second supporter layer 16B.

Figure 6C:
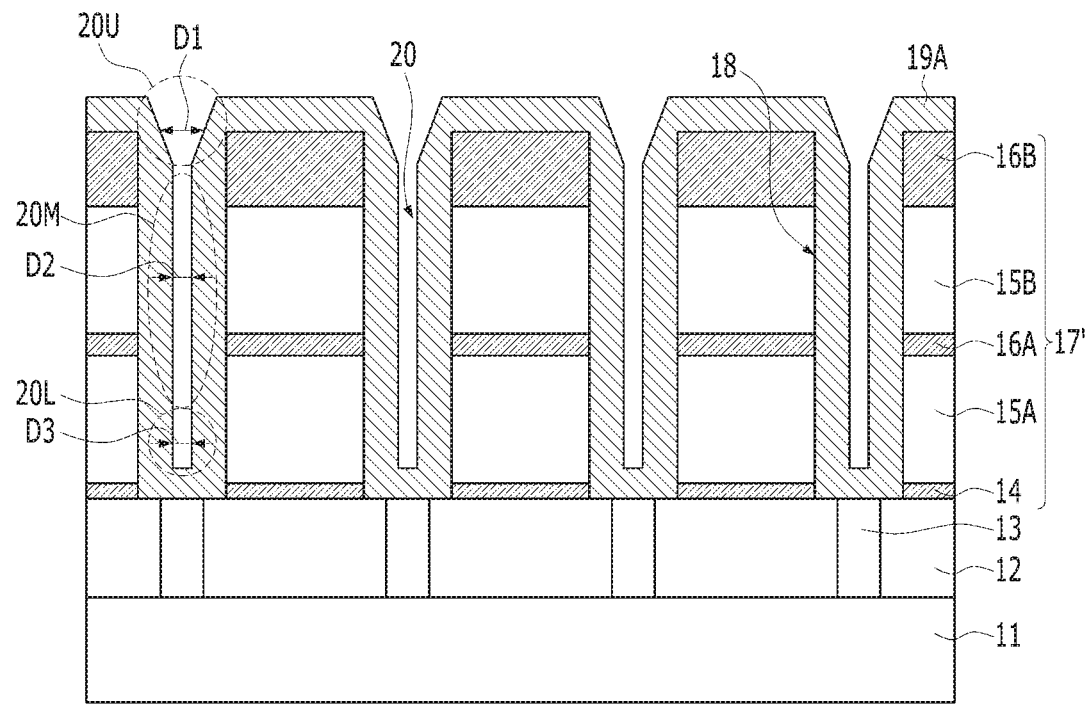

Referring to FIG. 6C, a first bottom electrode layer 19A may be formed conformally along the profile of the opening 18. As a result, a portion that is not filled with the first bottom electrode layer 19A may be defined as a gap 20. The gap 20 may have a higher aspect ratio than the opening 18.

To form the first bottom electrode layer 19A in the opening 18, a film forming technology with a good step coverage may be used. For example, CVD or ALD can be used. The first bottom electrode layer 19A may include a metal, a metal nitride, or a combination thereof. The first bottom electrode layer 19A may include at least one selected from the group including titanium (Ti), a titanium nitride (TiN), tantalum (Ta), a tantalum nitride (TaN), a titanium aluminum nitride (TiAlN), tungsten (W) or a tungsten nitride (WN), ruthenium (Ru), a ruthenium oxide ($RuO_2$), iridium an iridium oxide ($IrO_2$), platinum (Pt) and combinations thereof. In an embodiment of the present invention, the first bottom electrode layer 19A may include a titanium nitride (TiN). The first bottom electrode layer 19A may include a titanium nitride (ALD-TiN) formed through an ALD process.

Subsequently, a partial etch process may be performed onto the first bottom electrode layer 19A. As a result, a portion of the first bottom electrode layer 19A neighboring a top portion of the opening 18 may be partially etched. Through the partial etch process, the upper gap 20U may have a sloped side wall, and the intermediate gap 20M and the lower gap 20L may have vertical side walls. The width of the upper gap 20U may be wider than the widths of the intermediate gap 20M and the lower gap 20L (D1>D2=D3), The width of the intermediate gap 20M and the width of the lower gap 20L may be the same (D2=D3).

As described above, a second bottom electrode layer 21A, which is described below, may be easily gap-filled by extending the width D1 of the upper gap 20U.

Figure 6D:
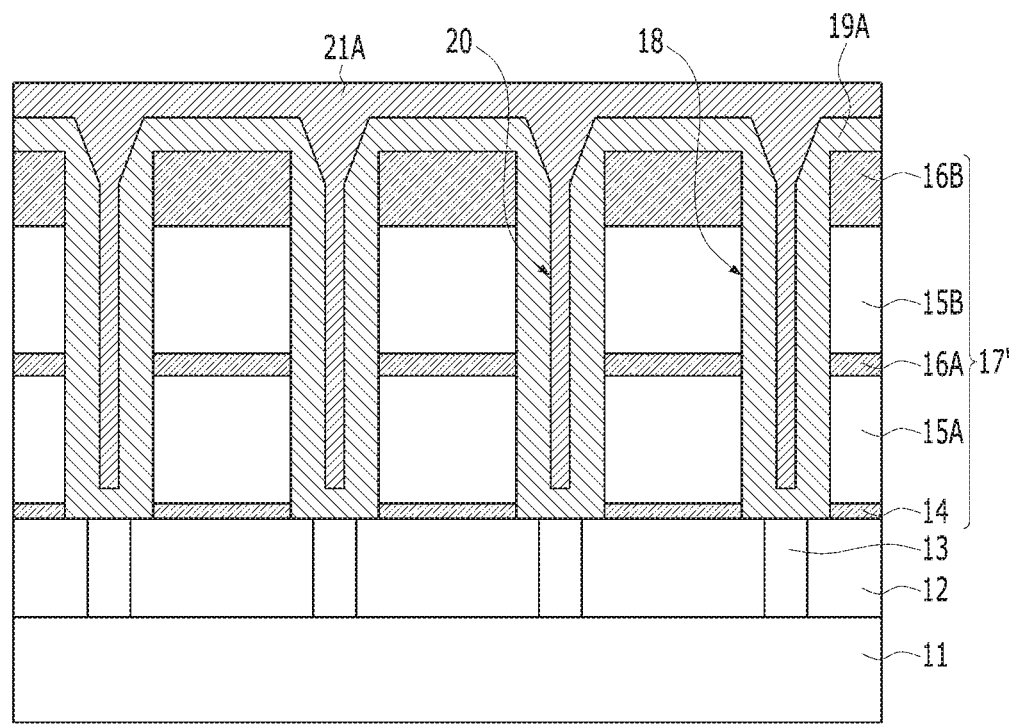

Referring to FIG. 6D, a second bottom electrode layer 21A may be formed. The second bottom electrode layer 21A may be formed over the first bottom electrode layer 19A. The second bottom electrode layer 21A may fill each gap 20. The second bottom electrode layer 21A may include a material that is conductive and which has an etch selectivity with respect to the second supporter layer 16B. The second bottom electrode layer 21A and the first bottom electrode layer 19A may be formed of different materials. The second bottom electrode layer 21A may include a silicon-containing material. The second bottom electrode layer 21A may include polysilicon having a good step coverage for filling the inside of the gap 20 substantially without any voids. Particularly, since the upper gap 20U has a wide width, it may be easier to gap-fill the upper gap 20U with the second bottom electrode layer 21A.

Figure 6E:
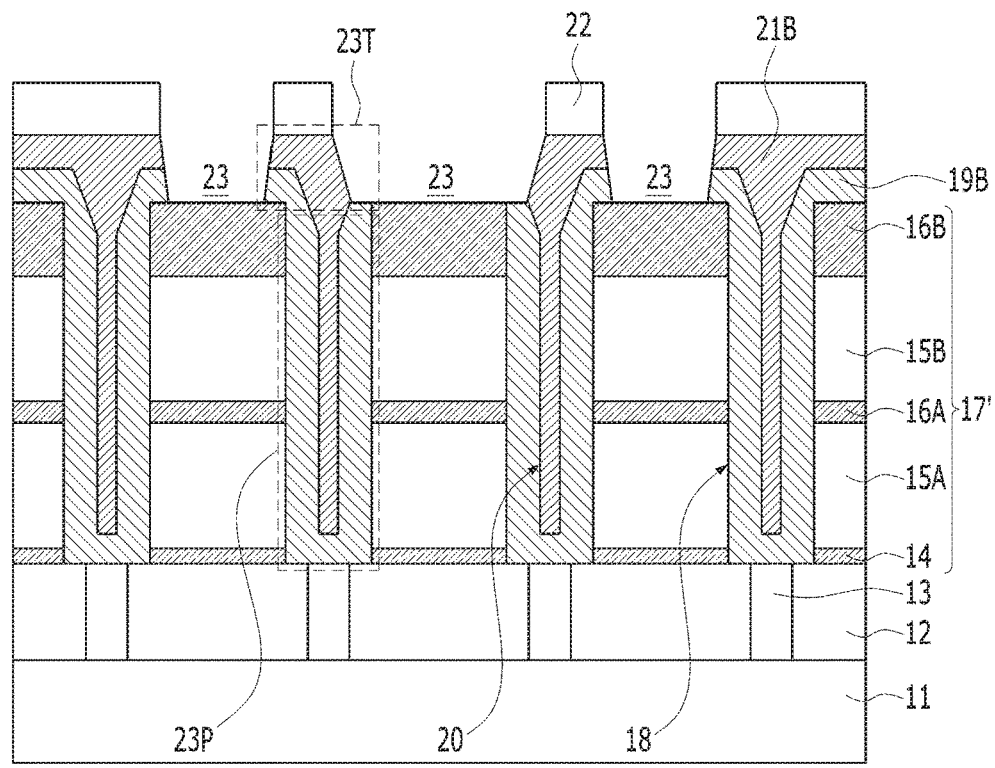

Referring to FIG. 6E, a supporter mask layer 22 may be formed. The supporter mask layer 22 may include a photoresist.

The second bottom electrode layer 21A and the first bottom electrode layer 19A may be etched by using the supporter mask layer 22. As a result, an electrode cutting portion 23 may be formed to expose a portion of the surface of the second supporter layer 163 that is between the openings 18. A side wall of the electrode cutting portion 23 may have a sloped profile. The first bottom electrode layer 19B and the second bottom electrode layer 21B may remain in the openings 18 and in the areas above and adjacent to the openings 18. A portion of the second supporter layer 163 may be exposed through the electrode cutting portion 23. The electrode cutting portion 23 may have the same array and shape as the supporter opening 105S of FIG. 1A.

The first bottom electrode layer 19B and the second bottom electrode layer 2B after the electrode cutting portion 23 is formed may be defined as a filler portion 23P and a barrier portion 23T, respectively. In other words, the filler portion 23P may be defined in the inside of each opening 18, and the barrier portion 23T which is extended upwardly from the filler portion 23P may be defined. The filler portion 23P may become a pillar-type bottom electrode after the subsequent process is performed. The barrier portion 23T may be used as an etch barrier while the second supporter layer 16B is etched during the subsequent process. The bottom surface of the electrode cutting portion 23 may have a depth that does not overlap with the filler portion 23P. In short, the depth of the electrode cutting portion 23 may be controlled in such a manner that the filler portion 23P is not damaged by the electrode cutting portion 23.

Figure 6F:
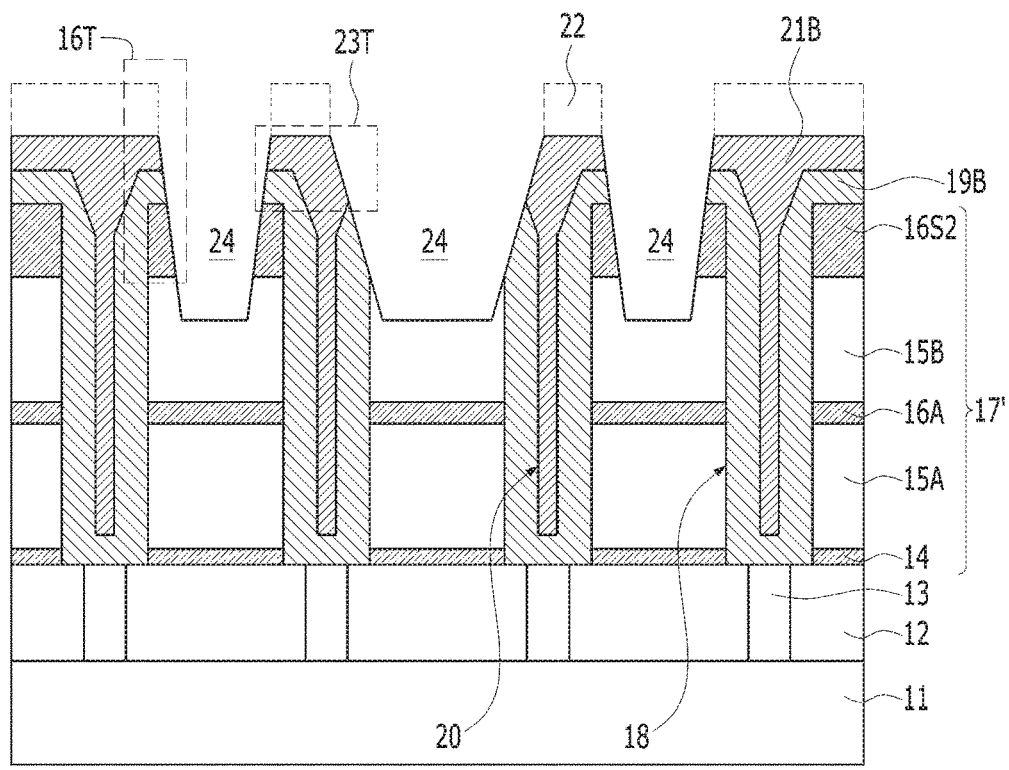

Referring to FIG. 6F, a second supporter 16S2 may be formed. The second supporter 16S2 may be formed by selectively etching the second supporter layer 16B exposed through the electrode cutting portion 23. As a result of etching the second supporter layer 16B, a second supporter opening 24 and the second supporter 16S2 may be formed.

The second supporter 16S2 may contact the first bottom electrode layer 19B. A portion of the surface of the second mold layer 15B may be exposed due to the second supporter 16S2. The surface of the second mold layer 15B may be over-etched. In other words, the second supporter opening 24 may be extended into the inside of the second mold layer 15B through the surface of the second mold layer 15B. The second supporter 16S2 may surround a portion of an outer side wall of the first bottom electrode layer 19B. The second supporter 16S2, which is described above, can protect a bottom electrode having a high aspect ratio from collapsing during the subsequent process of removing the second mold layer 15B and the first mold layer 15A.

Also, while the etch process for forming the second supporter 16S2 is being performed, the supporter mask layer 22 may be consumed. Although the supporter mask layer 22 is consumed, since the second bottom electrode layer 21B functions as an etch barrier, it is possible to prevent the second supporter 16S2 from being damaged (see reference numeral '16T').

Figure 6G:
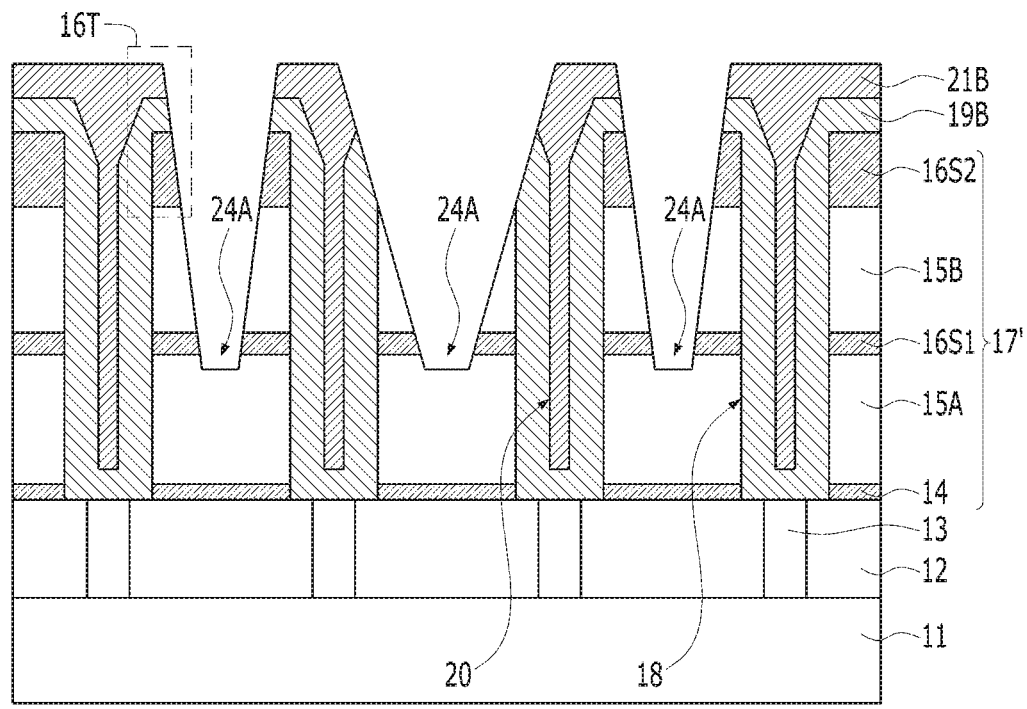

Referring to FIG. 6G, a first supporter 16S1 may be formed. The first supporter 16S1 may be formed by selectively etching the first supporter layer 16A exposed through the second supporter opening 24. As a result of etching the first supporter layer 16A, a first supporter opening 24A and the first supporter 16S1 may be formed. Before the first supporter layer 16A is etched, the second mold layer 15B may be etched by using the second bottom electrode layer 21B as an etch barrier.

The first supporter 16S1 may contact the first bottom electrode layer 19B. A portion of the surface of the first mold layer 15A may be exposed due to the first supporter 16S1. The surface of the first mold layer 15A may be over-etched. In other words, the first supporter opening 24A may be extended into the inside of the first mold layer 15A through the surface of the first mold layer 15A. The first supporter 16S1 may surround a portion of an outer side wall of the first bottom electrode layer 19B. The first supporter 16S1, which is described above, can protect a bottom electrode having a high aspect ratio from collapsing during the subsequent process of removing the second mold layer 15B and the first mold layer 15A.

Also, while the etch process for forming the first supporter 16S1 is being performed, since the second bottom electrode layer 21B functions as an etch barrier, it is possible to prevent the second supporter 16S2 from being damaged (see reference numeral '16T').

Figure 6H:
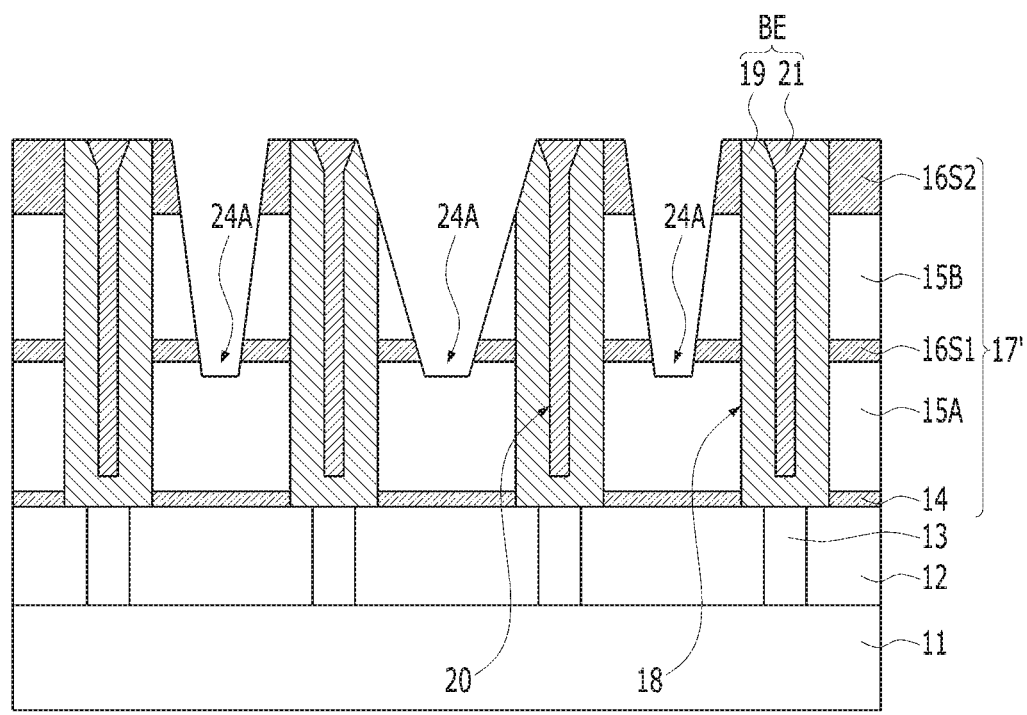

Referring to FIG. 6H, bottom electrodes BE may be formed inside of the openings 18. Each of the bottom electrodes BE include a first bottom electrode 19 and a second bottom electrode 21. The first bottom electrode 19 may be formed by selectively removing the first bottom electrode layer 19B. Also, the second bottom electrode may be formed by selectively removing the second bottom electrode layer 21B. In an embodiment of the present invention, the first bottom electrode 19 may include a titanium nitride, and the second bottom electrode 21 may include polysilicon. The bottom electrode BE may have a pillar shape of a titanium nitride and polysilicon.

To form the bottom electrode BE, a selective removing process may be performed onto the first bottom electrode layer 19B and the second bottom electrode layer 21B. The selective removing process may be a Chemical Mechanical Polishing (CMP) process or an etch-back process. For example, a CMP process may be performed onto the first bottom electrode layer 19B and the second bottom electrode layer 21B until the surface of the second supporter 16S2 is exposed. The first bottom electrode 19 may have a cylindrical shape with the gap 20 defined therein, and the second bottom electrode 21 may have a pillar shape. The second bottom electrode 21 may be able to fill the inside of the gap 20. The upper surfaces of the first bottom electrode 19, the second bottom electrode 21, and the second supporter 16S2 may be at the same level.

The bottom electrode BE may be electrically connected to the contact plug 13.

The bottom electrode BE may have a high aspect ratio. The bottom electrode BE may have the same aspect ratio as the opening 18. For example, in an embodiment, the bottom electrode BE may have a high aspect ratio of approximately 10:1 or higher.

Figure 6I:
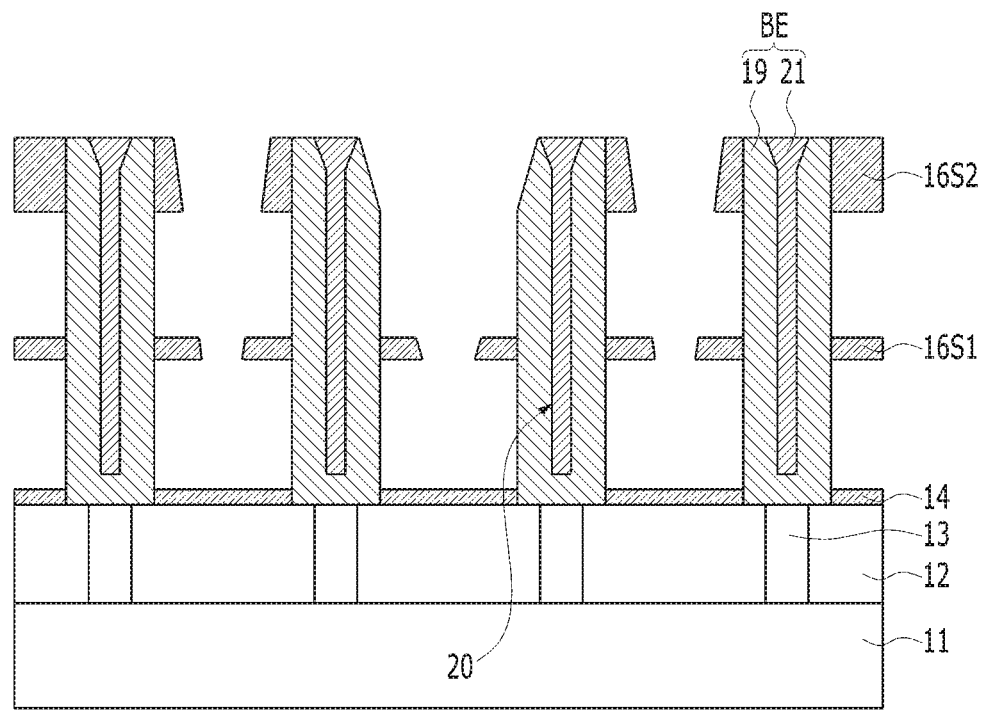

Referring to FIG. 6I, the first mold layer 15A and the second mold layer 15B may be removed. For example, the first mold layer 15A and the second mold layer 15B may be removed through a wet dip-out process.

As the first mold layer 15A and the second mold layer 15B are removed, all the outer wall of the bottom electrode BE may be exposed. In other words, all the outer wall of the first bottom electrode 19 may be exposed. The upper portion of the bottom electrode BE may be supported by the second supporter 16S2 and the intermediate portion of the bottom electrode BE may be supported by the first supporter 16S1. The etch stop layer 14 may surround and support the bottom of the bottom electrode BE.

Figure 6J:
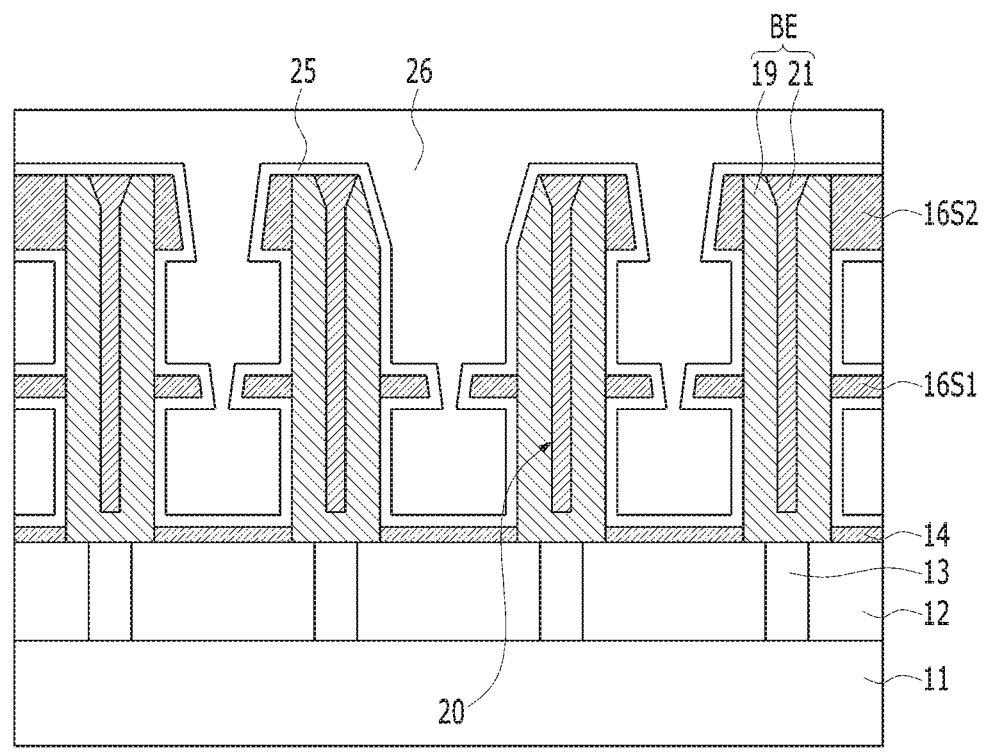

Referring to FIG. 6J, a dielectric layer 25 may then be formed over the bottom electrode BE and the first and second supporter layers 16A and 16B and the etch stop layer 14.

After the formation of the dielectric layer 25, a top electrode 26 may be formed over the dielectric layer 25.

Figure 6K:
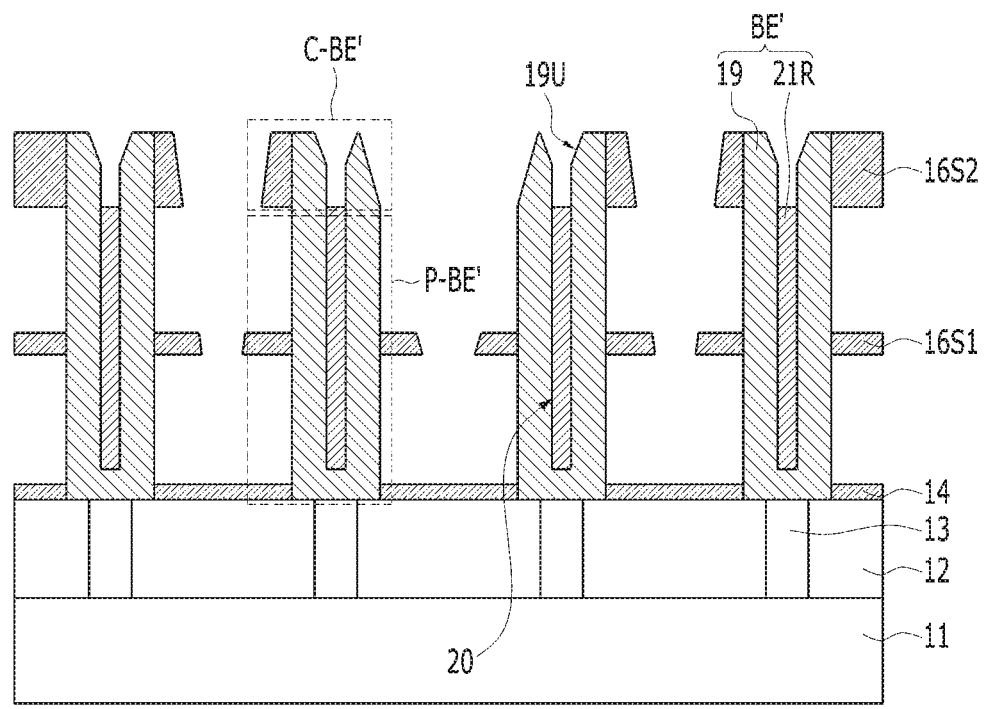
FIGS. 6K and 6L are cross-sectional views illustrating an example of the method for fabricating the semiconductor device shown in FIG. 5B.
Figure 6L:
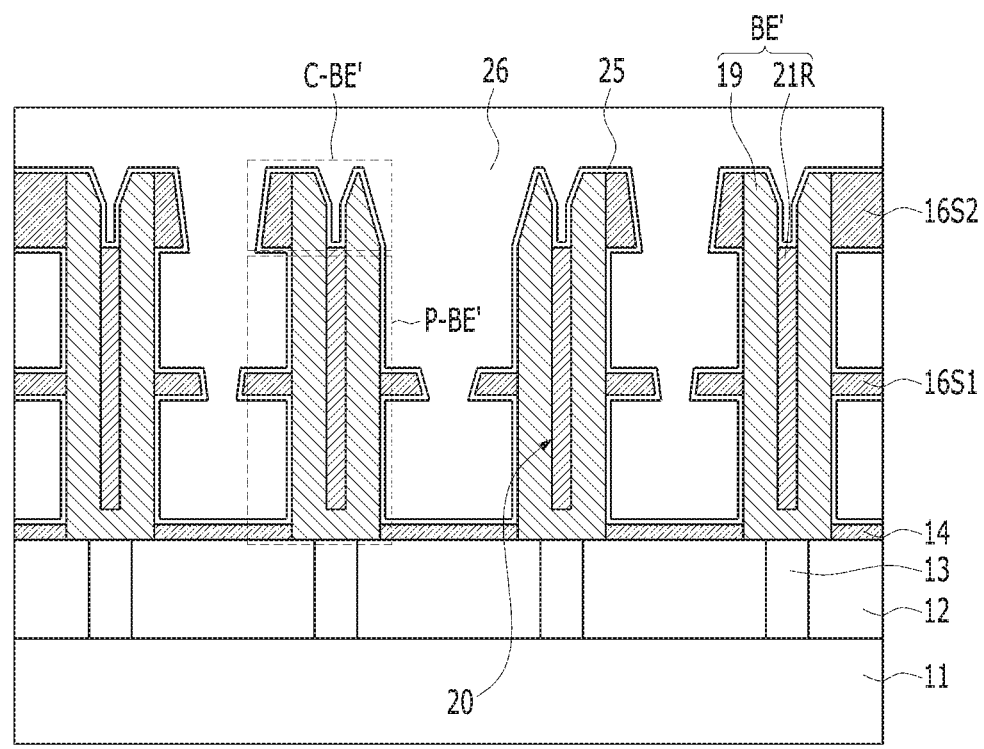

FIGS. 6K and 6L are cross-sectional views illustrating an example of a method for fabricating the semiconductor device 100M' shown in FIG. 5B.

First, through the method described with reference to FIGS. 6A to 6I, the first mold layer 15A and the second mold layer 15B may be removed after the bottom electrode BE, the first supporter 16S1, and the second supporter 16S2 are formed.

Subsequently, referring to FIG. 6K, the second bottom electrode 21 may be selectively recessed. The second bottom electrode 21 may be selectively recessed through an etch-back process or a wet etch process. The second bottom electrode 21 may be recessed through a blanket etch process without using a mask. The recess amount of the second bottom electrode 21 may be the same as the height of the second supporter 16S2. According to another embodiment of the present invention, the second bottom electrode 21 may be recessed deeper than the bottom surface of the second supporter 16S2. The recess of the second bottom electrode 21 may be controlled to a depth at which the first bottom electrode 19 may be protected from collapsing. The recess amount of the second bottom electrode 21 may be controlled in such a manner that the recessed portion of the second bottom electrode 21 may be readily gap-filled with the dielectric layer 25 and the top electrode 26 in the subsequent process.

The recessed second bottom electrode 21R may have a surface lower than the top surface of the first bottom electrode 19. The upper surface of the recessed second bottom electrode 21R and the bottom surface of the supporter 16S may be at the same level. In other words, the recessed second bottom electrode 21R may not overlap with the second supporter 16S2. Due to the recessed second bottom electrode 21R, the inner wall 19U of the upper portion of the first bottom electrode 19 may be exposed.

The first bottom electrode 19 and the recessed second bottom electrode 21R may form a bottom electrode BE' of a hybrid structure. As the inner wall 19U of the upper portion of the first bottom electrode 19 is exposed, the surface area of the bottom electrode BE' may be increased. Since the surface area of the bottom electrode BE' may be increased, capacitance may be increased.

As described above, the recessed second bottom electrode 21R and the first bottom electrode 19 may form a pillar-type bottom electrode P-BE'. The upper portion of the first bottom electrode 19 may become a cylindrical bottom electrode C-BE'. The cylindrical bottom electrode C-BE' may be disposed over the pillar-type bottom electrode P-BE'. The upper portion of the first bottom electrode 19 may correspond to the cylinder head 106H shown in FIG. 1C.

Subsequently, referring to FIG. 6L, the dielectric layer 25 and the top electrode 26 may be formed sequentially. The dielectric layer 25 may then be formed over the recessed second bottom electrode 21R, the first bottom electrode 19, and the first and second supporters 16S1 and 16S2. A portion of the dielectric layer 25 may cover the etch stop layer 14. Another portion of the dielectric layer 25 may cover the upper portion of the first bottom electrode 19.

After the dielectric layer 25 is formed, the top electrode 26 may be formed over the dielectric layer 25 and may fill the space between the neighboring bottom electrodes BE. A portion of the top electrode 26 may fill the upper portion of the recessed second bottom electrode 21R. Therefore, a portion of the top electrode 26 may be able to cover the upper portion of the first bottom electrode 19.

FIGS. 7A to 7E are cross-sectional views illustrating a second example of a method for fabricating the semiconductor device in accordance with an embodiment of the present invention.

First, through the process described with reference to FIGS. 6A to 6C, the first bottom electrode layer 19A may be formed over the second supporter layer 16B along each opening 18. The first bottom electrode layer 19A may be exposed to a partial etch process. As a result of the partial etch process, the width of the upper portion of each gap 20 may be expanded.

Figure 7A:
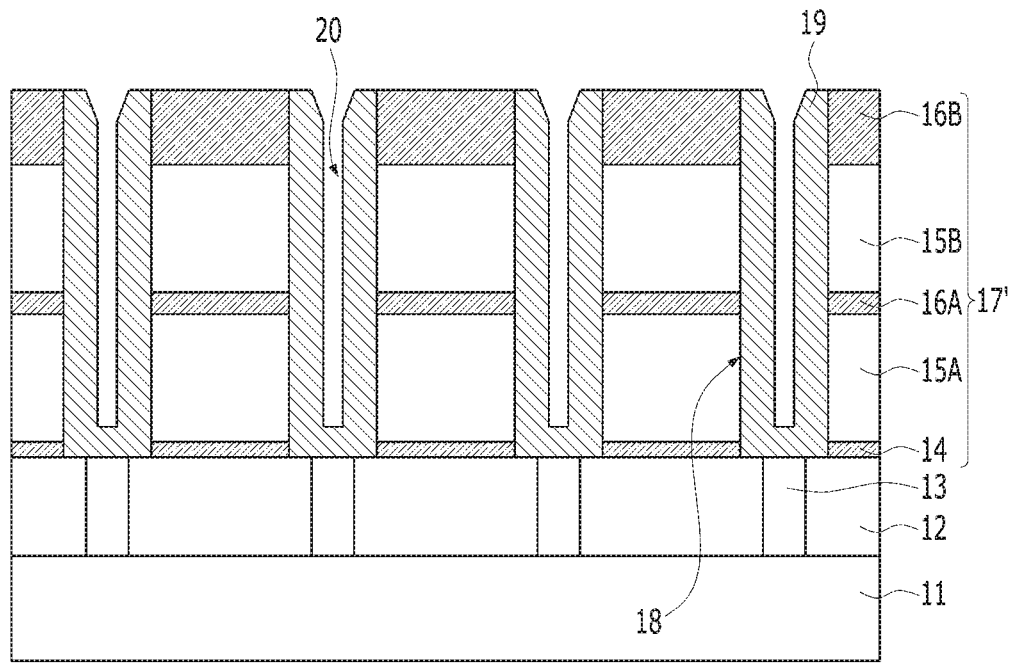
FIGS. 7A to 7E are cross-sectional views illustrating a second example of the method for fabricating the semiconductor device in accordance with an embodiment of the present invention.

Subsequently, referring to FIG. 7A, a first bottom electrode 19 may be formed in the inside of each opening 18. The first bottom electrode 19 may be formed by selectively removing the first bottom electrode layer 19A, which is called a selective removing process. The first bottom electrode 19 may have a cylindrical shape. In order to form the first bottom electrode 19, the selective removing process may be performed onto the first bottom electrode layer 19A. The selective removing process may be a Chemical Mechanical Polishing (CMP) process or an etch-back process. For example, a CMP process may be performed onto the first bottom electrode layer 19A until the surface of the second supporter layer 16B is exposed.

The first bottom electrode 19 may be electrically connected to the contact plug 13. A gap 20 may be defined in the inside of the first bottom electrode 19.

Figure 7B:
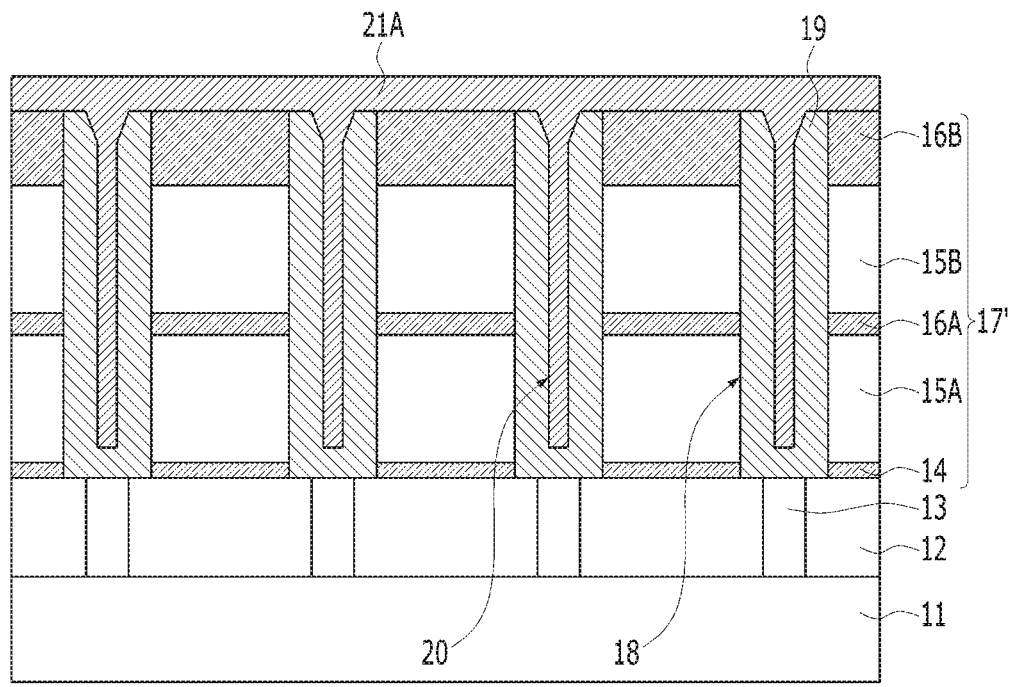

Referring to FIG. 7B, a second bottom electrode layer 21A may be formed. The second bottom electrode layer 21A may be formed over the first bottom electrode 19. The second bottom electrode layer 21A may fill each gap 20. The second bottom electrode layer 21A may include a conductive material. The second bottom electrode layer 21A may include a material having an etch selectivity with respect to the second supporter layer 16B. The second bottom electrode layer 21A and the first bottom electrode 19 may be formed of different materials. The second bottom electrode layer 21A may include a silicon-containing material. The second bottom electrode layer 21A may include polysilicon having a good step coverage for filling the inside of the gap 20 substantially without any voids.

Figure 7C:
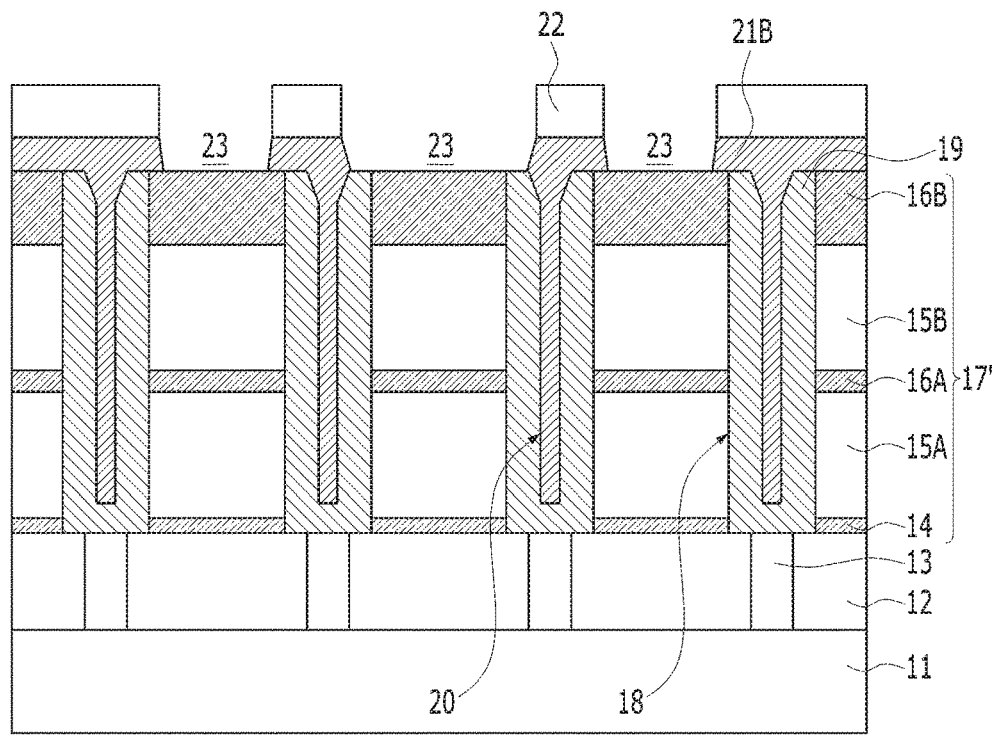

Referring to FIG. 7C, a supporter mask layer 22 may be formed. The supporter mask layer 22 may include a photoresist.

The second bottom electrode layer 21A may be etched by using the supporter mask layer 22. As a result, an electrode cutting portion 23 may be formed to expose a portion of the surface of the second supporter layer 16B. A side wall of the electrode cutting portion 23 may have a sloped profile. The second bottom electrode layer may remain as shown by reference numerals and '21B'.

Figure 7D:
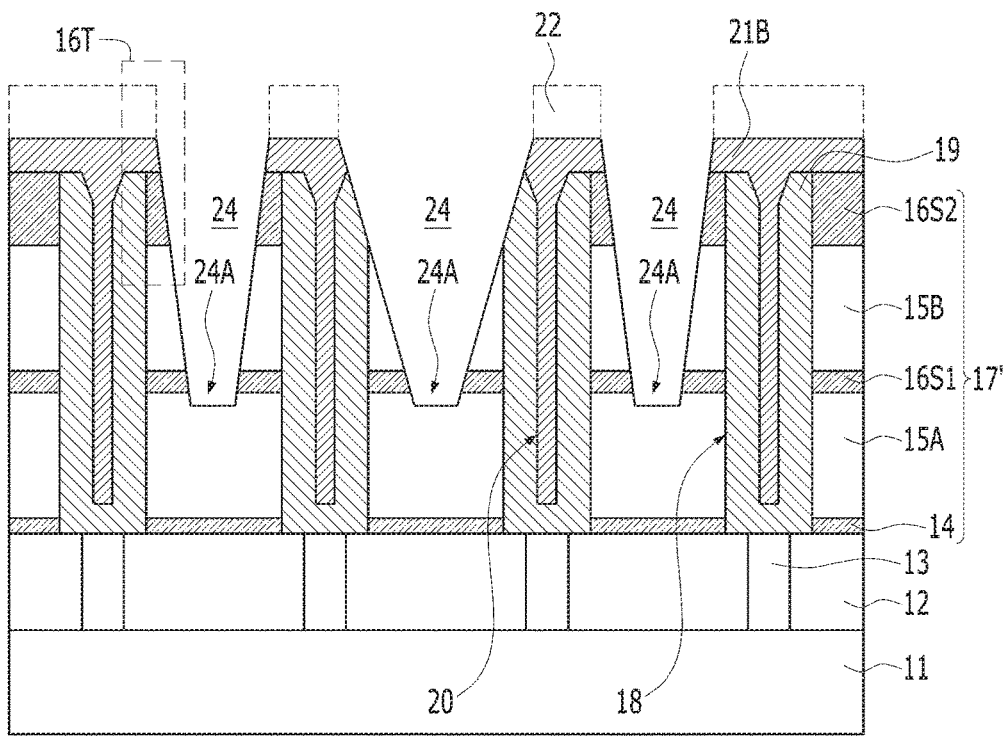

Referring to FIG. 7D, a second supporter 16S2 and a first supporter 16S1 may be formed. The second supporter 16S2 may be formed by selectively etching the second supporter layer 163 exposed through the electrode cutting portion 23. As a result of etching the second supporter layer 16B, a supporter opening 24 and the second supporter 16S2 may be formed.

The supporter 16S may contact the first bottom electrode 19. A portion of the surface of the second mold layer 15B may be exposed due to the second supporter 16S2. The surface of the second mold layer 15B may be over-etched. The second supporter 16S2 may surround a portion of an outer side wall of the first bottom electrode 19. The second supporter 16S2, which is described above, can protect a bottom electrode having a high aspect ratio from collapsing during the subsequent process of removing the first mold layer 15A and the second mold layer 153.

Also, while the etch process for forming the second supporter 16S2 is being performed, the supporter mask layer 22 may be consumed. Although the supporter mask layer 22 is consumed, since the second bottom electrode layer 21B is functions as an etch barrier, it is possible to prevent the second supporter 16S2 from being damaged (see reference numeral '16T').

Subsequently, a first supporter 16S1 may be formed by sequentially etching the second mold layer 15B and the first supporter layer 16A exposed through the second supporter opening 24. As a result of etching the second mold layer 153 and the first supporter layer 16A, a first supporter opening 24A and the first supporter 16S1 may be formed.

The first supporter 16S1 may contact the first bottom electrode 19. A portion of the surface of the first mold layer 15A may be exposed due to the first supporter 16S1. The surface of the first mold layer 15A may be over-etched. The first supporter 16S1 may surround a portion of an outer side wall of the first bottom electrode 19. The first supporter 16S1, which is described above, can protect a bottom electrode having a high aspect ratio from collapsing during the subsequent process of removing the second mold layer 153 and the first mold layer 15A.

Also, while the etch process for forming the first supporter 16S1 is being performed, since the second bottom electrode layer 2B functions as an etch barrier, it is possible to prevent the second supporter 16S2 from being damaged (see reference numeral '16T').

Figure 7E:
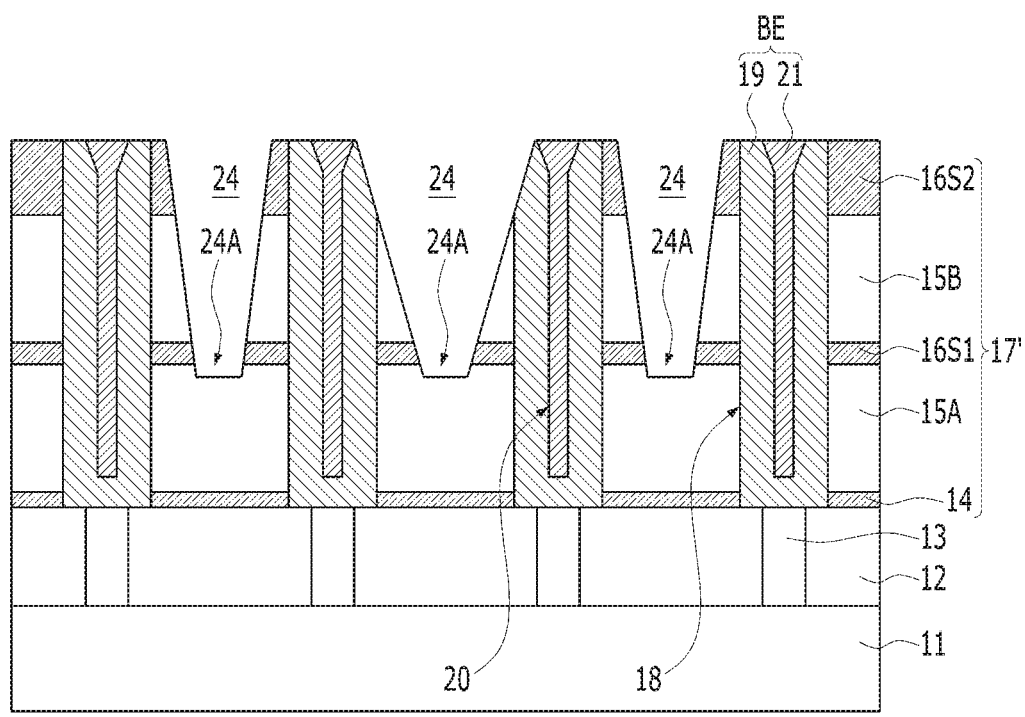

Referring to FIG. 7E, a second bottom electrode 21 may be formed in the inside of each opening 18. The second bottom electrode 21 may be disposed in the inside of each gap 20 in the inside of the first bottom electrode 19. The second bottom electrode 21 may have a pillar shape. The second bottom electrode 21 may be formed by selectively removing the second bottom electrode layer 2B. To form the second bottom electrode 21, a selective removing process may be performed onto the second bottom electrode layer 2B. The selective removing process may be a Chemical Mechanical Polishing (CMP) process or an etch-back process. For example, a CMP process may be performed onto the second bottom electrode layer 21B until the surface of the second supporter 16S2 is exposed.

As described above, a bottom electrode BE formed of the first bottom electrode 19 and the second bottom electrode 21 may be formed by forming the second bottom electrode 21. The bottom electrode BE may have a high aspect ratio. The bottom electrode BE may have the same aspect ratio as the opening 18. For example, in an embodiment, the bottom electrode BE may have a high aspect ratio of approximately 10:1 or higher.

Subsequently, as illustrated in FIGS. 61 and 6G, the process of removing the first mold layer 15A and the second mold layer 15B may be performed. Subsequently, a dielectric layer 25 and a top electrode 26 may be formed.

According to another embodiment of the present invention, the semiconductor device 100M' shown in FIG. 5B may be also formed in the method described with reference to FIGS. 7A to 7E and FIGS. 6K and 6L.

FIGS. 8A to 8D are cross-sectional views illustrating a third example of a method for fabricating the semiconductor device in accordance with an embodiment of the present invention.

First, through the method described with reference to FIGS. 6A to 6F, the second supporter 16S2 and a second supporter opening 24 may be formed.

Figure 8A:
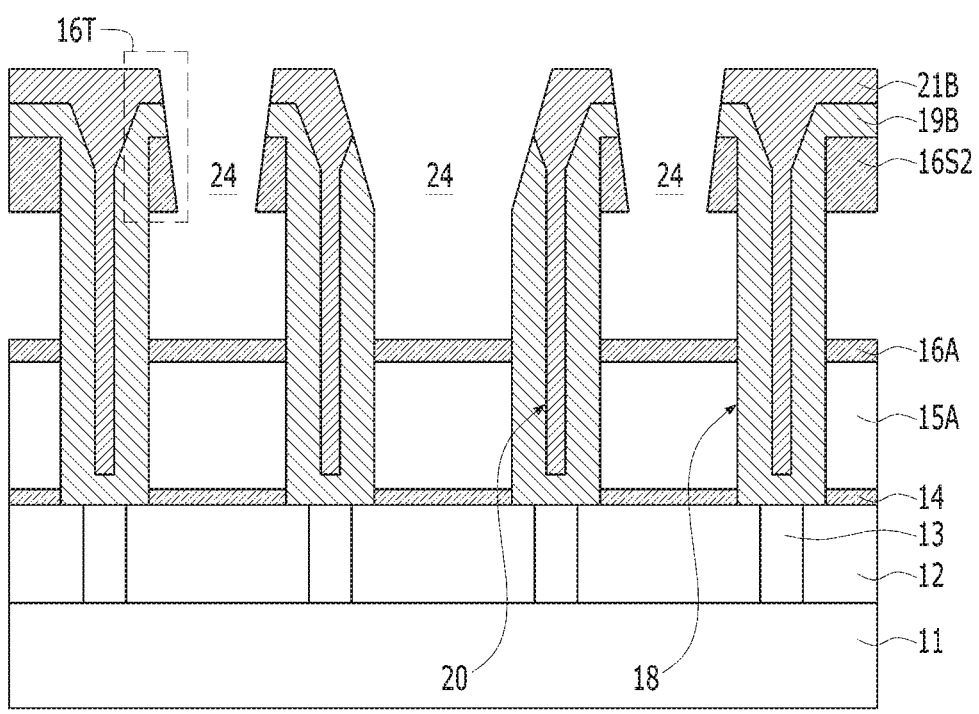
FIGS. 8A to 8D are cross-sectional views illustrating a third example of the method for fabricating the semiconductor device in accordance with an embodiment of the present invention.

Subsequently, referring to FIG. 8A, the second mold layer 15B may be removed. For example, the second mold layer 15B may be removed through a wet dip-out process. A wet chemical for removing the second mold layer 15B may be supplied through the supporter opening 24.

As described above, since the second mold layer 15B is removed, the etch burden of the first supporter layer 16A may be reduced.

Figure 8B:
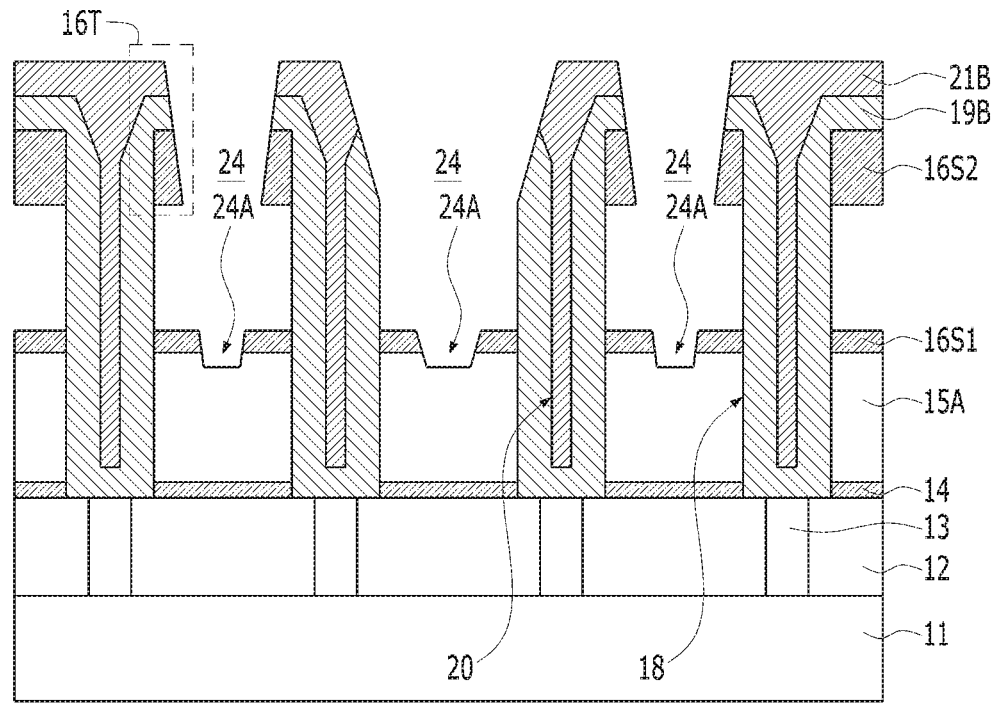

Referring to FIG. 8B, a first supporter 16S1 may be formed. The first supporter 16S1 may be formed by selectively etching the first supporter layer 16A exposed through the second supporter opening 24. As a result of etching the first supporter layer 16A, a first supporter opening 24A and the second supporter 16S2 may be formed.

The first supporter 16S1 may contact the first bottom electrode layer 19B. A portion of the surface of the first mold layer 15A may be exposed due to the first supporter 16S1. The surface of the first mold layer 15A may be over-etched. In other words, the first supporter opening 24A may be extended into the inside of the first mold layer 15A through the surface of the first mold layer 15A. The first supporter 16S1 may surround a portion of an outer side wall of the first bottom electrode layer 19B. The first supporter 16S1, which is described above, can protect a bottom electrode having a high aspect ratio from collapsing during the subsequent process of removing the first mold layer 15A.

Also, while the etch process for forming the first supporter 16S1 is being performed, since the second bottom electrode layer 21B functions as an etch barrier, it is possible to prevent the second supporter 16S2 from being damaged (see reference numeral '16T').

Figure 8C:
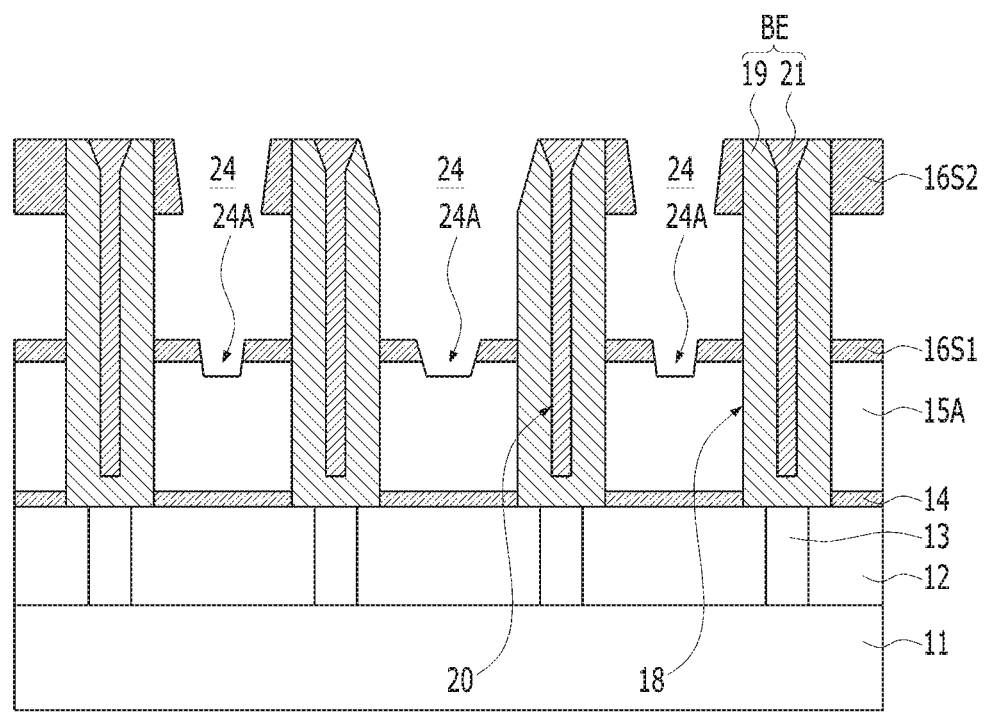

Referring to FIG. 8C, a bottom electrode BE may be formed in the inside of each opening 18. The bottom electrode BE may include a first bottom electrode 19 and a second bottom electrode 21. The first bottom electrode 19 may be formed by selectively removing the first bottom electrode layer 19B. Also, the second bottom electrode may be formed by selectively removing the second bottom electrode layer 21B. In an embodiment of the present invention, the first bottom electrode 19 may include a titanium nitride, and the second bottom electrode 21 may include polysilicon, i.e., the bottom electrode BE may have a pillar shape of a titanium nitride and polysilicon.

To form the bottom electrode BE, a selective removing process may be performed onto the first bottom electrode layer 19B and the second bottom electrode layer 21B. The selective removing process may be a Chemical Mechanical Polishing (CMP) process or an etch-back process. For example, a CMP process may be performed onto the first bottom electrode layer 19B and the second bottom electrode layer 21B until the surface of the second supporter 16S2 is exposed. The first bottom electrode 19 may have a cylindrical shape, and the second bottom electrode 21 may have a pillar shape. The second bottom electrode 21 may be able to fill the inside of the gap 20. The upper surfaces of the first bottom electrode 19, the second bottom electrode 21, and the second supporter 16S2 may be at the same level.

Figure 8D:
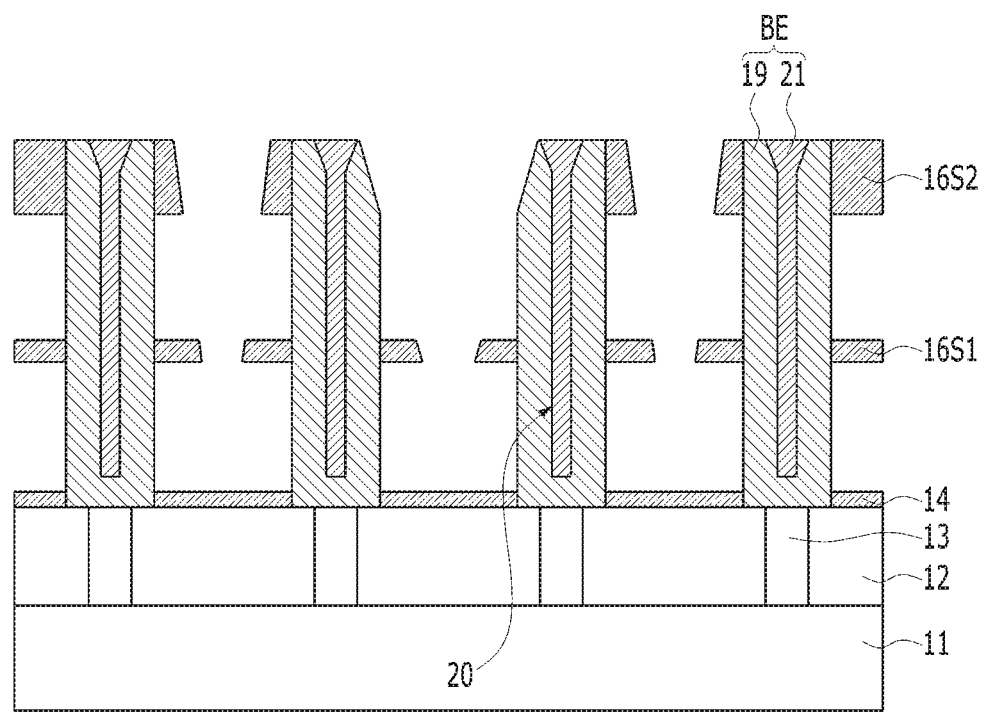

Referring to FIG. 8D, the first mold layer 15A may be removed. For example, the first mold layer 15A may be removed through a wet dip-out process.

As the first mold layer is removed, all the outer wall of the bottom electrode BE may be exposed. In other words, all the outer wall of the first bottom electrode 19 may be exposed. The upper portion of the bottom electrode BE may be supported by the second supporter 16S2. The intermediate portion of the bottom electrode BE may be supported by the first supporter 16S1. The etch stop layer 14 may surround and support the bottom of the bottom electrode BE.

Subsequently, as illustrated in FIG. 63, a dielectric layer 25 and a top electrode 26 may be formed.

According to another embodiment of the present invention, the semiconductor device 100M' shown in FIG. 5B may be also formed in the method described with reference to FIGS. 8A to 8D and FIGS. 6K and 6L.

Figure 9A:
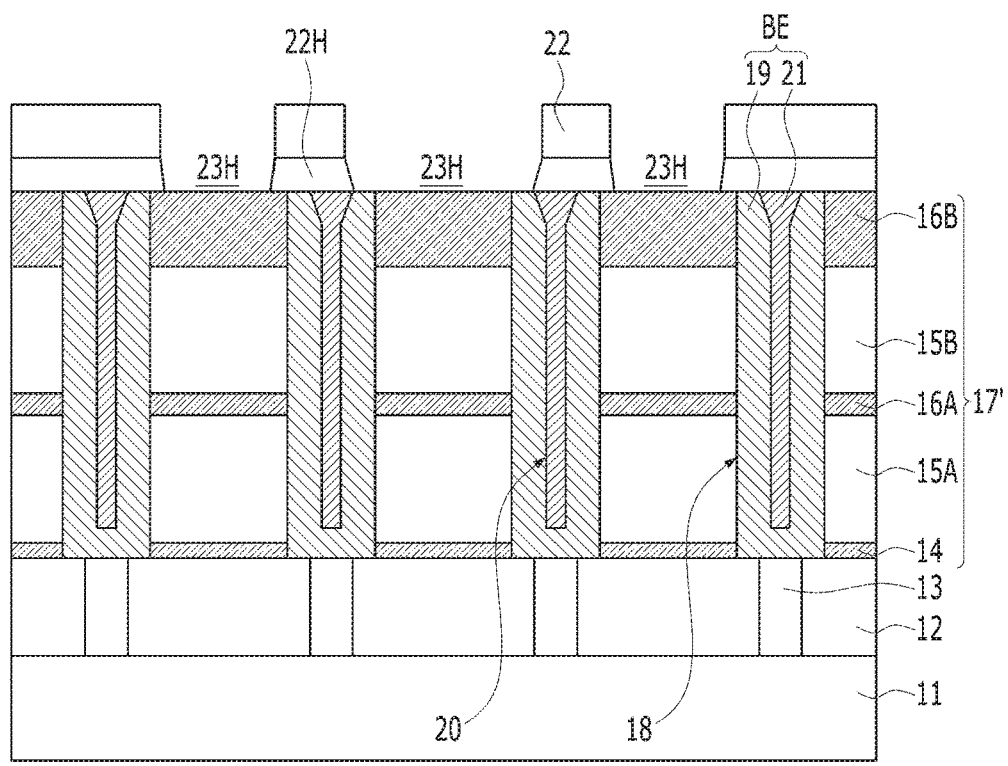
FIGS. 9A to 9C are cross-sectional views illustrating a fourth example of the method for fabricating the semiconductor device in accordance with an embodiment of the present invention.
Figure 9B:
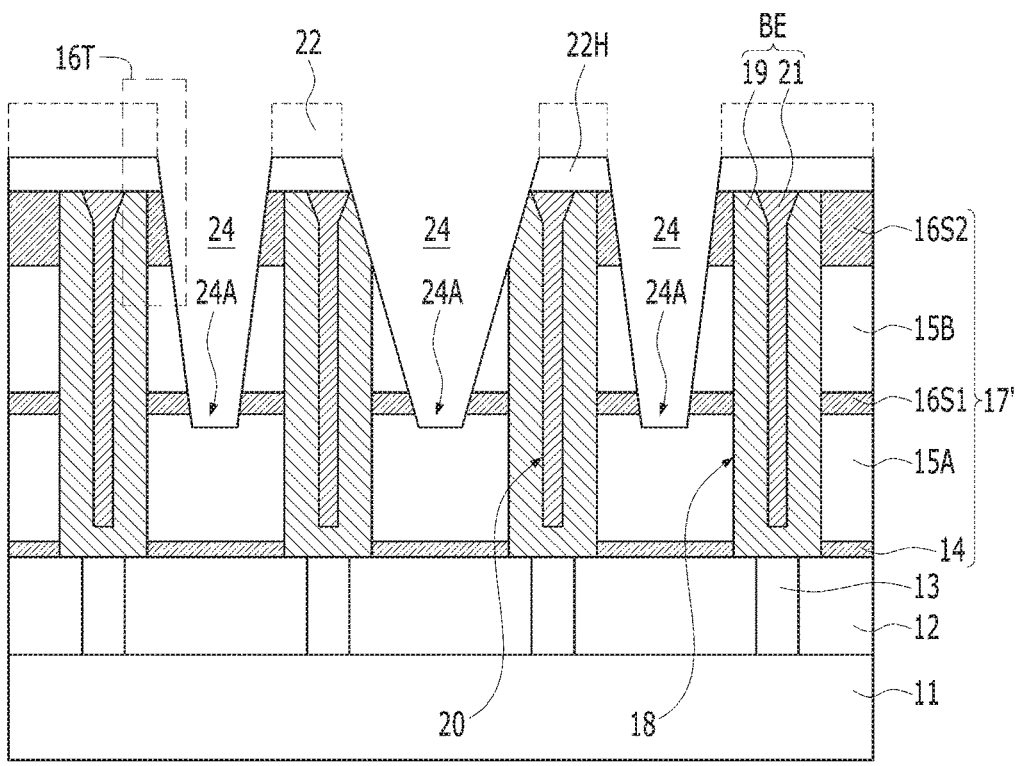
Figure 9C:
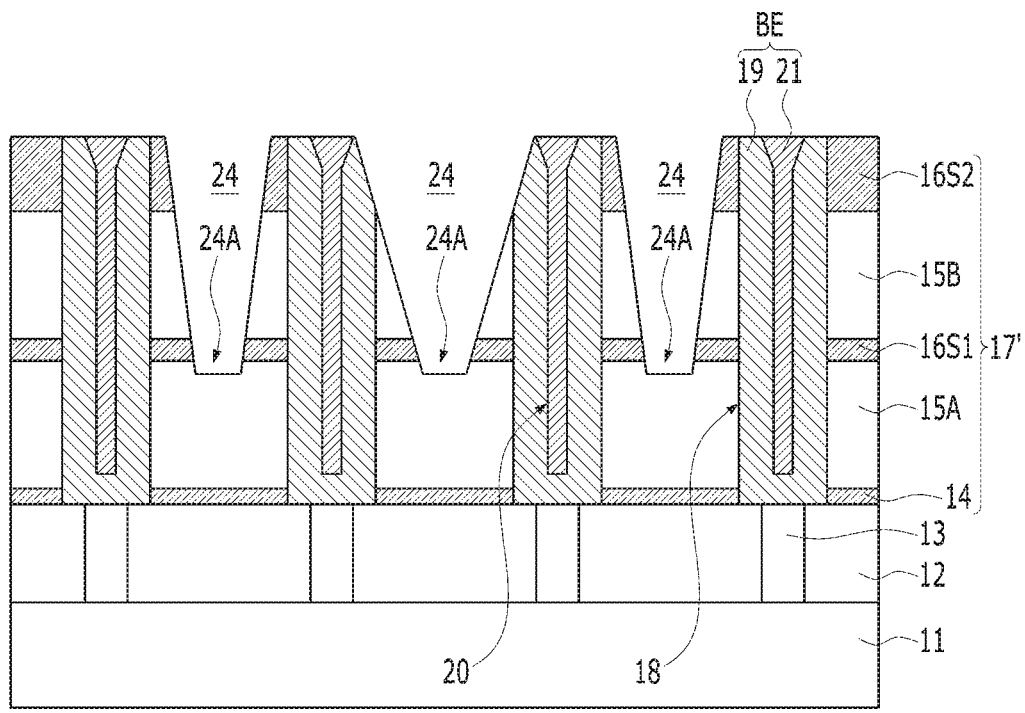

FIGS. 9A to 9C are cross-sectional views illustrating a fourth example of a method for fabricating the semiconductor device in accordance with an embodiment of the present invention.

First, through the method described with reference to FIGS. 6A to 6D, the first bottom electrode layer 19A and the second bottom electrode layer 21A may be sequentially formed.

Subsequently, referring to FIG. 9A, a plurality of bottom electrodes BE may be formed. The bottom electrodes BE may be disposed in the inside of the openings 18, respectively. Each bottom electrode BE may include the first bottom electrode 19 and the second bottom electrode 21. The first bottom electrode 19 may be formed through a selective removing process of selectively removing the first bottom electrode layer 19A. The second bottom electrode 21 may be formed through a selective removing process of selectively removing the second bottom electrode layer 21A. In an embodiment of the present invention, the first bottom electrode 19 may include a titanium nitride, and the second bottom electrode 21 may include polysilicon, i.e., the bottom electrode BE may have a pillar shape including a titanium nitride and polysilicon.

To form the bottom electrode BE, a selective removing process may be performed onto the first bottom electrode layer 19A and the second bottom electrode layer 21A. The selective removing process may be a Chemical Mechanical Polishing (CMP) process or an etch-back process. For example, a CMP process may be performed onto the first bottom electrode layer 19A and the second bottom electrode layer 21A until the surface of the second supporter layer 16B is exposed. According to another embodiment of the present invention, an etch-back process may be performed onto the first bottom electrode layer 19A and the second bottom electrode layer 21A until the surface of the second supporter layer 16B is exposed. During the etch-back process, the selectivities of the first bottom electrode layer 19A and the second bottom electrode layer 21A may be different from each other. The first bottom electrode 19 may have a cylindrical shape with the gap 20 defined therein, and the second bottom electrode 21 may be able to fill the inside of the gap 20. In this respect, the bottom electrode BE may have a pillar shape. The upper surfaces of the first bottom electrode 19, the second bottom electrode 21, and the second supporter layer 16B may be at the same level.

The bottom electrode BE may be electrically connected to the contact plug 13.

Subsequently, a hard mask layer 22H may be formed over the bottom electrode BE and the second supporter layer 16B. The hard mask layer 22H may include amorphous carbon.

A supporter mask layer 22 may be formed over the hard mask layer 22H. The supporter mask layer 22 may include a photoresist.

The hard mask layer 22H may be etched by using the supporter mask layer 22. As a result, a cutting portion 23H may be formed to expose a portion of the surface of the supporter layer 16. A side wall of the cutting portion 23H may have a sloped profile. After the cutting portion 23H is formed, the remaining hard mask layer 22H can protect the second bottom electrode 21 of the bottom electrode BE.

Referring to FIG. 9B, a second supporter 16S2 may be formed. The second supporter 16S2 may be formed by selectively etching the second supporter layer 16B exposed through the cutting portion 23H. As a result of etching the second supporter layer 16B, a supporter opening 24 and the second supporter 16S2 may be formed.

The second supporter 16S2 may contact the first bottom electrode 19. A portion of the surface of the second mold layer 15B may be exposed due to the second supporter 16S2. The surface of the second mold layer 15B may be overetched. In other words, the second supporter opening 24 may be extended into the inside of the mold layer 15 through the surface of the mold layer 15. The second supporter 16S2 may surround a portion of an outer side wall of the first bottom electrode 19. The second supporter 16S2, which is described above, can protect a bottom electrode having a high aspect ratio from collapsing during the subsequent process of removing the second mold layer 15B and the first mold layer 15A.

Also, while the etch process for forming the second supporter 16S2 is being performed, the supporter mask layer 22 may be consumed. Although the supporter mask layer 22 is consumed, since the hard mask layer 22H functions as an etch barrier, it is possible to prevent the second supporter 16S2, the first bottom electrode 19, and the second bottom electrode 21 from being damaged.

Subsequently, a first supporter 16S1 may be formed. The first supporter 16S1 may be formed by sequentially etching the first supporter layer 16A exposed through the second supporter opening 24. As a result of etching the first supporter layer 16A, a first supporter opening 24A and the second supporter 16S2 may be formed. Before the first supporter layer 16A is etched, the second mold layer 15B may be etched by using the hard mask layer 22H as an etch barrier.

The first supporter 16S1 may contact the first bottom electrode 19. A portion of the surface of the first mold layer 15A may be exposed due to the first supporter 16S1. The surface of the first mold layer 15A may be over-etched. In other words, the first supporter opening 24A may be extended into the inside of the first mold layer 15A through the surface of the first mold layer 15A. The first supporter 16S1 may surround a portion of an outer side wall of the first bottom electrode 19. The first supporter 16S1, which is described above, can protect a bottom electrode having a high aspect ratio from collapsing during the subsequent process of removing the second mold layer 15B and the first mold layer 15A.

Also, while the etch process for forming the first supporter 16S1 is being performed, since the hard mask layer 22H functions as an etch barrier, it is possible to prevent the second supporter 16S2 from being damaged (see reference numeral '16T').

Referring to FIG. 9C, the hard mask layer 22H may be removed.

Subsequently, as illustrated in FIGS. 61 and 63, the first mold layer 15A and the second mold layer 15B may be removed. Before the first mold layer 15A and the second mold layer 15B are removed, the hard mask layer 22H may be removed. Subsequently, a dielectric layer 25 and a top electrode 26 may be formed.

According to another embodiment of the present invention, the semiconductor device 100M' shown in FIG. 5B may be also formed in the method described with reference to FIGS. 9A to 9C and FIGS. 6K and 6L.

Figure 10A:
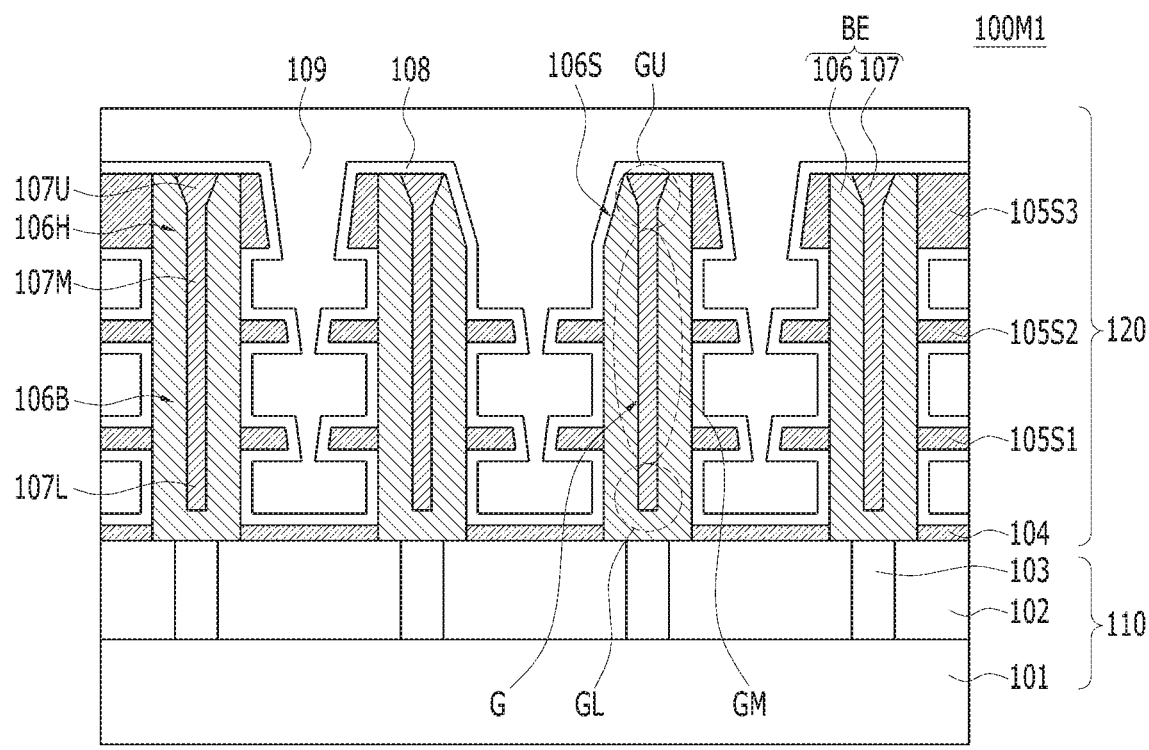
FIG. 10A is a cross-sectional view illustrating a semiconductor device in accordance with an embodiment of the present invention.

FIG. 10A is a cross-sectional view illustrating a semiconductor device 100M1 in accordance with an embodiment of the present invention. In the semiconductor device 100M1 of FIG. 10A, other constituent elements, except mufti-level supporters 105S1, 105S2 and 105S3, may be the same as the semiconductor device 100M shown in FIG. 5A.

Each of the multi-level supporters 105S1, 105S2 and 105S3 may have a structure of one or more layers. In an embodiment each of the multi-level supporters 105S1, 105S2 and 105S3 may have a structure of more than three layers. The mufti-level supporters 105S1, 105S2 and 105S3 may include a first supporter 105S1, a second supporter 105S2 and a third supporter 105S3. The upper surface of the bottom electrode BE is disposed substantially coplanar with an upper surface of the third supporter 105S3.

Figure 10B:
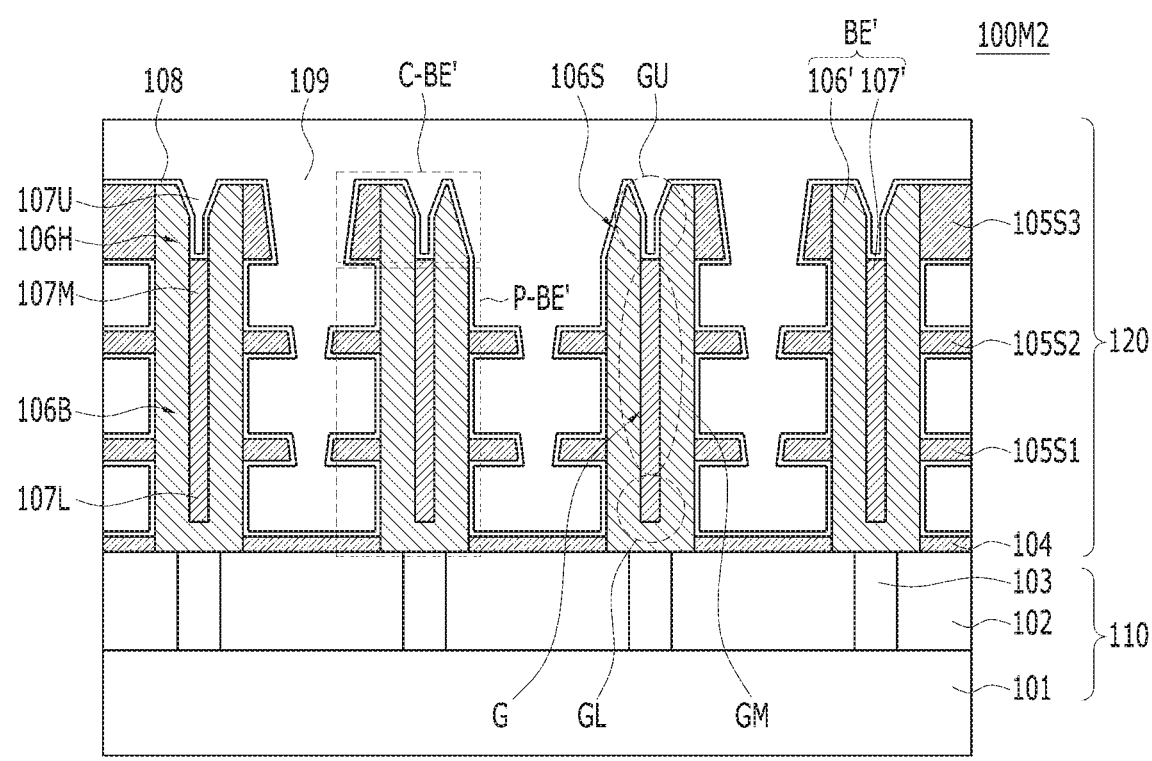
FIG. 10B is a cross-sectional view of a semiconductor device in accordance with a modified example of an embodiment of the present invention.

FIG. 10B is a cross-sectional view of a semiconductor device 100M2 in accordance with a modified example of an embodiment of the present invention. In the semiconductor device 100M2, the other constituent elements, except a second bottom electrode 107', may be the same as the constituent elements of the semiconductor device 100M shown in FIG. 10A. In the semiconductor device 100M2 of FIG. 10B, other constituent elements, except multi-level supporters 105S1, 105S2 and 105S3, may be the same as the semiconductor device 100M' shown in FIG. 5B.

The semiconductor devices 100M1 and 100M2 illustrated in FIGS. 10A and 10B may be formed through one of the methods described with reference to FIGS. 6A to 9C.

Figure 11A:
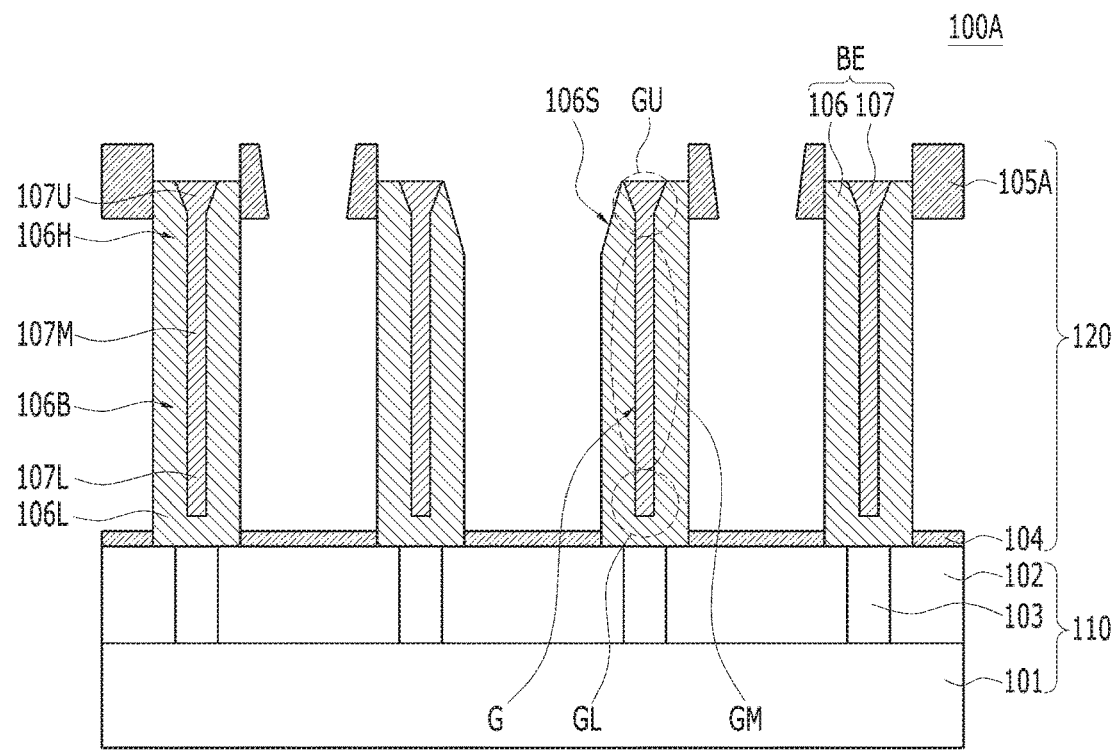
FIG. 11A to 11D are cross-sectional views illustrating a semiconductor device in accordance with a modified example of an embodiment of the present invention.

FIG. 11A is a cross-sectional view illustrating a semiconductor device in accordance with a modified example of an embodiment of the present invention. The other constituent elements except for a supporter 105A of a semiconductor device 100A shown in FIG. 11A may be substantially the same as those of the semiconductor device 100 shown in FIG. 1B.

Referring to FIG. 11A, the semiconductor device 100A may include a lower structure 110 and a capacitor structure 120. The lower structure 110 may include a substrate 101, an inter-layer dielectric layer 102, and contact plugs 103. The contact plugs 103 may be coupled to the substrate 101 by penetrating through the inter-layer dielectric layer 102. The capacitor structure 120 may include an etch stop layer 104, a bottom electrode BE, a supporter 105A. The supporter 105A may be formed to support the bottom electrode BE in a horizontal direction and protect the bottom electrode BE from collapsing. The supporter 105A may be coupled to the outer wall of the bottom electrode BE.

An upper surface of the supporter 105A may be disposed at a higher level than an upper surface of the bottom electrode BE.

Figure 11B:
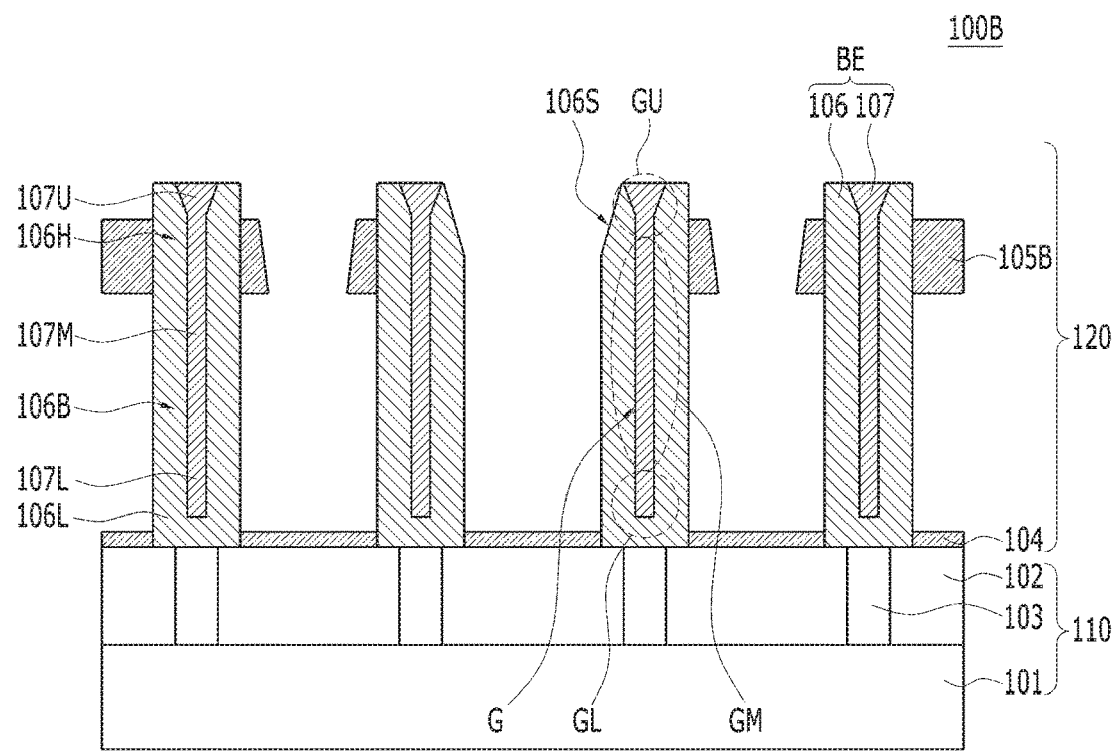

FIG. 11B is a cross-sectional view illustrating a semiconductor device in accordance with a modified example of an embodiment of the present invention. The other constituent elements except for a supporter 105B of a semiconductor device 100B shown in FIG. 11B may be substantially the same as those of the semiconductor device 100 shown in FIG. 1B.

Referring to FIG. 11B, the semiconductor device 100B may include a lower structure 110 and a capacitor structure 120. The lower structure 110 may include a substrate 101, an inter-layer dielectric layer 102, and contact plugs 103. The contact plugs 103 may be coupled to the substrate 101 by penetrating through the inter-layer dielectric layer 102. The capacitor structure 120 may include an etch stop layer 104, a bottom electrode BE, a supporter 105B. The supporter 105B may be formed to support the bottom electrode BE in a horizontal direction and protect the bottom electrode BE from collapsing. The supporter 105B may be coupled to the outer wall of the bottom electrode BE.

An upper surface of the supporter 105B may be disposed at a lower level than an upper surface of the bottom electrode BE.

Figure 11C:
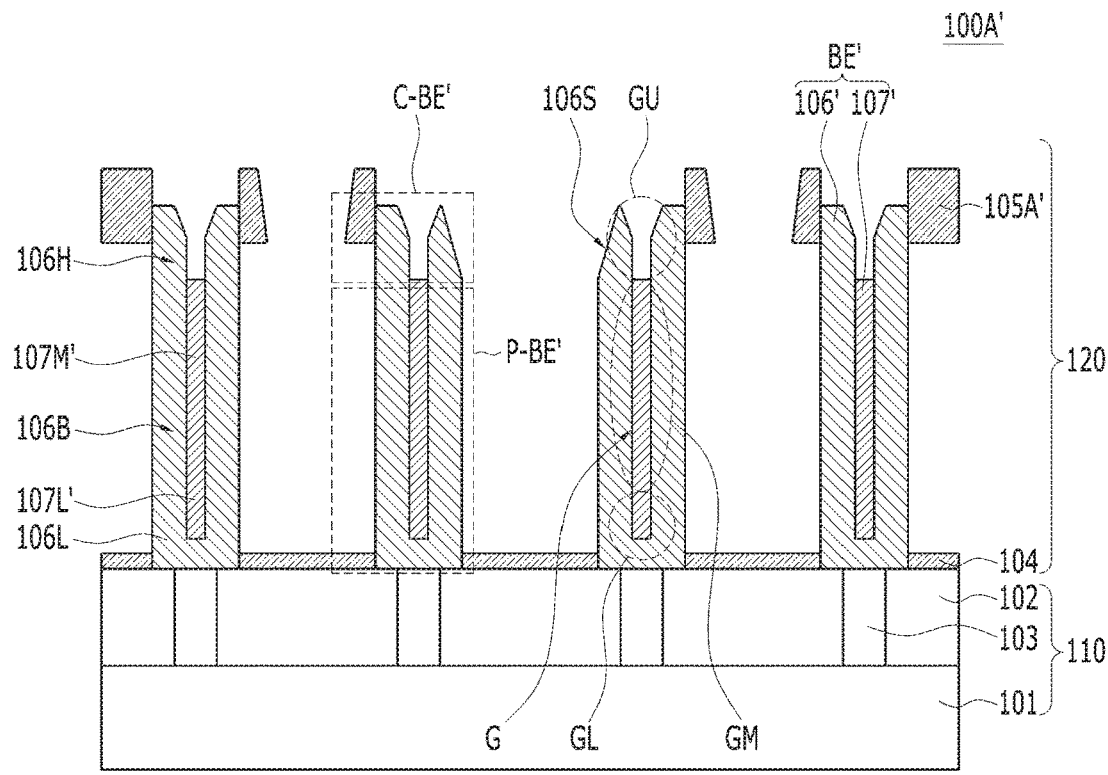

FIG. 11C is a cross-sectional view illustrating a semiconductor device in accordance with a modified example of an embodiment of the present invention. The other constituent elements except for a supporter 105A' of a semiconductor device 100A' shown in FIG. 11C may be substantially the same as those of the semiconductor device 100' shown in FIG. 1C.

Referring to FIG. 11C, the semiconductor device 100A' may include a lower structure 110 and a capacitor structure 120. The lower structure 110 may include a substrate 101, an inter-layer dielectric layer 102, and contact plugs 103. The contact plugs 103 may be coupled to the substrate 101 by penetrating through the inter-layer dielectric layer 102. The capacitor structure 120 may include an etch stop layer 104, a bottom electrode BE', a supporter 105A'. The supporter 105A' may be formed to support the bottom electrode BE' in a horizontal direction and protect the bottom electrode BE' from collapsing. The supporter 105A' may be coupled to the outer wall of the bottom electrode BE'.

An upper surface of the supporter 105A' may be disposed at a higher level than an upper surface of the bottom electrode BE'.

Figure 11D:
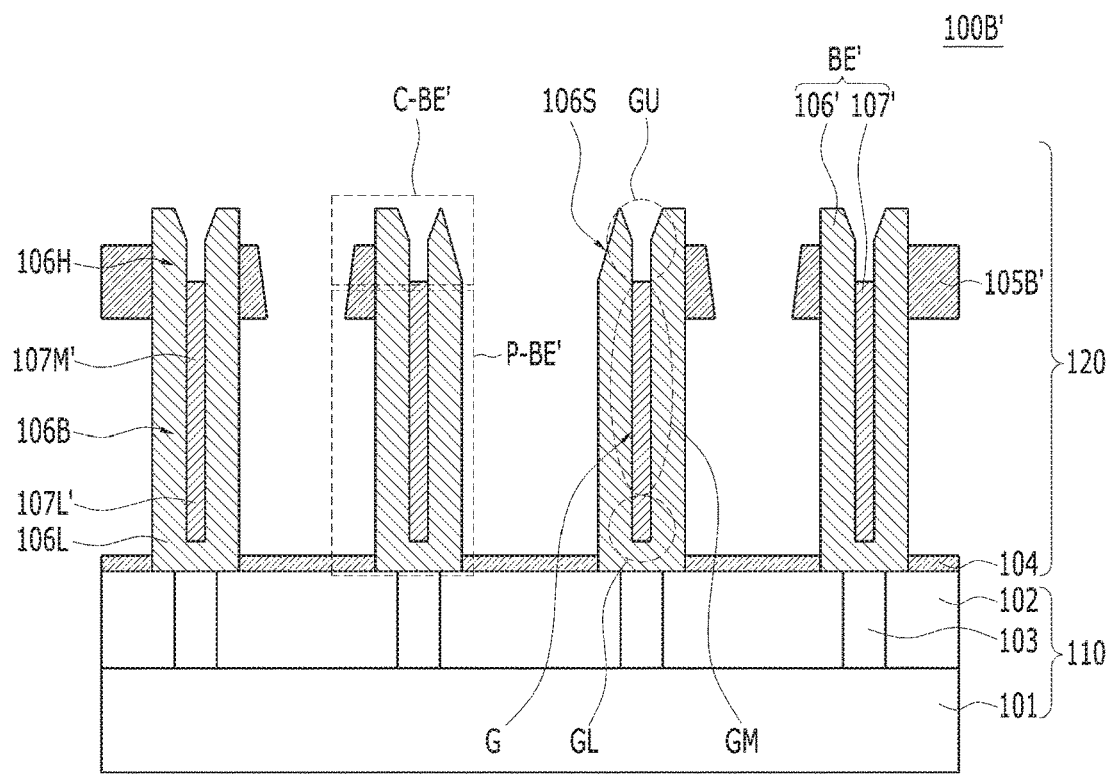

FIG. 11D is a cross-sectional a cross-sectional view illustrating a semiconductor device in accordance with a modified example of an embodiment of the present invention. The other constituent elements except for a supporter 105B' of a semiconductor device 100B' shown in FIG. 11D may be substantially the same as those of the semiconductor device 100' shown in FIG. 1C.

Referring to FIG. 11D, the semiconductor device 100B' may include a lower structure 110 and a capacitor structure 120. The lower structure 110 may include a substrate 101, an inter-layer dielectric layer 102, and contact plugs 103. The contact plugs 103 may be coupled to the substrate 101 by penetrating through the inter-layer dielectric layer 102. The capacitor structure 120 may include an etch stop layer 104, a bottom electrode BE', a supporter 105B'. The supporter 105B' may be formed to support the bottom electrode BE' in a horizontal direction and protect the bottom electrode BE' from collapsing. The supporter 105B' may be coupled to the outer wall of the bottom electrode BE'.

An upper surface of the supporter 105B' may be disposed at a lower level than an upper surface of the bottom electrode BE'.

Figure 12A:
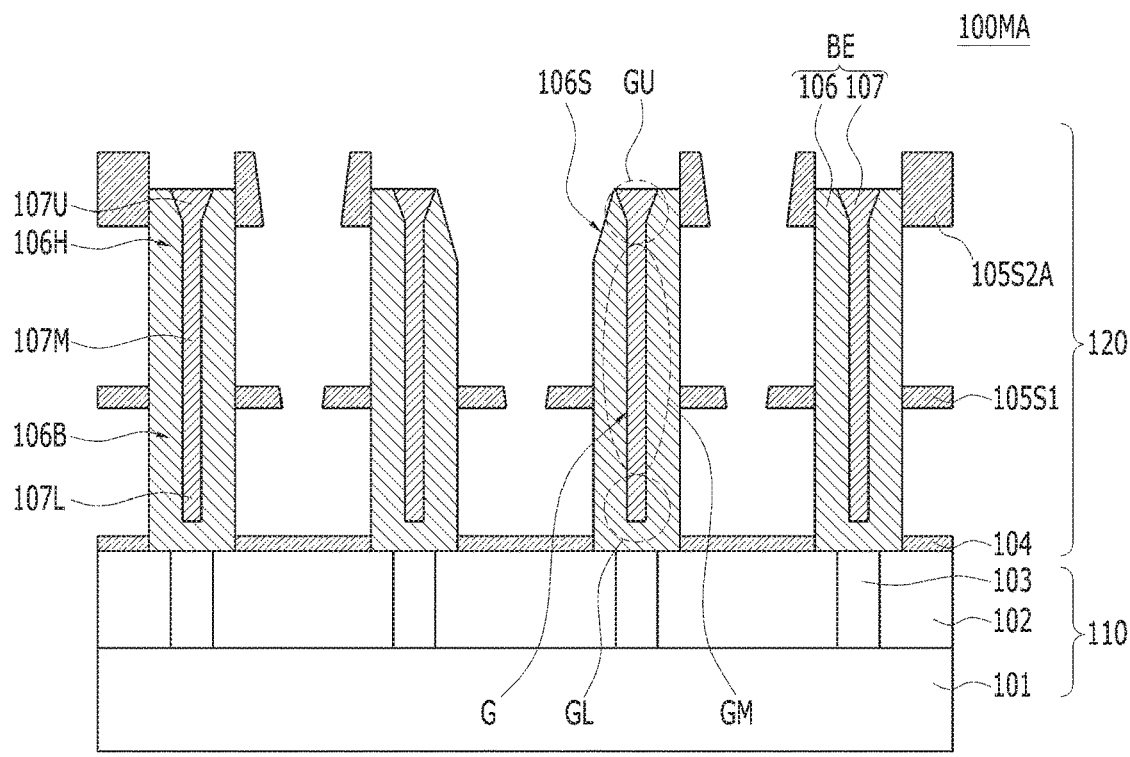
FIG. 12A to 12D are cross-sectional views illustrating a semiconductor device in accordance with a modified example of an embodiment of the present invention.

FIG. 12A is a cross-sectional view illustrating a semiconductor device in accordance with a modified example of an embodiment of the present invention. The other constituent elements except for a second supporter 105S2A of a semiconductor device 100MA shown in FIG. 12A may be substantially the same as those of the semiconductor device 100M shown in FIG. 5A.

Referring to FIG. 12A, the semiconductor device 100MA may include multi-level supporters 105S1 and 105S2A. The multi-level supporters 105S1 and 105S2A may be formed to support bottom electrodes BE in a horizontal direction in order to prevent the bottom electrodes BE from collapsing. The multi-level supporters 105S1 and 105S2A may include a first supporter 105S1 and a second supporter 105S2A.

An upper surface of the second supporter 105S2A may be disposed at a higher level than an upper surface of the bottom electrode BE.

Figure 12B:
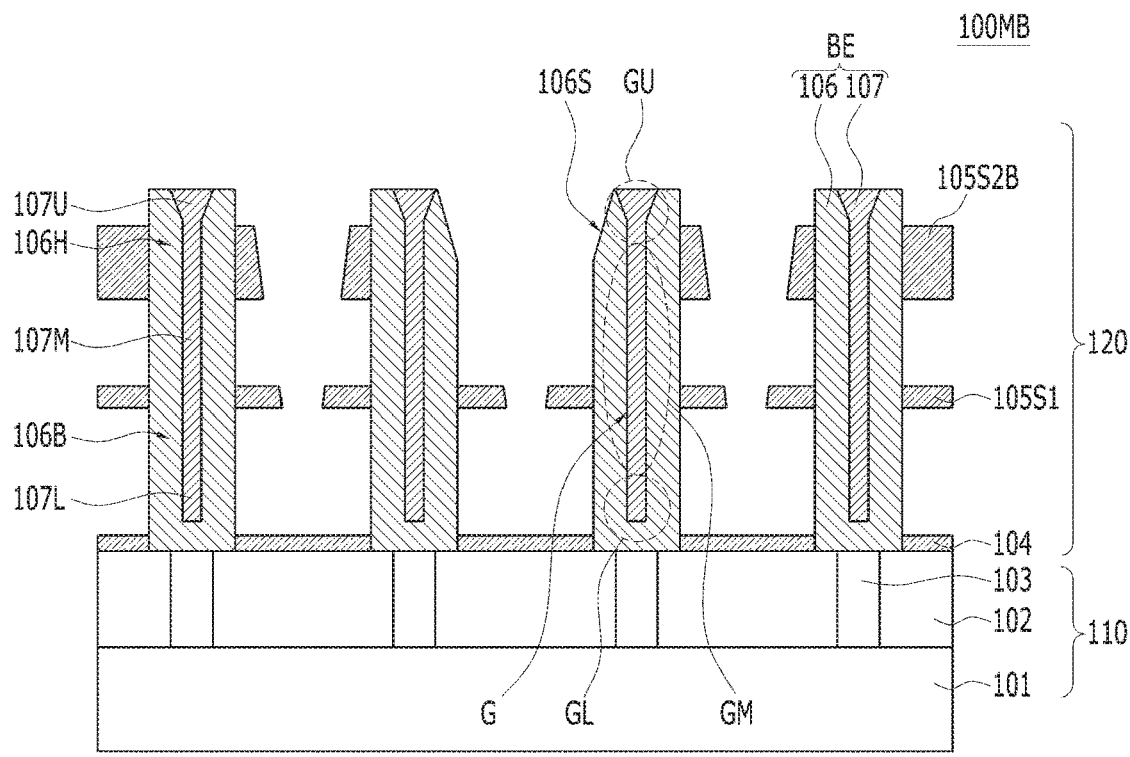

FIG. 12B is a cross-sectional view illustrating a semiconductor device in accordance with a modified example of an embodiment of the present invention. The other constituent elements except for a second supporter 105S2B of a semiconductor device 100MB shown in FIG. 12B may be substantially the same as those of the semiconductor device 100M shown in FIG. 5A.

Referring to FIG. 12B, the semiconductor device 100MB may include mufti-level supporters 105S1 and 105S2B. The multi-level supporters 105S1 and 105S2B may be formed to support bottom electrodes BE in a horizontal direction in order to prevent the bottom electrodes BE from collapsing. The multi-level supporters 105S1 and 105S2B may include a first supporter 105S1 and a second supporter 105S2B.

An upper surface of the second supporter 105S2B may be disposed at a lower level than an upper surface of the bottom electrode BE.

Figure 12C:
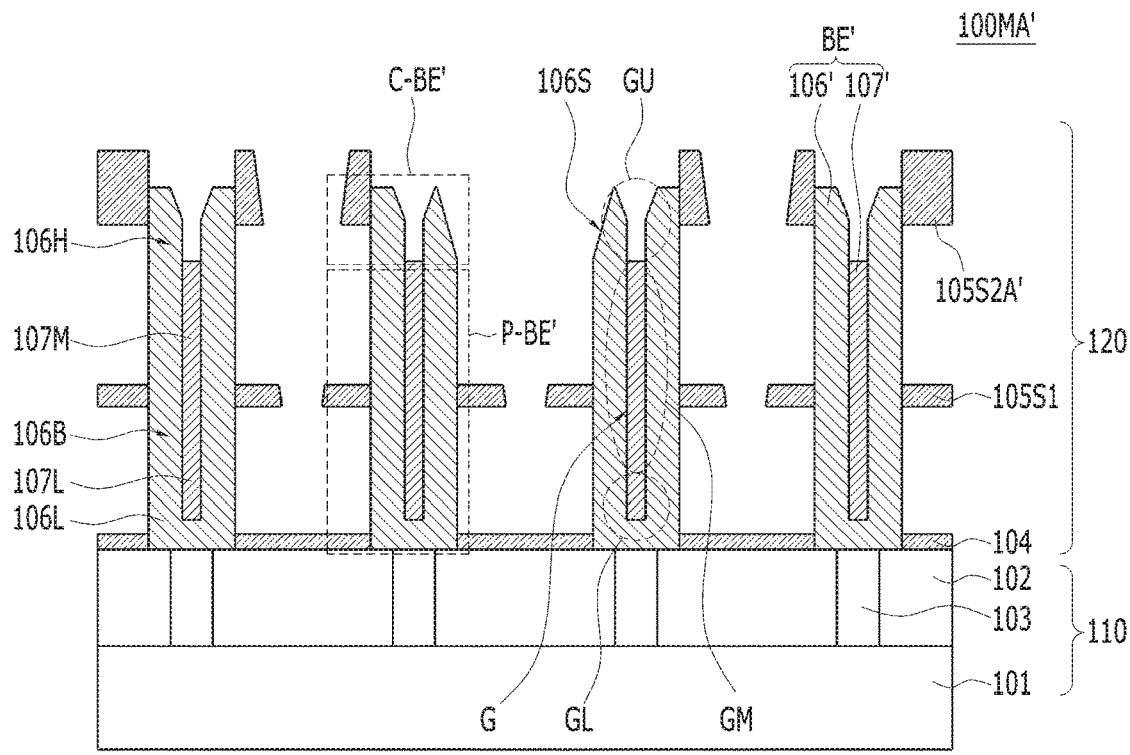

FIG. 12C is a cross-sectional view illustrating a semiconductor device in accordance with a modified example of an embodiment of the present invention. The other constituent elements except for a second supporter 105S2A' of a semiconductor device 100MA' shown in FIG. 12C may be substantially the same as those of the semiconductor device 100M' shown in FIG. 5B.

Referring to FIG. 12C, the semiconductor device 100MA' may include multi-level supporters 105S1 and 105S2A'. The multi-level supporters 105S1 and 105S2A' may be formed to support bottom electrodes BE' in a horizontal direction in order to prevent the bottom electrodes BE' from collapsing. The multi-level supporters 105S1 and 105S2A' may include a first supporter 105S1 and a second supporter 105S2A'.

An upper surface of the second supporter 105S2A' may be disposed at a higher level than an upper surface of the bottom electrode BE'.

Figure 12D:
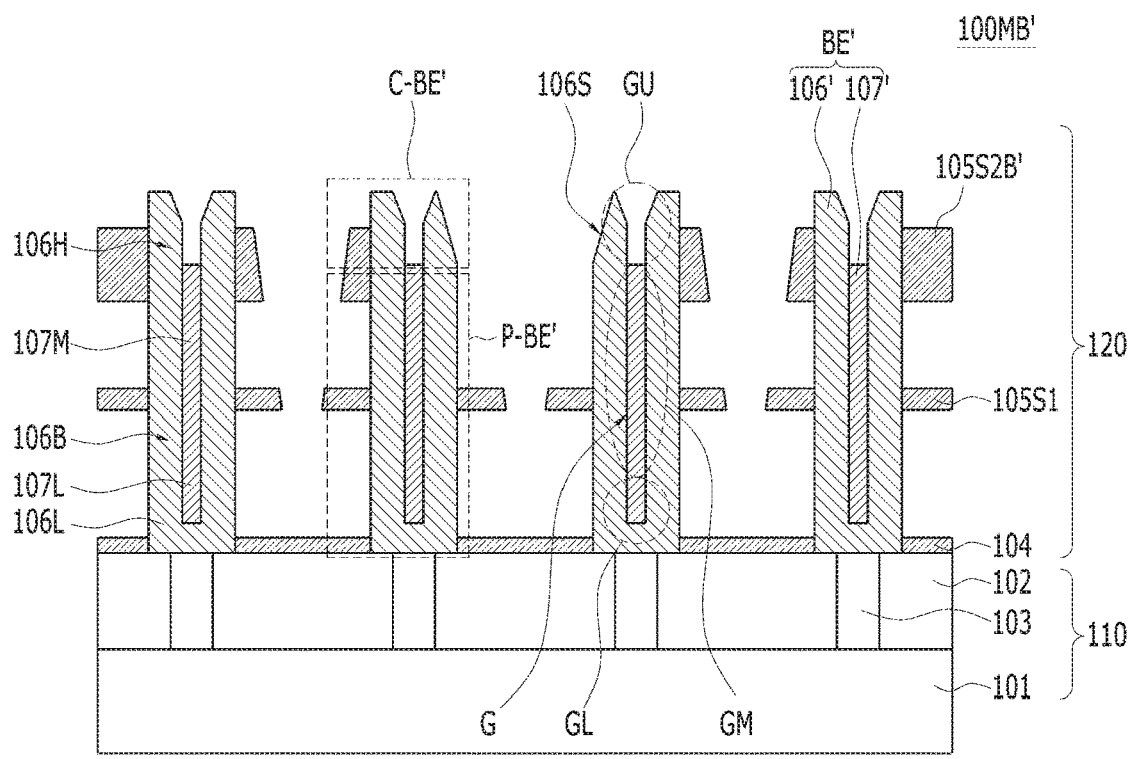

FIG. 12D is a cross-sectional view illustrating a semiconductor device in accordance with a modified example of an embodiment of the present invention. The other constituent elements except for a second supporter 105S2B' of a semiconductor device 100MB' shown in FIG. 12D may be substantially the same as those of the semiconductor device 100M' shown in FIG. 5B.

Referring to FIG. 12D, the semiconductor device 100MB' may include multi-level supporters 105S1 and 105S2B'. The multi-level supporters 105S1 and 105S2B' may be formed to support bottom electrodes BE' in a horizontal direction in order to prevent the bottom electrodes BE' from collapsing. The multi-level supporters 105S1 and 105S2B' may include a first supporter 105S1 and a second supporter 105S2B'.

An upper surface of the second supporter 105S2B' may be disposed at a lower level than an upper surface of the bottom electrode BE'.

Figure 13A:
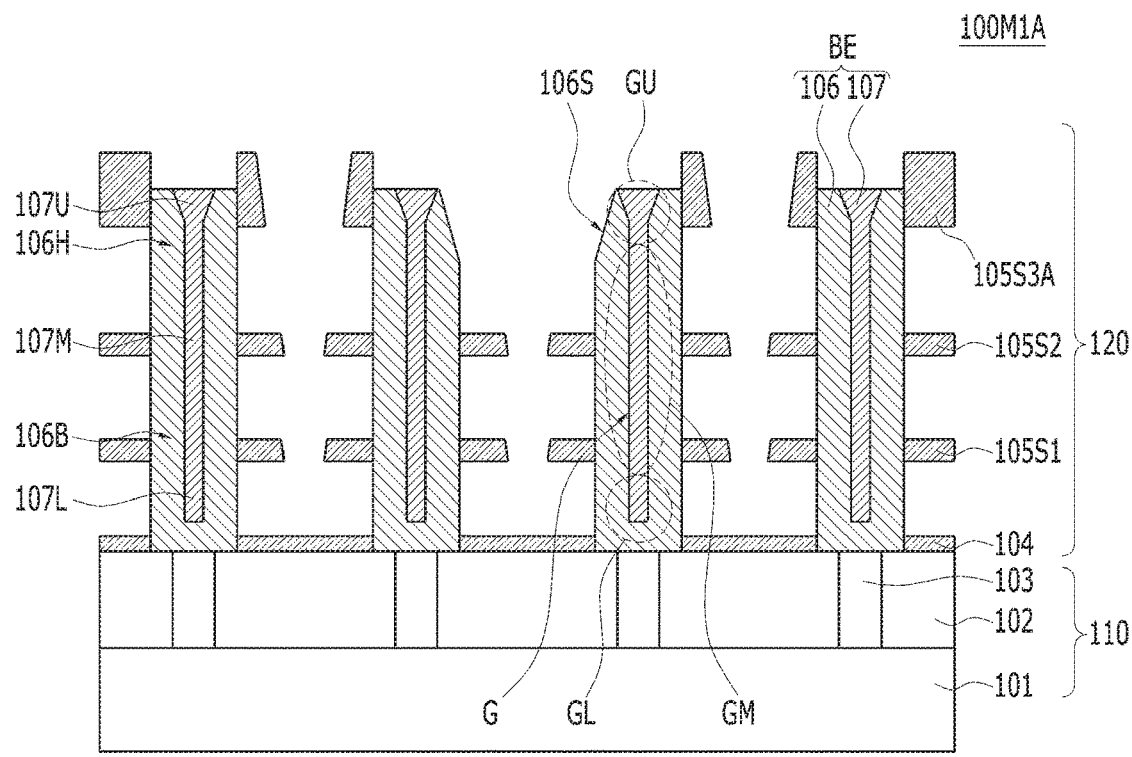
FIG. 13A to 13D are cross-sectional views illustrating a semiconductor device in accordance with a modified example of an embodiment of the present invention.

FIG. 13A is a cross-sectional view illustrating a semiconductor device in accordance with a modified example of an embodiment of the present invention. The other constituent elements except for a third supporter 105S3A of a semiconductor device 100M1A shown in FIG. 13A may be substantially the same as those of the semiconductor device 100M1 shown in FIG. 10A.

The semiconductor device 100M1A may include multi-level supporters 105S1, 105S2 and 105S3A. The multi-level supporters 105S1, 105S2 and 105S3A may include a first supporter 105S1, a second supporter 105S2 and the third supporter 105S3A. An upper surface of the third supporter 105S3A may be disposed at a higher level than an upper surface of the bottom electrode BE.

Figure 13B:
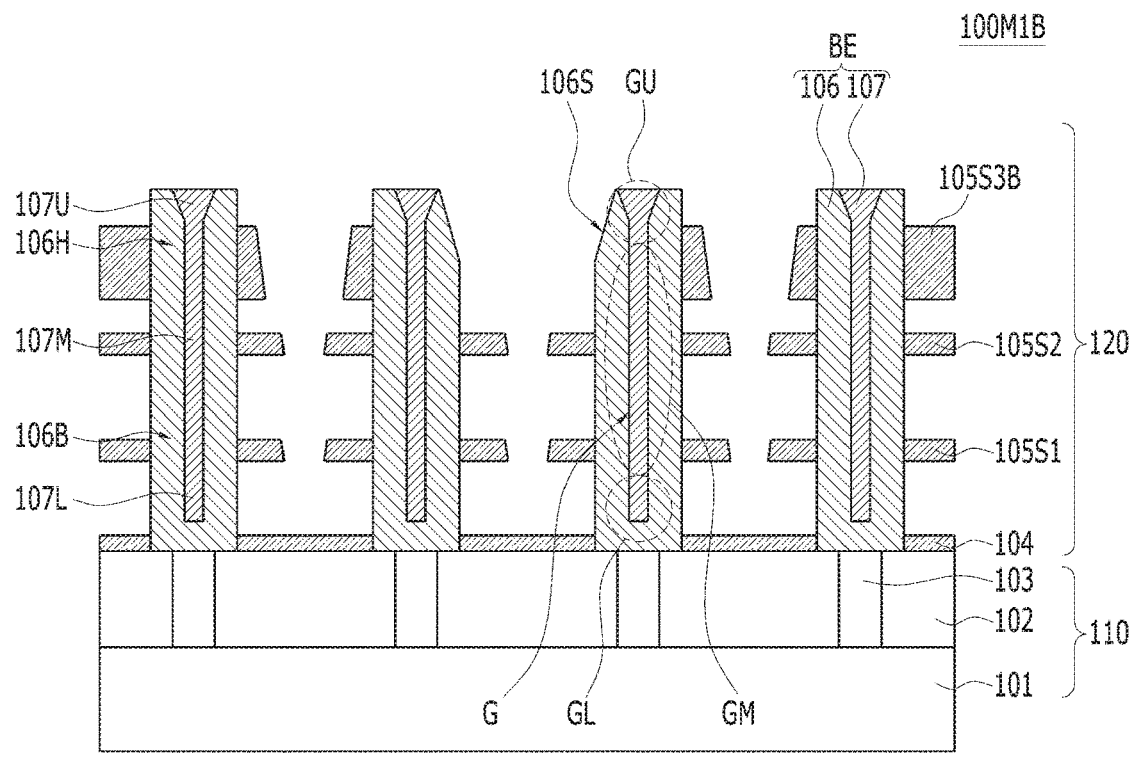

FIG. 13B is a cross-sectional view illustrating a semiconductor device in accordance with a modified example of an embodiment of the present invention. The other constituent elements except for a third supporter 105S3B of a semiconductor device 100M1B shown in FIG. 13B may be substantially the same as those of the semiconductor device 100M1 shown in FIG. 10A.

The semiconductor device 100M1B may include multi-level supporters 105S1, 105S2 and 105S3B. The multi-level supporters 105S1, 105S2 and 105S3B may include a first supporter 105S1, a second supporter 105S2 and the third supporter 105S3B. An upper surface of the third supporter 105S3B may be disposed at a lower level than an upper surface of the bottom electrode BE.

Figure 13C:
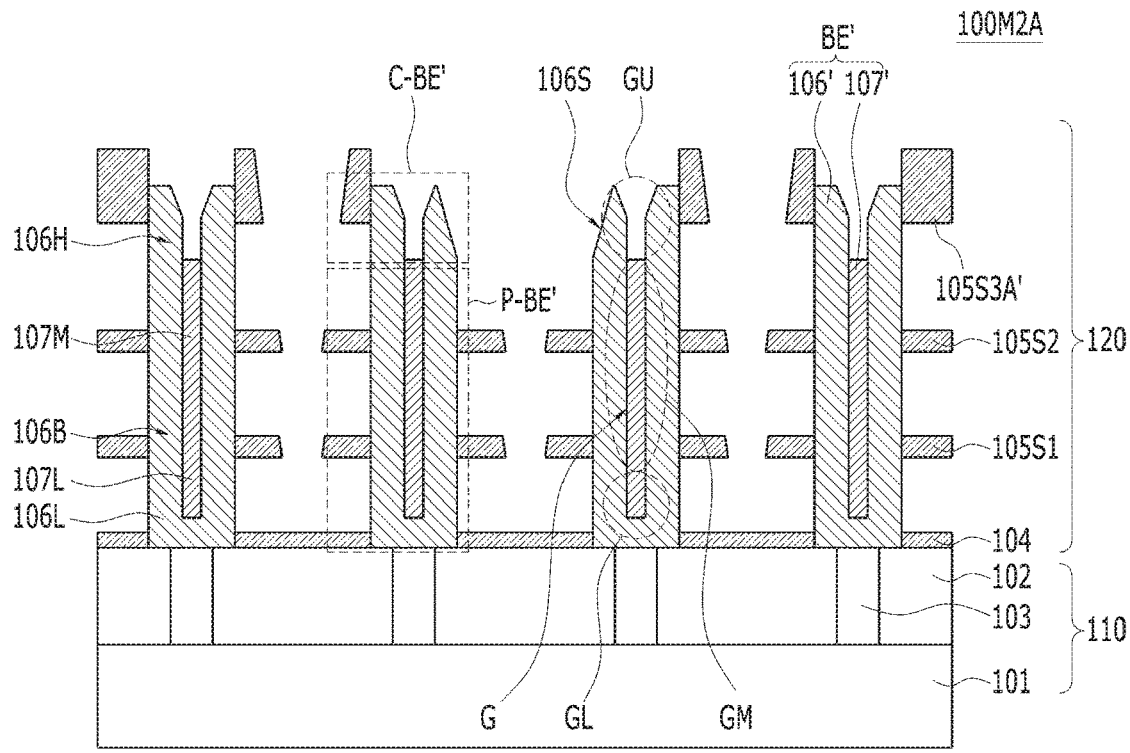

FIG. 13C is a cross-sectional view illustrating a semiconductor device in accordance with a modified example of an embodiment of the present invention. The other constituent elements except for a third supporter 105S3A' of a semiconductor device 100M2A shown in FIG. 13C may be substantially the same as those of the semiconductor device 100M2 shown in FIG. 10B.

The semiconductor device 100M2A may include multi-level supporters 105S1, 105S2 and 105S3A'. The multi-level supporters 105S1, 105S2 and 105S3A' may include a first supporter 105S1, a second supporter 105S2 and the third supporter 105S3A'. An upper surface of the third supporter 105S3A' may be disposed at a higher level than an upper surface of the bottom electrode BE'.

Figure 13D:
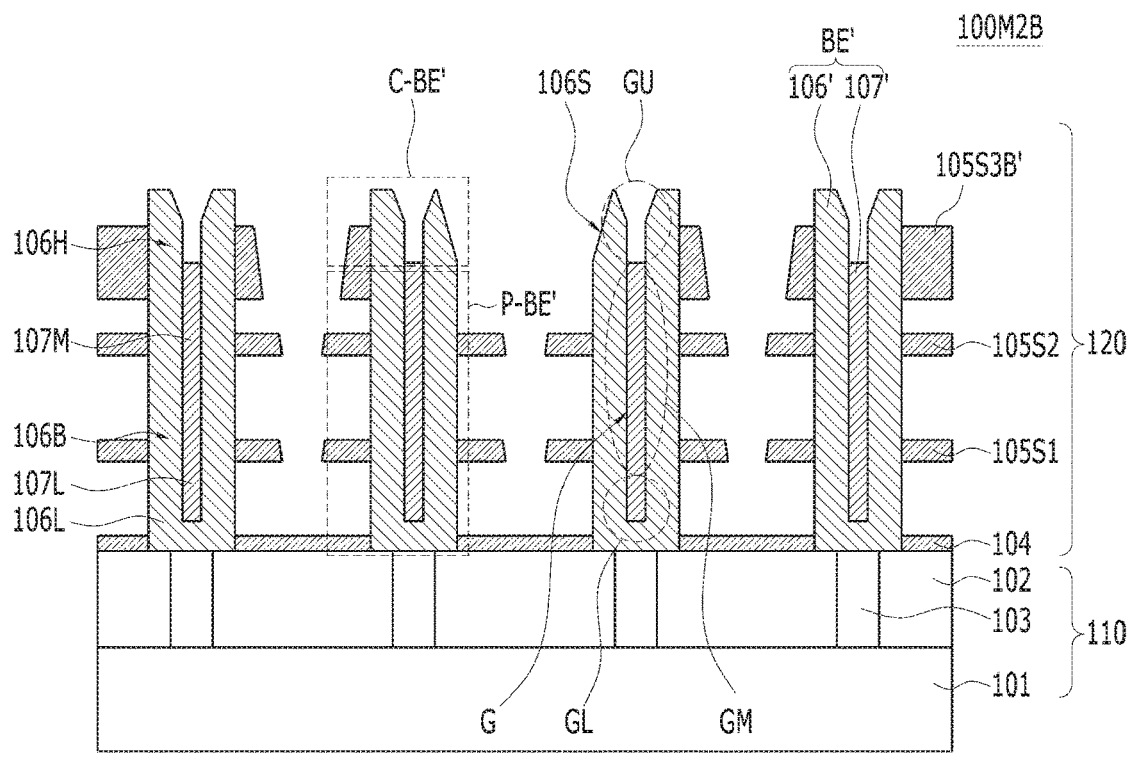

FIG. 13D is a cross-sectional view illustrating a semiconductor device in accordance with a modified example of an embodiment of the present invention. The other constituent elements except for a third supporter 105S3B' of a semiconductor device 100M2B shown in FIG. 13D may be substantially the same as those of the semiconductor device 100M2 shown in FIG. 10B.

The semiconductor device 100M2B may include multi-level supporters 105S1, 105S2 and 105S3B'. The multi-level supporters 105S1, 105S2 and 105S3B' may include a first supporter 105S1, a second supporter 105S2 and the third supporter 105S3B'. An upper surface of the third supporter 105S3B' may be disposed at a lower level than an upper surface of the bottom electrode BE'.

FIGS. 14A to 14E are cross-sectional views illustrating a fourth example of a method for fabricating a semiconductor device in accordance with an embodiment of the present invention. The method shown in FIGS. 14A to 14E may be substantially similar to that shown in FIGS. 3A to 3E.

First, through the process described with reference to FIGS. 2A to 2C, the substrate structure including up to the first bottom electrode layer 19A may be formed over the substrate 11. The first bottom electrode layer 19A may be exposed to a partial etch process. As a result of the partial etch process, the width of the upper portion of the gap 20 may be expanded.

Figure 14A:
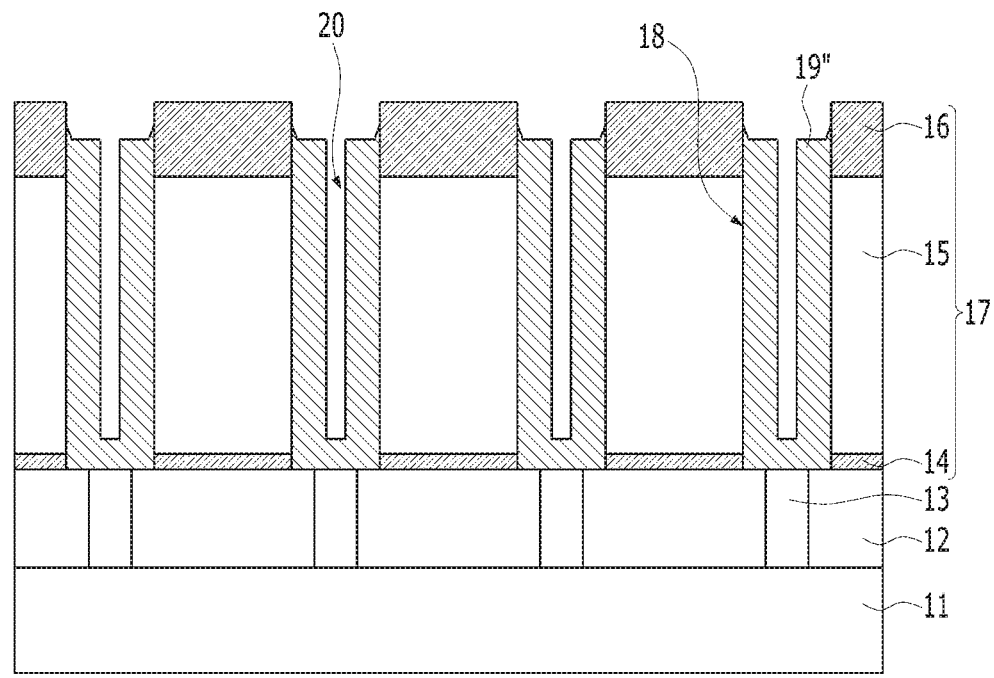
FIGS. 14A to 14E are cross-sectional views illustrating a fourth example of a method for fabricating a semiconductor device in accordance with an embodiment of the present invention.

Subsequently, referring to FIG. 14A, a first bottom electrode 19" may be formed. The first bottom electrode 19" may be disposed in the inside of each opening 18. The first bottom electrode 19" may be formed by selectively removing the first bottom electrode layer 19A, which is called a selective removing process. The first bottom electrode 19" may have a cylindrical shape. In order to form the first bottom electrode 19", the selective removing process may be performed onto the first bottom electrode layer 19A. The selective removing process may be a Chemical Mechanical Polishing (CMP) process or an etch-back process. For example, a Chemical Mechanical Polishing (CMP) process and an etch-back process may be sequentially performed on the first bottom electrode 19A. Accordingly, an upper surface of the first bottom electrode 19" may be disposed at a lower level than an upper surface of the supporter layer 16. The first bottom electrode 19" may be electrically connected to the contact plug 13. A gap 20 may be defined in the inside of the first bottom electrode 19".

Figure 14B:
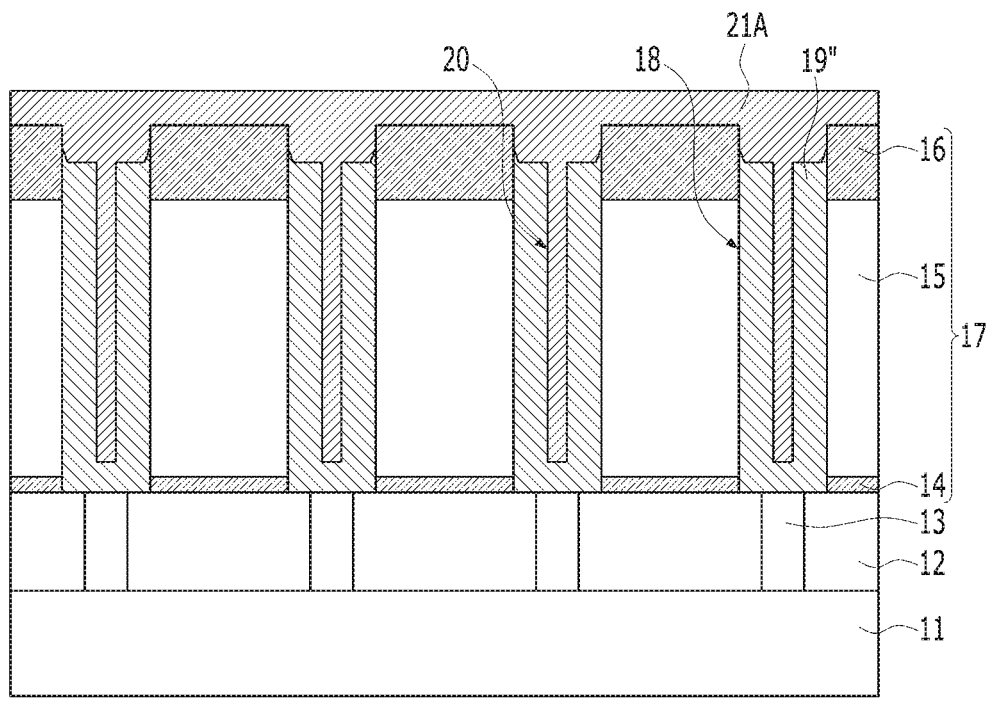

Referring to FIG. 14B, a second bottom electrode layer 21A may be formed. The second bottom electrode layer 21A may be formed over the first bottom electrode 19". The second bottom electrode layer 21A may fill each gap 20. The second bottom electrode layer 21A may include a conductive material. The second bottom electrode layer 21A may include a material having an etch selectivity with respect to the supporter layer 16. The second bottom electrode layer 21A and the first bottom electrode 19" may be formed of different materials. The second bottom electrode layer 21A may include a silicon-containing material. The second bottom electrode layer 21A may include polysilicon. Since polysilicon has a good step coverage, it can fill the inside of the gap 20 substantially without any voids.

Figure 14C:
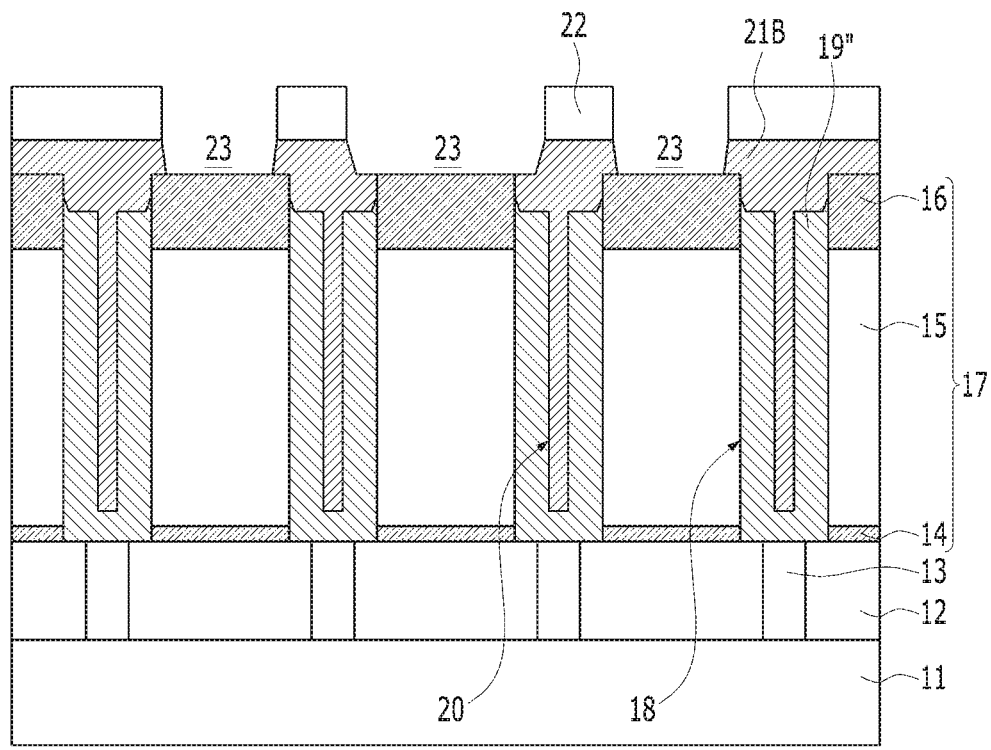

Referring to FIG. 14C, a supporter mask layer 22 may be formed. The supporter mask layer 22 may include a photoresist.

The second bottom electrode layer 21A may be etched by using the supporter mask layer 22. As a result, an electrode cutting portion 23 may be formed to expose a portion of the surface of the supporter layer 16. A side wall of the electrode cutting portion 23 may have a sloped profile. The second bottom electrode layer may remain as shown by reference numerals and '21B'.

Figure 14D:
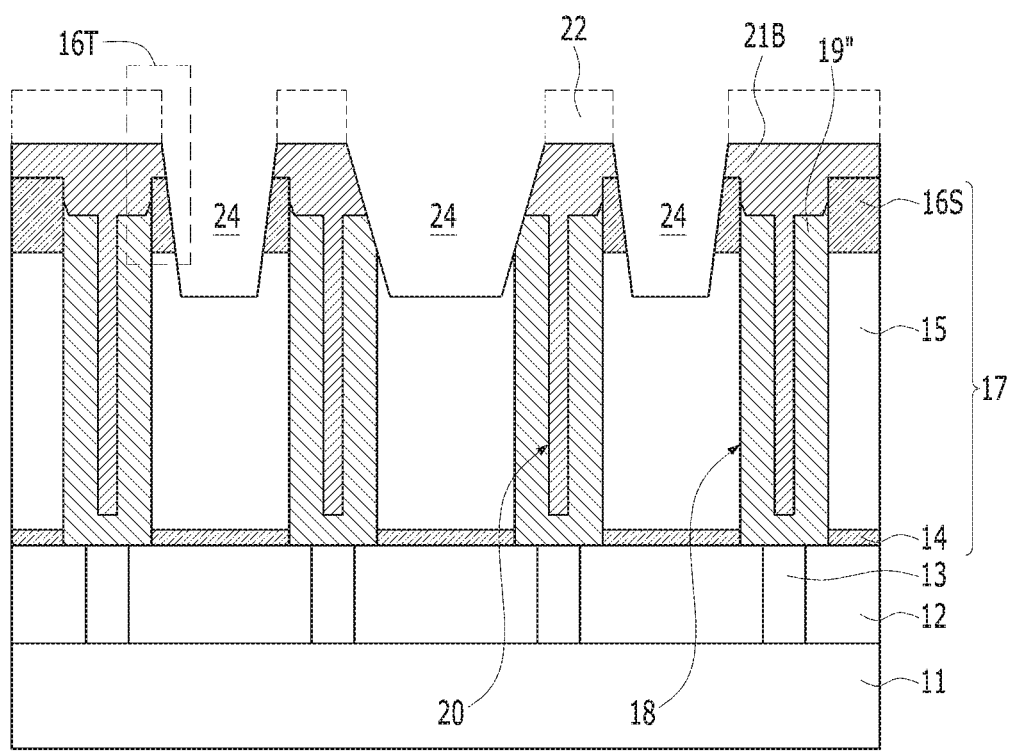

Referring to FIG. 14D, a supporter 16S may be formed. The supporter 16S may be formed by selectively etching the supporter layer 16 exposed through the electrode cutting portion 23. As a result of etching the supporter layer 16, a supporter opening 24 and the supporter 16S may be formed.

The supporter 16S may contact the first bottom electrode 19". A portion of the surface of the mold layer 15 may be exposed due to the supporter 16S. The surface of the mold layer 15 may be over-etched. In other words, the supporter opening 24 may be extended into the inside of the mold layer 15 through the surface of the mold layer 15. The supporter 16S may surround a portion of an outer side wall of the first bottom electrode 19". The supporter 16S, which is described above, can protect a bottom electrode having a high aspect ratio from collapsing during the subsequent process of removing the mold layer 15.

Also, while the etch process for forming the supporter 16S is being performed, the supporter mask layer 22 may be consumed. Although the supporter mask layer 22 is consumed, since the second bottom electrode layer 21B functions as an etch barrier, it is possible to prevent the supporter 16S from being damaged in the upper portion of the opening 18 (see reference numeral '16T').

Figure 14E:
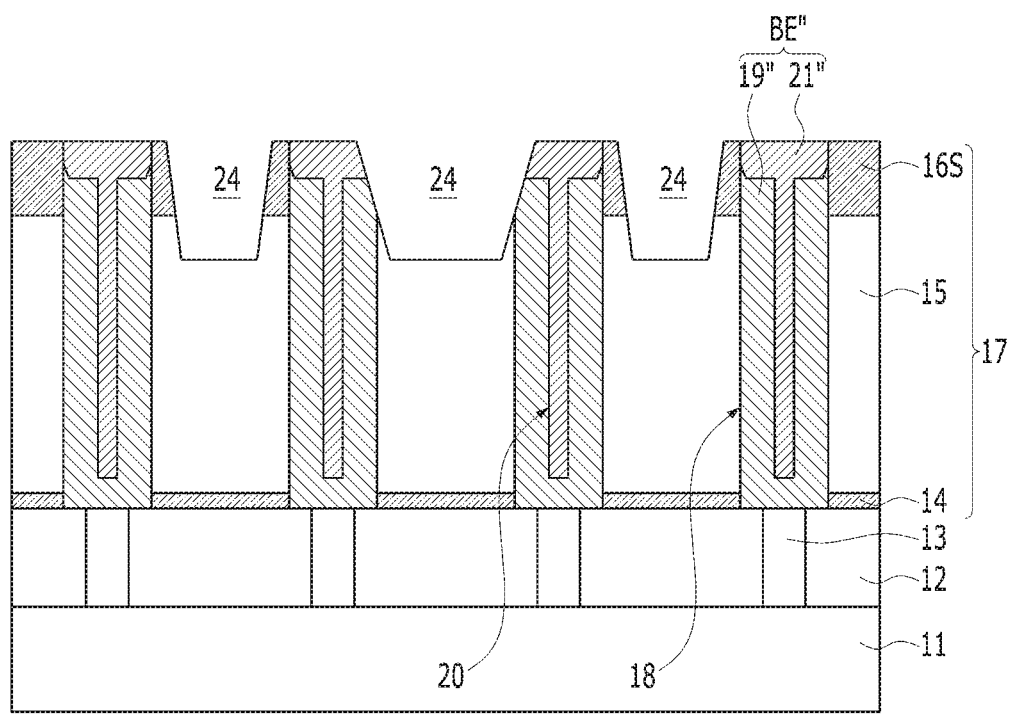

Referring to FIG. 14E, a second bottom electrode 21" may be formed. The second bottom electrode 21" may be disposed in the inside of each opening 18. The second bottom electrode 21" may be disposed in the inside of the gap 20 in the inside of the first bottom electrode 19". The second bottom electrode 21" may have a pillar shape. The second bottom electrode 21" may be formed by selectively removing the second bottom electrode layer 21B. To form the second bottom electrode 21", a selective removing process may be performed onto the second bottom electrode layer 21B. The selective removing process may be a Chemical Mechanical Polishing (CMP) process or an etch-back process. For example, a CMP process may be performed onto the second bottom electrode layer 21B until the surface of the supporter 16S is exposed.

The second bottom electrode 21" may cap an upper portion of the first bottom electrode 19". The second bottom electrode 21" may have a T shape.

As described above, a bottom electrode BE" formed of the first bottom electrode 19" and the second bottom electrode 21" may be formed by forming the second bottom electrode 21". The bottom electrode BE" may have a high aspect ratio. The bottom electrode BE" may have the same aspect ratio as the opening 18. For example, in an embodiment, the bottom electrode BE" may have a high aspect ratio of approximately 10:1 or higher. The first bottom electrode 19" may have a cylindrical shape with the gap 20 defined therein, and the second bottom electrode 21" may fill the inside of the gap 20. In this respect, the second bottom electrode 21" may have a pillar shape.

Subsequently, as illustrated in FIGS. 2H and 2I, the process of removing the mold layer 15 may be performed. Subsequently, a dielectric layer 25 and a top electrode 26 may be formed.

The second bottom electrode 21" having the T shape may be also applied to the second bottom electrodes 107 and 21 shown in the aforementioned embodiments of the present invention.

Figure 15A:
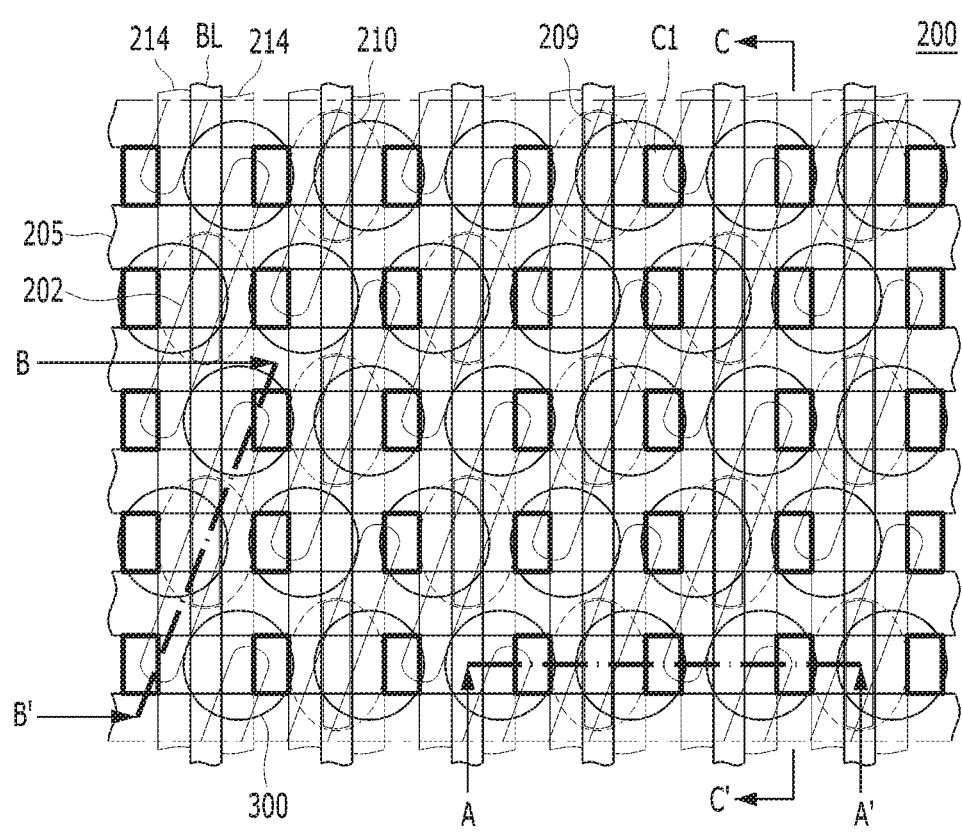
FIG. 15A is a plan view of a semiconductor device in accordance with an embodiment of the present invention.
Figure 15B:
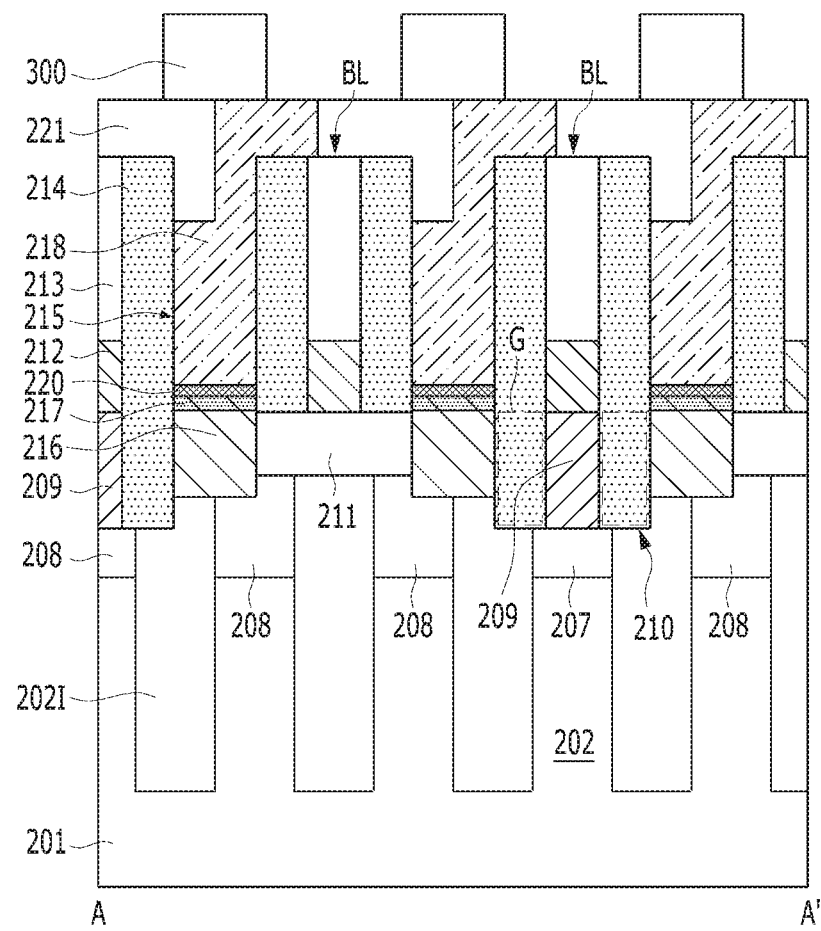
FIG. 15B is a cross-sectional view of the semiconductor device taken along a line A-A' in FIG. 15A.
Figure 15C:
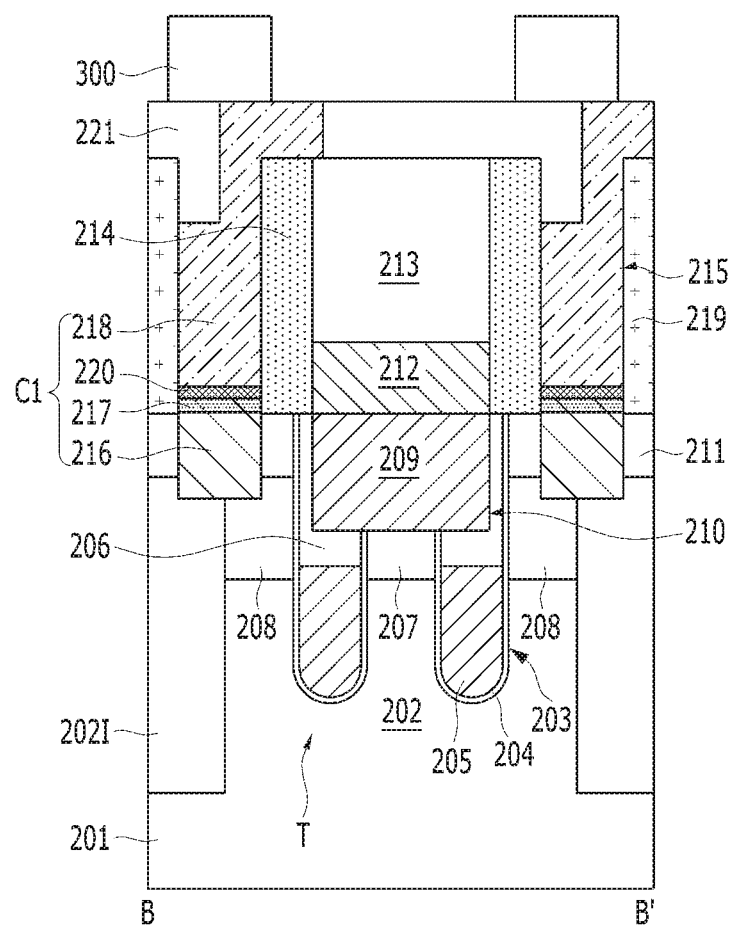
FIG. 15C is a cross-sectional view of the semiconductor device taken along a line B-B' in FIG. 15A.

FIGS. 15A to 15C illustrate a semiconductor device 200 in accordance with an embodiment of the present invention. In an embodiment of the present invention, a semiconductor device having memory cells, such as a DRAM, is described. FIG. 15A is a plan view of the semiconductor device in accordance with an embodiment of the present invention. FIG. 15B is a cross-sectional view of the semiconductor device taken along a line A-A' in FIG. 15A. FIG. 15C is a cross-sectional view of the semiconductor device taken along a line B-B' in FIG. 15A.

The semiconductor device 200 may include a plurality of memory cells. Each of the memory cells may include a cell transistor T including a buried word line 205, a bit line 212, and a capacitor structure 300. The capacitor structure 300 may correspond to the capacitor structure 120 in accordance with the above-described embodiments of the present invention.

The semiconductor device 200 is described in detail below.

An isolation layer 202I and an active region 202 may be formed in a substrate 201. The isolation layer 202I may define a plurality of active regions 202. The substrate 201 may be formed of an appropriate material for semiconductor processing. The isolation layer 202I may be formed through a Shallow Trench Isolation (STI) process.

A gate trench 203 may be formed in the substrate 201. A gate dielectric layer 204 may be formed over the surface of the gate trench 203. A buried word line 205 filling a portion of the gate trench 203 may be formed over the gate dielectric layer 204. A sealing layer 206 may be formed over the buried word line 205. The sealing layer 206 may have the same height as the height of the substrate 201. The buried word line 205 may be at a lower level than the surface of the substrate 201. The buried word line 205 may be of a low-resistance metal material. The buried word line 205 may be formed by sequentially stacking titanium nitride and tungsten. According to another embodiment of the present invention, the buried word line 205 may be formed of a titanium nitride (TiN) only.

First and second source/drain regions 207 and 208 may be formed in the substrate 201. The first and second source/drain regions 207 and 208 may be spaced apart from each other by the gate trench 203. The cell transistor T may comprise the buried word line 205 and the first and second source/drain regions 207 and 208. The cell transistor T may have an improved short channel effect due to the presence of the buried word line 205.

A bit line contact plug 209 may be formed over the substrate 201. The bit line contact plug 209 may be directly coupled to the first source/drain region 207. The bit line contact plug 209 may be disposed in the inside of a bit line contact hole 210. The bit line contact hole 210 may be formed in a hard mask layer 211. The hard mask layer 211 may be formed over the gate dielectric layer 204. The bit line contact hole 210 may expose the first source/drain region 207. A bottom surface of the bit line contact plug 209 may be lower than a top surface of the substrate 201. The bit line contact plug 209 may be formed of polysilicon or a metal material. A portion of the bit line contact plug 209 may have a shorter line width than a diameter of the bit line contact hole 210. Accordingly, a gap G may be formed on each of both sides of the bit line contact plug 209, individually. The gaps G may be formed on both sides of the bit line contact plug 209, independently. The pair of the gaps G inside the bit line contact hole 210 may be separated by the bit line contact plug 209. One gap G may be disposed between the bit line contact plug 209 and a silicon plug 216.

A bit line structure BL may be formed over the bit line contact plug 209. The bit line structure BL may include a bit line 212, and a bit line capping layer 213 over the bit line 212. The bit line structure BL may have a shape of a line extended in a direction intersecting with the buried word line 205. A portion of the bit line 212 may be coupled to the bit line contact plug 209. From the perspective of a line A-A', the bit line 212 and the bit line contact plug 209 may have the same line width. Therefore, the bit line 212 may be extended in one direction while covering the bit line contact plug 209. The bit line 212 may be made of a metal material. The bit line capping layer 213 may be made of an insulating material.

A spacer element 214 may be formed on the side wall of the bit line structure BL. The spacer element 214 may be formed of a plurality of spacers. The bottom portion of the spacer element 214 may fill the gaps G on both sides of the bit line contact plug 209. The spacer element 214 may include a silicon oxide, a silicon nitride, or a combination thereof. The spacer element 214 may have an NON (Nitride-Oxide-Nitride) structure. According to another embodiment of the present invention, the spacer element 214 may include an air gap. For example, the spacer element 214 may have an NAN (Nitride-Air gap-Nitride) structure.

A storage node contact structure C1 may be formed between neighboring bit line structures BL. The storage node contact structure C1 may be formed in a storage node contact hole 215. The storage node contact hole 215 may have a high aspect ratio. The storage node contact structure C1 may be coupled to the second source/drain region 208. The storage node contact structure C1 may include a silicon plug 216 and a metal plug 218. The upper portion of the metal plug 218 may be extended to partially overlap with the upper portion of the bit line structure BL. The metal plug 218 may be disposed adjacent to the bit line 212. The silicon plug 216 may be disposed adjacent to the bit line contact plug 209. From the perspective of the direction parallel to the bit line structure BL (which is a C-C' direction of FIG. 11A), a plug isolation layer 219 may be formed between neighboring storage node contact structures C1. The plug isolation layer 219 may be formed between neighboring bit line structures BL, and the plug isolation layer 219 may provide the storage node contact hole 215 along with the hard mask layer 211.

The storage node contact structure C1 may further include an interface doping layer 217 and a metal silicide 220 between the silicon plug 216 and the metal plug 218.

The silicon plug 216 may include polysilicon or an epitaxial silicon layer. The epitaxial silicon layer may be formed through a selective epitaxial growth. The epitaxial silicon layer may include SEG SiP.

The metal plug 218 may include tungsten. The metal silicide 220 may include a cobalt silicide.

The interface doping layer 217 may include polysilicon doped with boron or an epitaxial silicon layer doped with boron.

A capping layer 221 may be formed between the metal plug 218 of the storage node contact structure C1 and the upper portion of the bit line structure BL.

A capacitor structure 300 may be formed over the storage node contact structure C1.

According to various embodiments of the present invention, a capacitor having a bottom electrode with a high aspect ratio can be formed in a hybrid pillar type structure. The hybrid pillar type structure can protect the bottom electrode from collapsing during the manufacturing process.

Also, according to various embodiments of the present invention, at least one supporter layer may be provided for further supporting the bottom electrode. Preferably in the manufacturing process, a material having a high selectivity may be used as an etch barrier for the supporter layer, thus preventing the loss of the supporter layer.

The reliability and the yield of a semiconductor device may be increased by employing the aforementioned bottom electrode which exhibits enhanced stability.

While the present invention has been described with respect to specific embodiments, it will be apparent to those skilled in the art that various other embodiments and changes or modifications thereof may be made without departing from the spirit and scope of the invention as defined in the following claims.

What is claimed is:

1. A semiconductor device, comprising:
   a hybrid pillar-type bottom electrode including a cylindrical first bottom electrode and a pillar-type second bottom electrode filling a cylindrical inside of the cylindrical first bottom electrode;
   a supporter suitable for supporting an outer wall of the hybrid pillar-type bottom electrode;
   a dielectric layer formed over the hybrid pillar-type bottom electrode and the supporter; and a top electrode disposed over the dielectric layer,
wherein the cylindrical inside of the cylindrical first bottom electrode includes:
a gap body; and
a gap head disposed on the gap body and having a sloped side wall,
wherein a width of the gap head is wider than the width of the gap body.

2. The semiconductor device of claim 1, wherein the gap body have a vertical side wall.

3. The semiconductor device of claim 1, wherein the width of the gap head gradually increases toward an upper surface of the cylindrical first bottom electrode.

4. The semiconductor device of claim 1, wherein the pillar-type second bottom electrode includes:
a pillar body filling the gap body; and
a pillar head filling the gap head and having a sloped side wall.

5. The semiconductor device of claim 1, wherein the pillar-type second bottom electrode is disposed at lower a level than an upper surface of the cylindrical first bottom electrode.

6. The semiconductor device of claim 1, wherein the cylindrical first bottom electrode includes a metal or a metal nitride, and the pillar-type second bottom electrode includes polysilicon.

7. The semiconductor device of claim 1, wherein the cylindrical first bottom electrode comprises a different material than the pillar-type second bottom electrode.

8. The semiconductor device of claim 1, wherein an upper surface of the cylindrical first bottom electrode and an upper surface of the supporter are at a same level.

9. The semiconductor device of claim 1, wherein an upper surface of the supporter is disposed at a lower level than an upper surface of the cylindrical first bottom electrode.

10. The semiconductor device of claim 1, wherein an upper surface of the supporter is disposed at a higher level than an upper surface of the cylindrical first bottom electrode.

11. The semiconductor device of claim 1, wherein an upper surface of the supporter is disposed at a higher level than an upper surface of the cylindrical first bottom electrode, and an upper surface of the pillar-type second bottom electrode is disposed at lower level than the upper surface of the cylindrical first bottom electrode.

12. The semiconductor device of claim 1, wherein an upper surface of the supporter is disposed at a lower level than an upper surface of the cylindrical first bottom electrode, and an upper surface of the pillar-type second bottom electrode is disposed at lower level than the upper surface of the supporter.

13. The semiconductor device of claim 1, wherein the supporter has a multi-level structure including a plurality of supporters supporting the outer wall of the hybrid pillar-type bottom electrode.

14. The semiconductor device of claim 13, wherein an upper surface of the cylindrical first bottom electrode is disposed substantially coplanar with an upper surface of the multi-level supporter.

15. The semiconductor device of claim 13, wherein an upper surface of the multi-level supporter is disposed at a lower level than an upper surface of the cylindrical first bottom electrode.

16. The semiconductor device of claim 13, wherein an upper surface of the multi-level supporter is disposed at a higher level than an upper surface of the cylindrical first bottom electrode.

17. The semiconductor device of claim 1, wherein an outer wall of an upper portion of the cylindrical first bottom electrode has a sloped side wall.

* * * * *